(12) United States Patent
Koyama

(10) Patent No.: US 10,638,079 B2
(45) Date of Patent: Apr. 28, 2020

(54) A/D CONVERTER, SOLID-STATE IMAGING DEVICE, METHOD FOR DRIVING SOLID-STATE IMAGING DEVICE, AND ELECTRONIC APPARATUS

(71) Applicant: OLYMPUS CORPORATION, Tokyo (JP)

(72) Inventor: Yusaku Koyama, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 39 days.

(21) Appl. No.: 16/165,150

(22) Filed: Oct. 19, 2018

(65) Prior Publication Data

US 2019/0052827 A1    Feb. 14, 2019

Related U.S. Application Data

(63) Continuation of application No. PCT/JP2016/062429, filed on Apr. 19, 2016.

(51) Int. Cl.
  *H04N 5/378* (2011.01)
  *H04N 5/376* (2011.01)
  (Continued)

(52) U.S. Cl.
  CPC .............. *H04N 5/378* (2013.01); *H03M 1/08* (2013.01); *H03M 1/34* (2013.01); *H04N 5/357* (2013.01);
  (Continued)

(58) Field of Classification Search
  None
  See application file for complete search history.

(56) References Cited

U.S. PATENT DOCUMENTS 4,644,322 A * 2/1987 Fujita .................. H03M 1/1071
                                                       341/159
2014/0014817 A1   1/2014 Motonaga et al.
(Continued)

FOREIGN PATENT DOCUMENTS

| JP | H06-215064 A | 8/1994 |
| JP | 4423111 B2 | 3/2010 |
| JP | 2014-033433 A | 2/2014 |

OTHER PUBLICATIONS

International Search Report dated Jul. 19, 2016 issued in PCT/JP2016/062429.
English Abstract of JP 2005-347931 A, dated Dec. 12, 2005.

*Primary Examiner* — Cynthia Segura
(74) *Attorney, Agent, or Firm* — Scully, Scott, Murphy & Presser, P.C.

(57) ABSTRACT

An A/D converter includes a reference voltage generating circuit that generates a reference voltage of a ramp waveform in which a voltage value changes with time, a gray code generating circuit that outputs a gray code based on a same reference clock as the reference voltage generating circuit, a comparison circuit that compares the reference voltage with an input voltage, a latch circuit that holds a count value of the gray code based on an output signal of the comparison circuit, a code conversion circuit that serially converts the count value of the gray code held in the latch circuit into a binary code, and a calculation processing circuit that stores a count value of the binary code output from the code conversion circuit, and performs calculation processing based on the stored count value of the binary code and a next input count value of the binary code.

13 Claims, 45 Drawing Sheets

(51) Int. Cl.
*H03M 1/34* (2006.01)
*H04N 5/357* (2011.01)
*H03M 1/08* (2006.01)
H03M 1/56 (2006.01)
H03M 1/12 (2006.01)

(52) U.S. Cl.
CPC .......... *H04N 5/3765* (2013.01); *H03M 1/123* (2013.01); *H03M 1/56* (2013.01)

(56) References Cited

U.S. PATENT DOCUMENTS

| 2015/0138408 | A1* | 5/2015 | Lee | H04N 5/378 |
| | | | | 348/294 |
| 2017/0237917 | A1* | 8/2017 | Sato | H04N 5/3745 |
| | | | | 348/308 |

* cited by examiner

[Fig. 1]
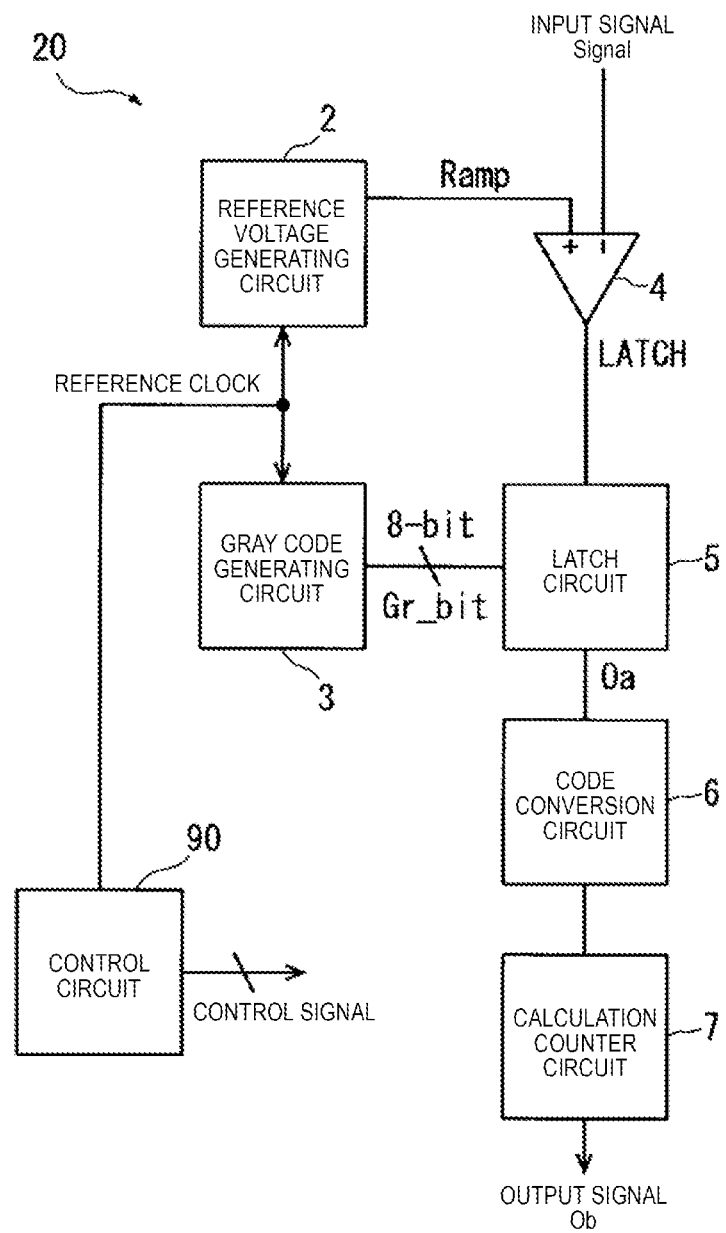

[Fig. 2]
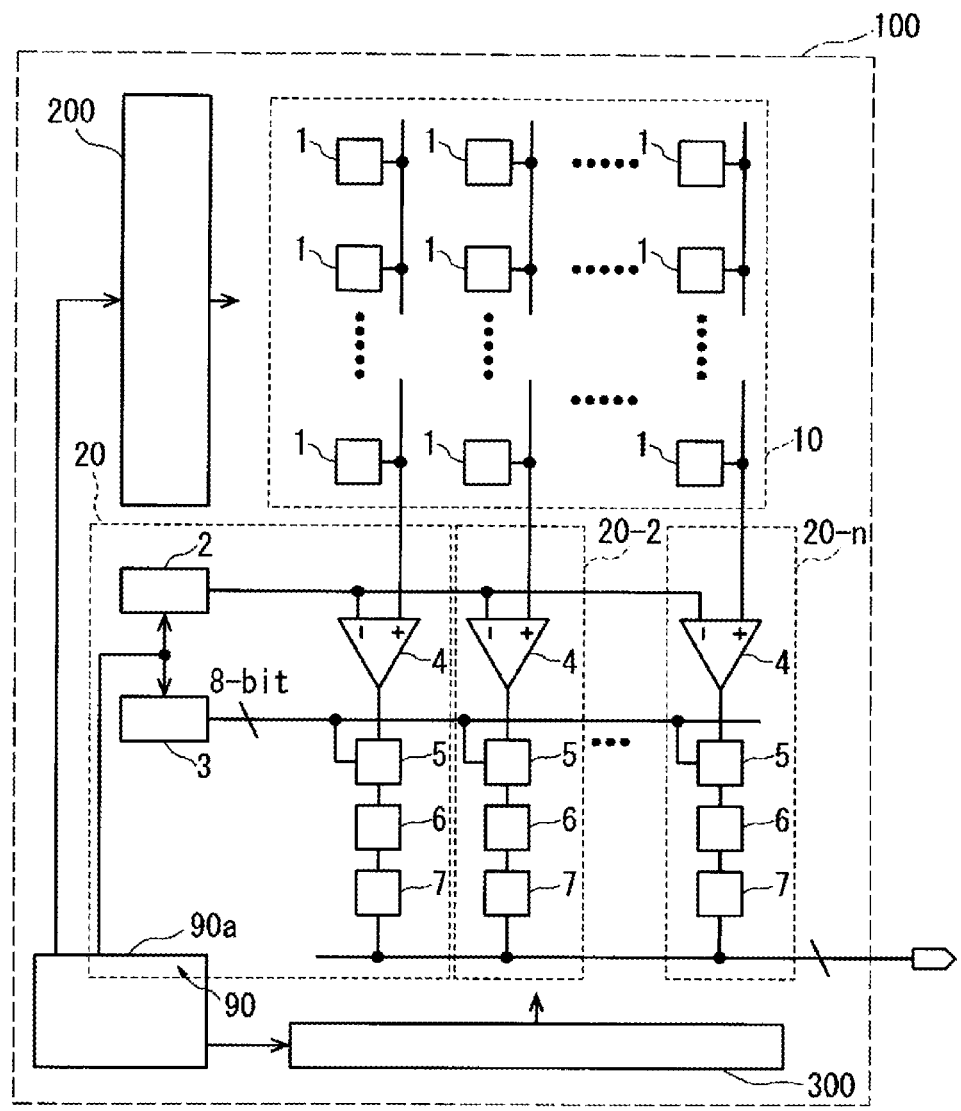

[Fig. 3]
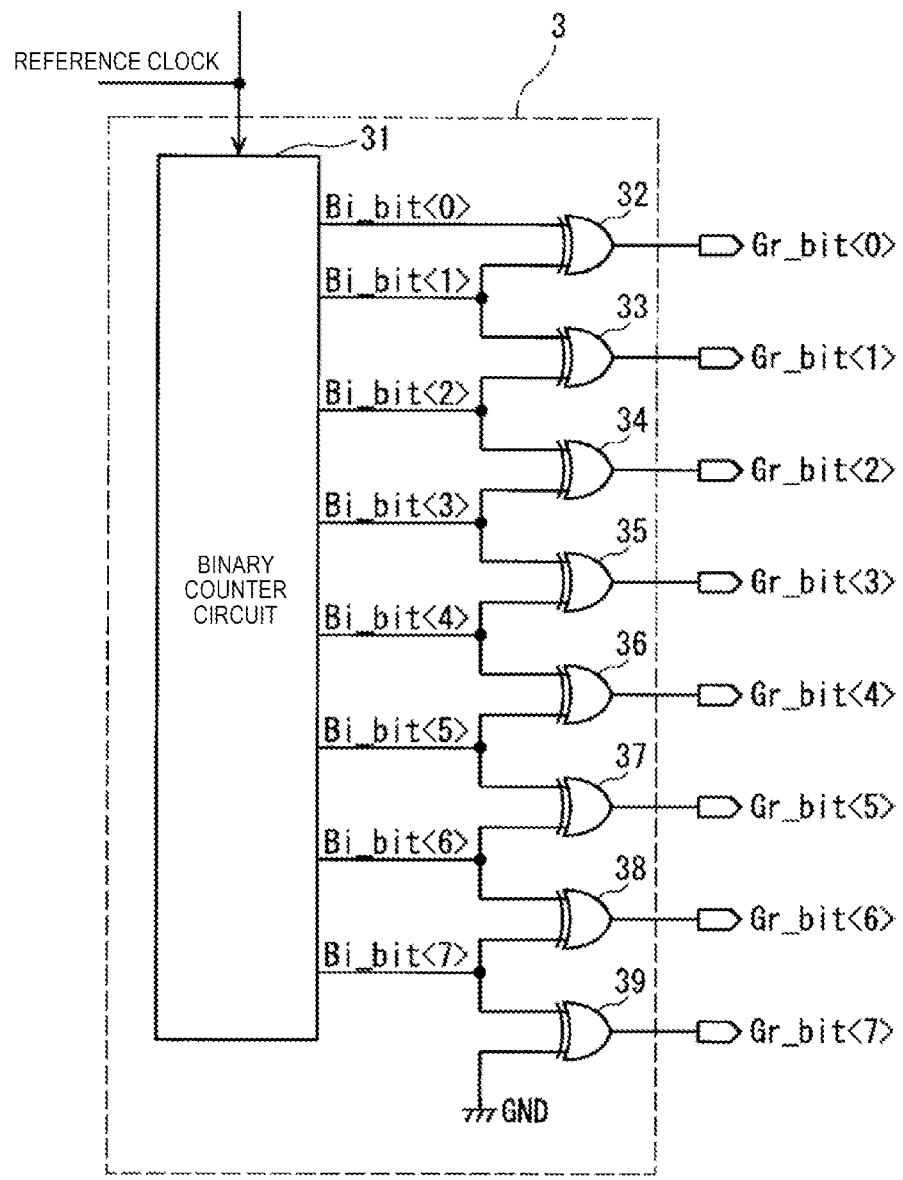

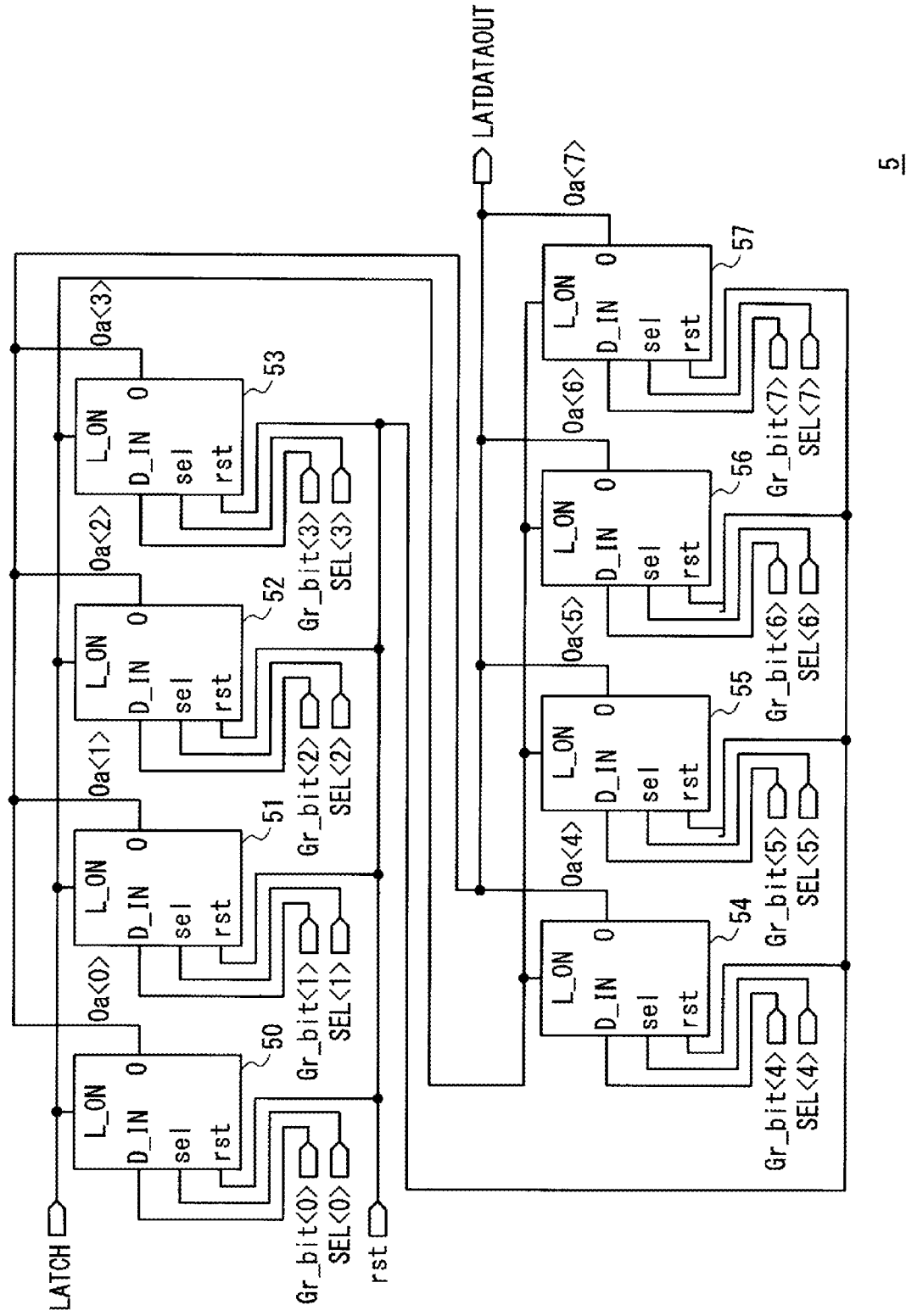
[Fig. 4]

[Fig. 5]
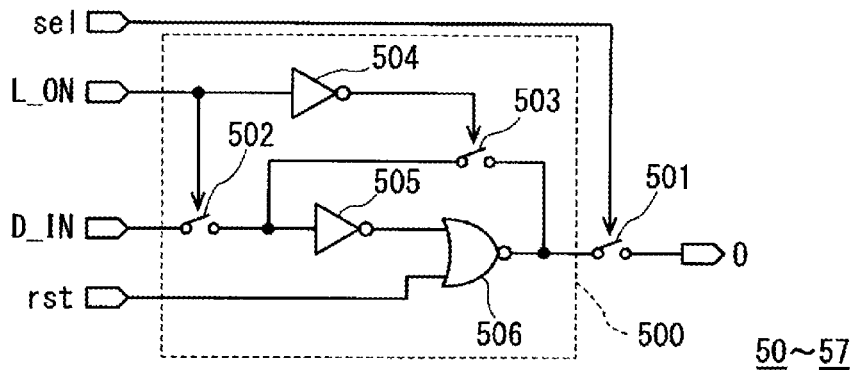
[Fig. 6]
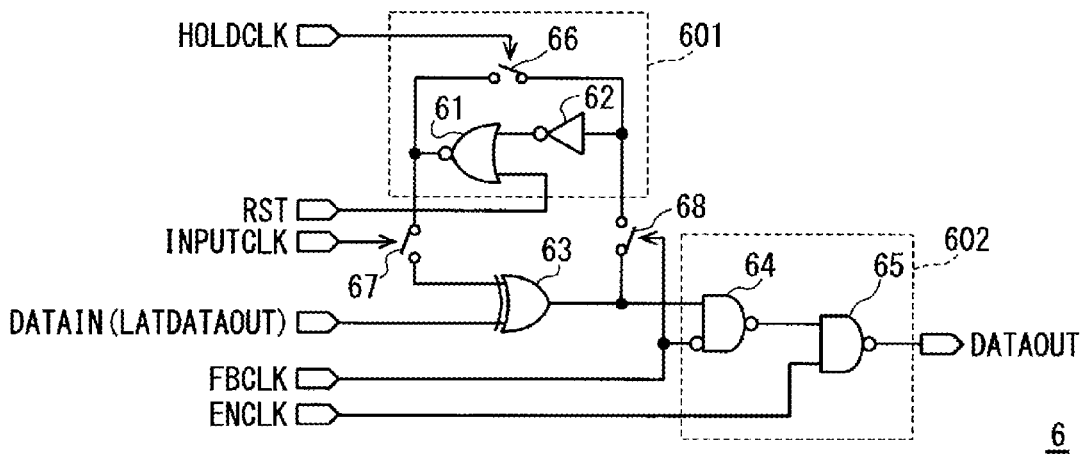
[Fig. 7]
| | RST | INPUTCLK | HOLDCLK | FBCLK | ENCLK |
|---|---|---|---|---|---|
| \<reset\> | 1 ※1 | 0 | 0 | 0 | 1 |
| \<latch\> | 0 ※2 | 0 | 0 | 1 | 1 |
| \<hold\>※3 | 0 | 0 | 1 | 0 | 1 |
| \<input\> | 0 | 1 | 1 | 0 | 1 |
| \<clkin\>※4 | ARBITRARY | ARBITRARY | ARBITRARY | 1 | 1→0→1 |

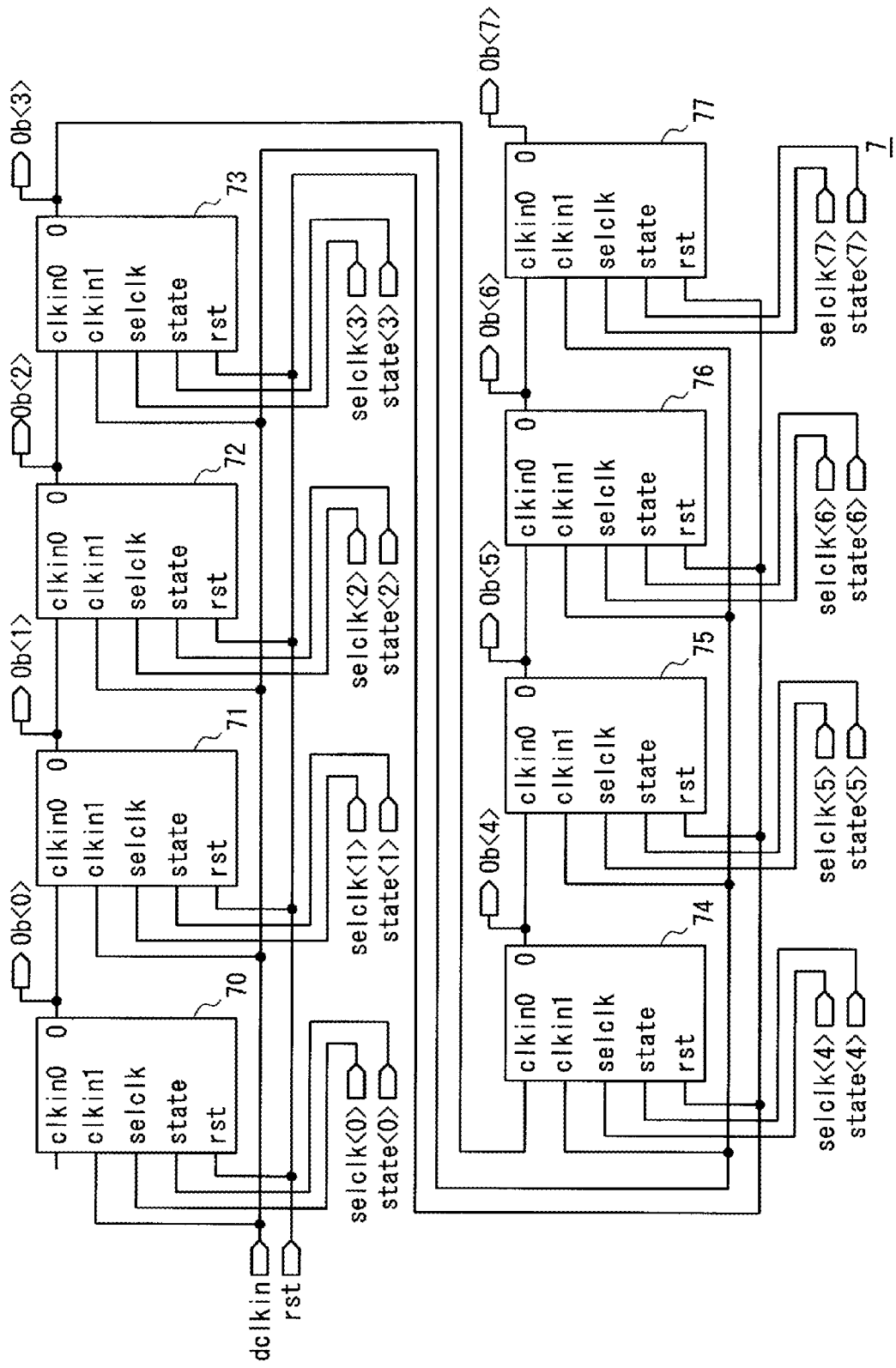
[Fig. 8]

[Fig. 9]
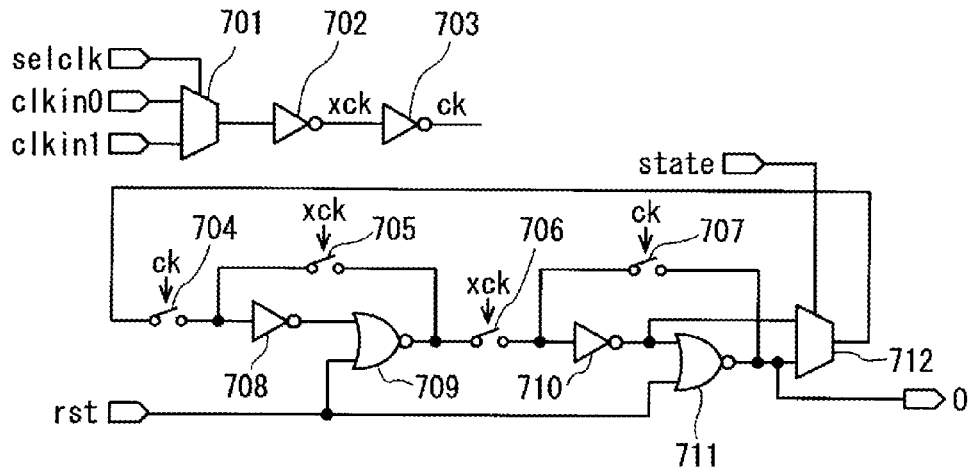
[Fig. 10]
| INPUT CONDITION | | | RESULT | | REMARKS | |
|---|---|---|---|---|---|---|
| INPUT clk | selclk | state | 0 (BEFORE INPUT) | 0 (AFTER INPUT) | bit CHANGE | CARRY-UP |
| clkin0 | 0 (=clkin0) | 0 (=count) | 0 | 1 | YES | NO |
| | | | 1 | 0 | YES | YES |
| | | 1 (=state) | 0 | 0 | NO | NO |
| | | | 1 | 1 | NO | NO |
| | 1 (=clkin1) | 0 (=count) | 0 | 0 | NO | NO |
| | | | 1 | 1 | NO | NO |
| | | 1 (=state) | 0 | 0 | NO | NO |
| | | | 1 | 1 | NO | NO |
| clkin1 | 0 | 0 | 0 | 0 | NO | NO |
| | | | 1 | 1 | NO | NO |
| | | 1 | 0 | 0 | NO | NO |
| | | | 1 | 1 | NO | NO |
| | 1 | 0 | 0 | 1 | YES | NO |
| | | | 1 | 0 | YES | YES |
| | | 1 | 0 | 0 | NO | NO |
| | | | 1 | 1 | NO | NO |

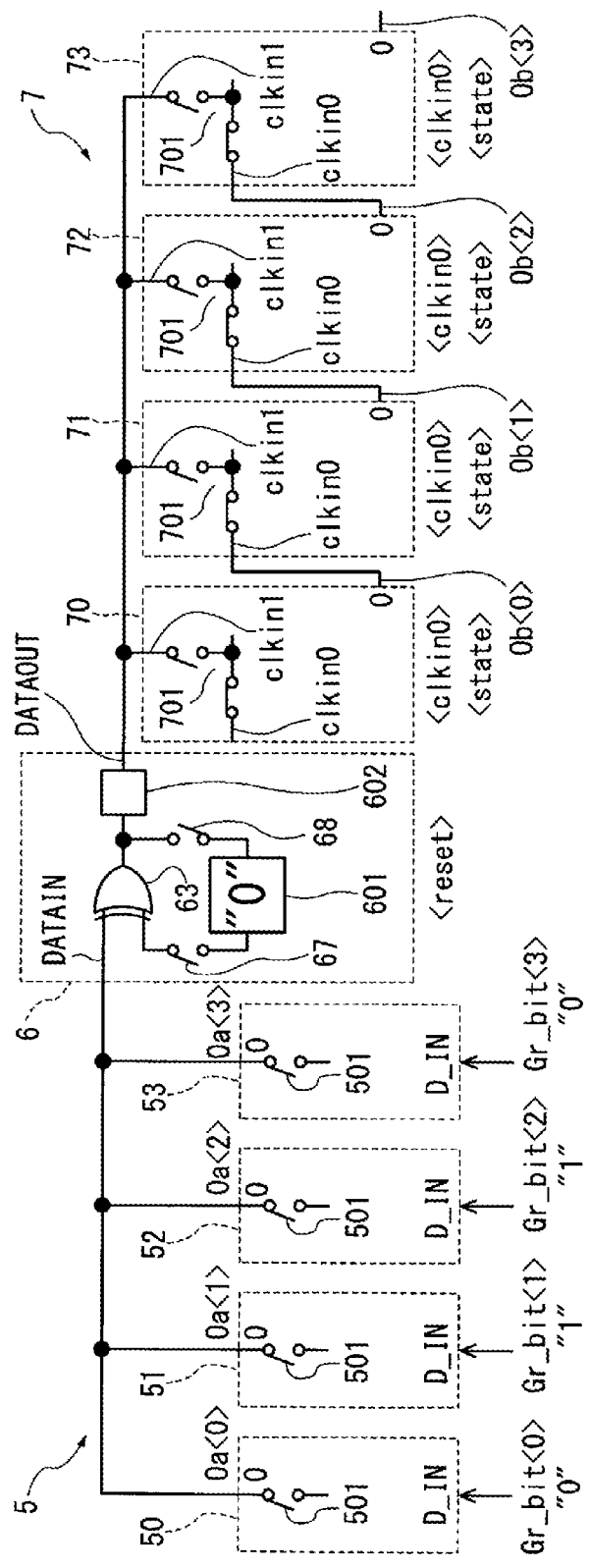
[Fig. 11A]

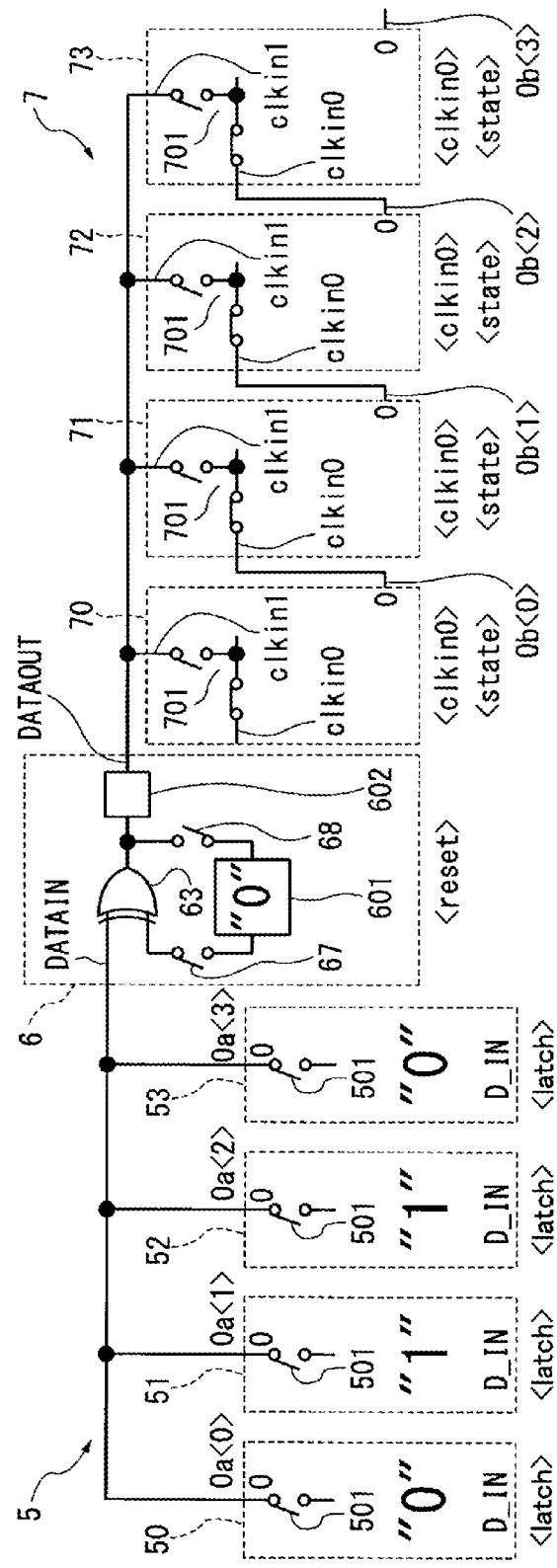

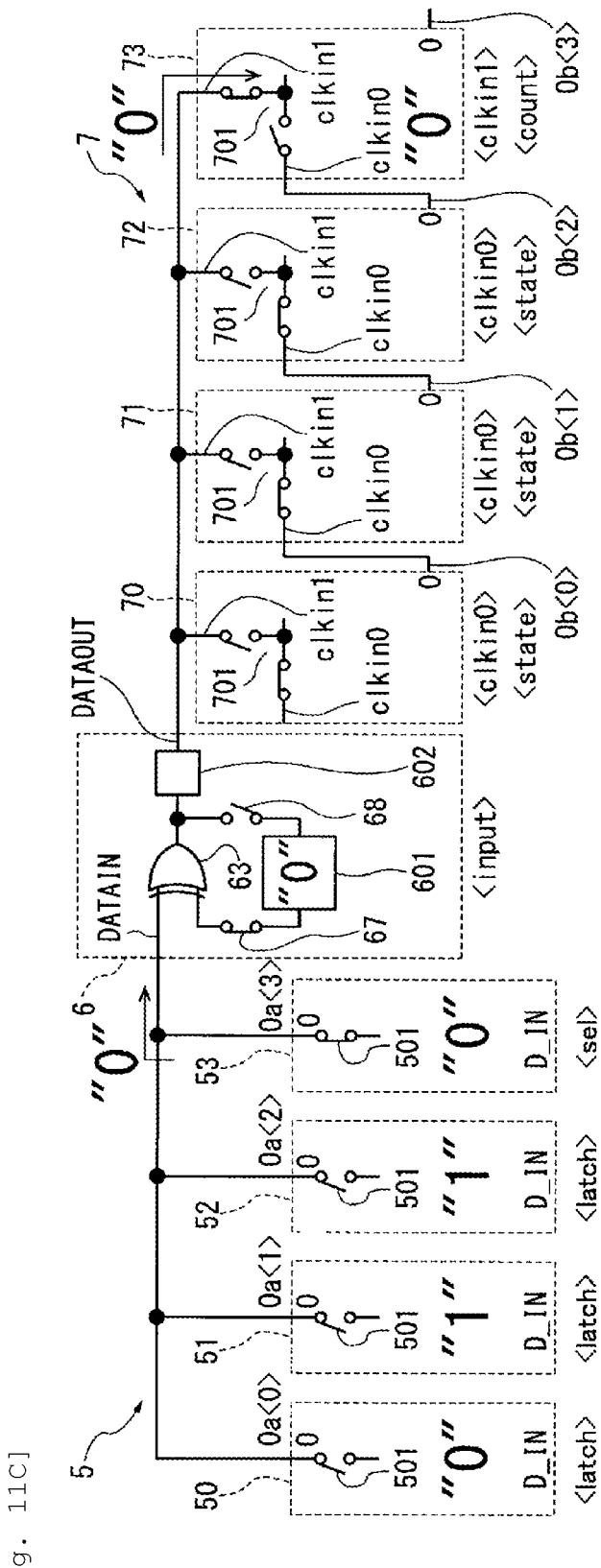
[Fig. 11C]

[Fig. 11D]
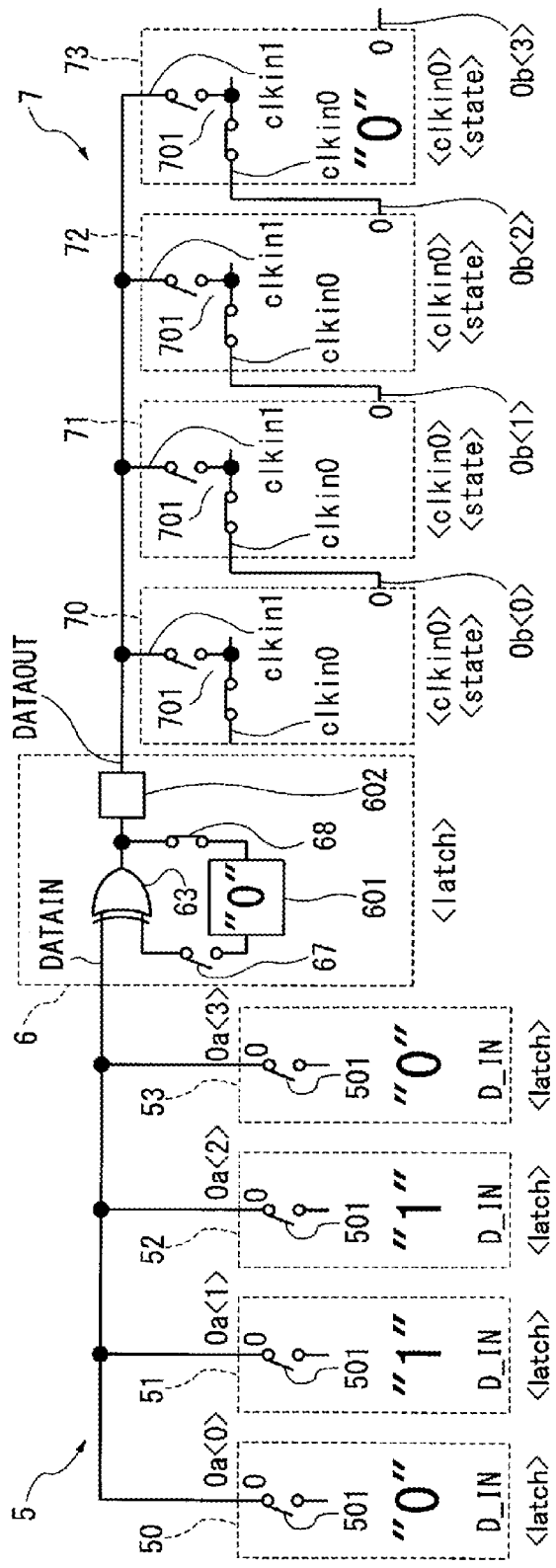

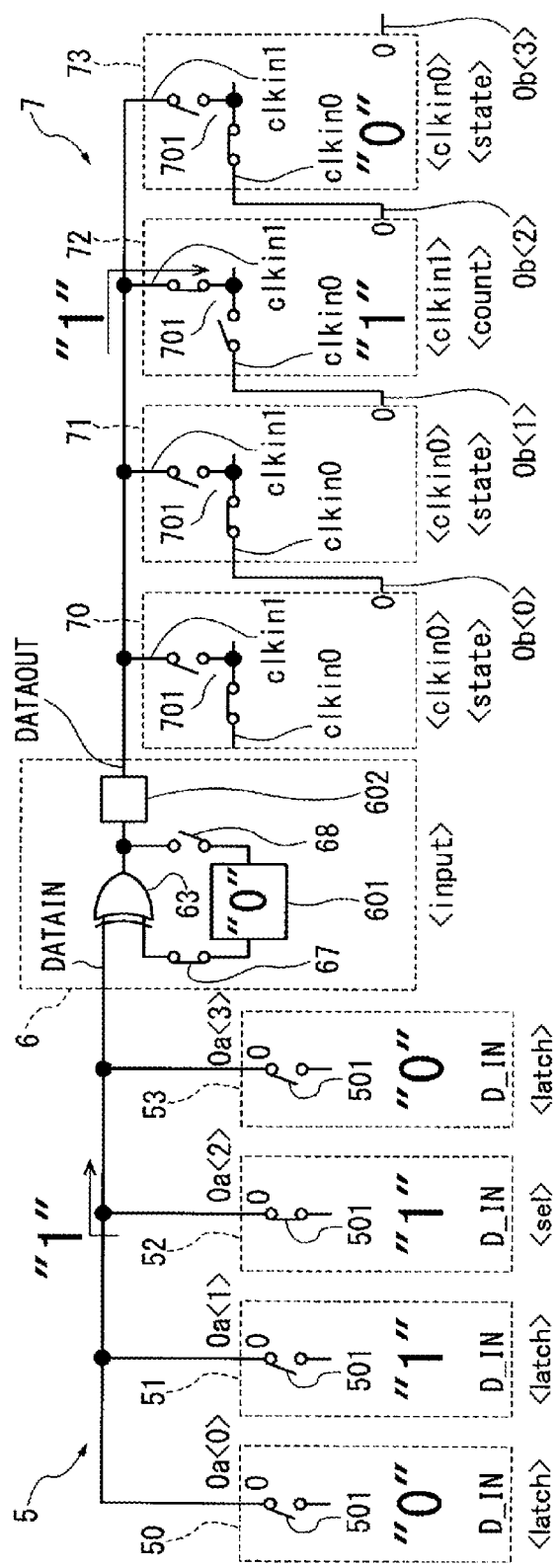
[Fig. 11E]

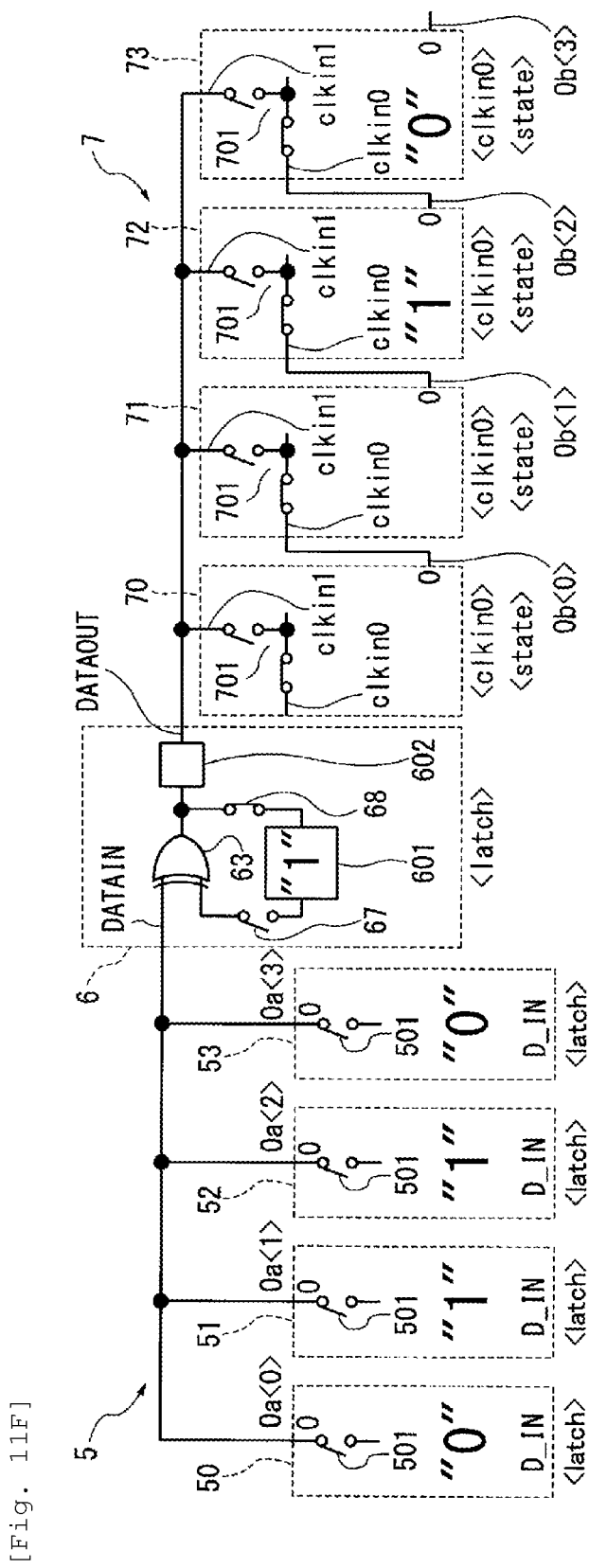
[Fig. 11F]

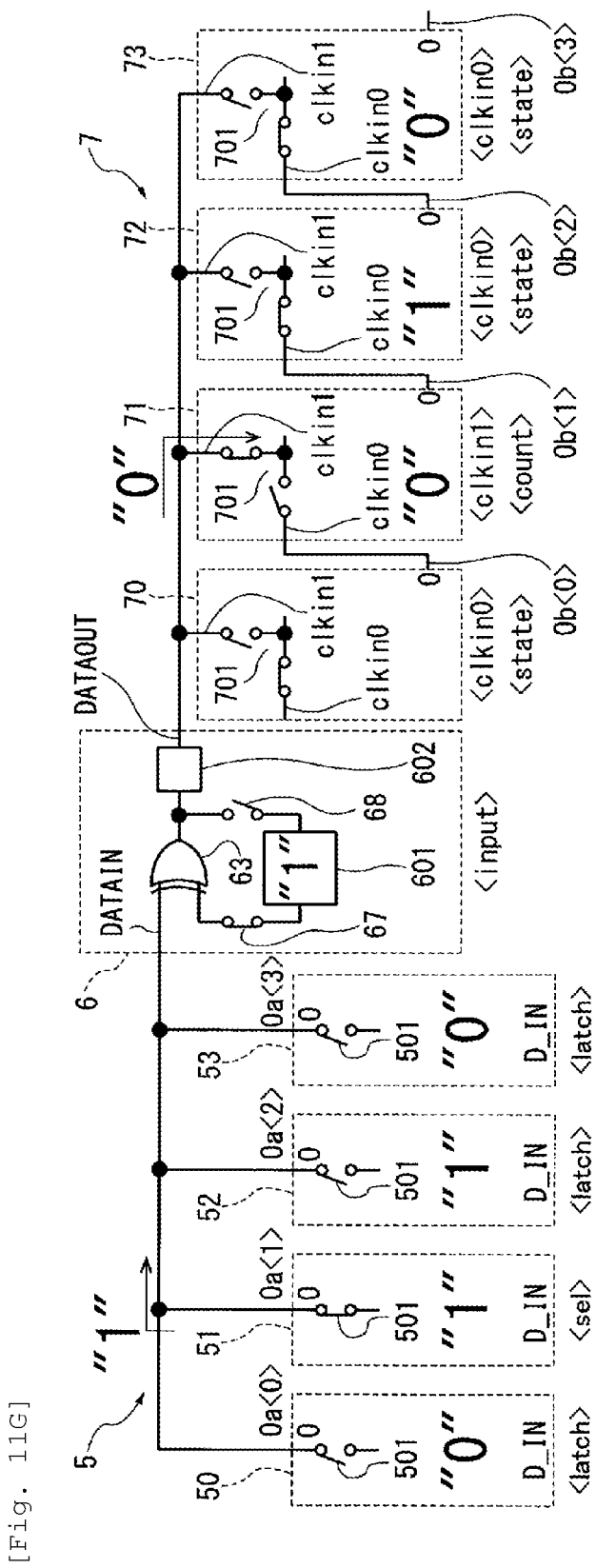
[Fig. 11G]

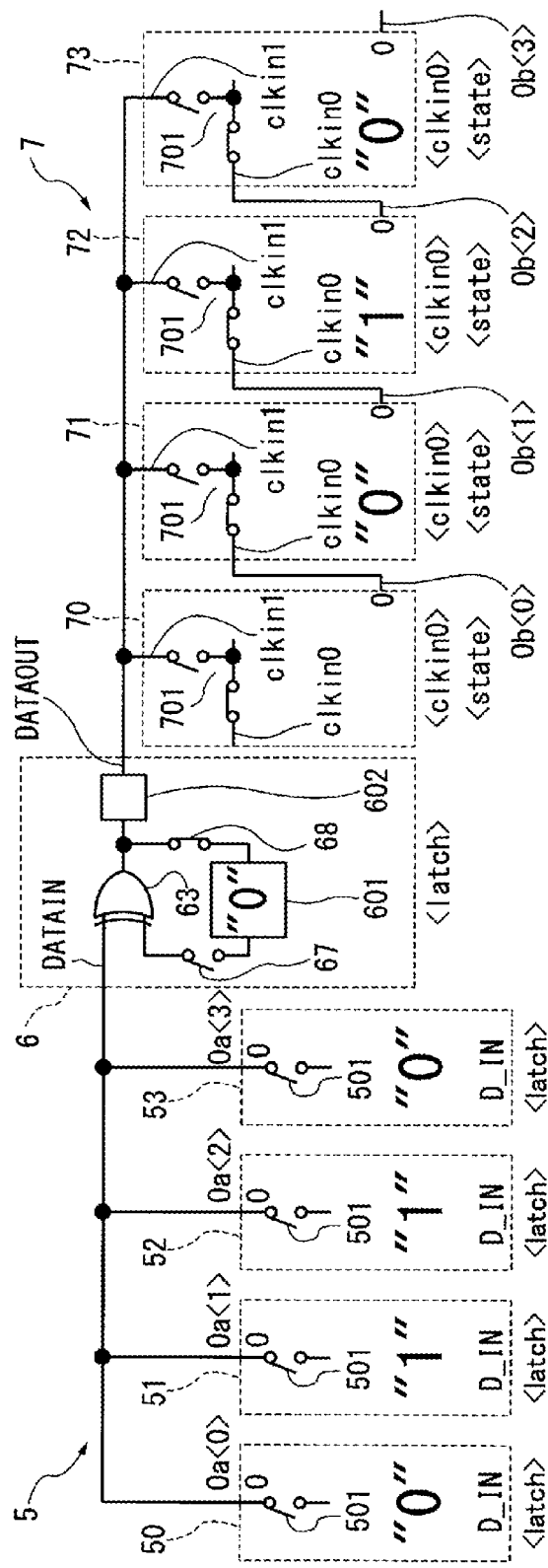
[Fig. 11H]

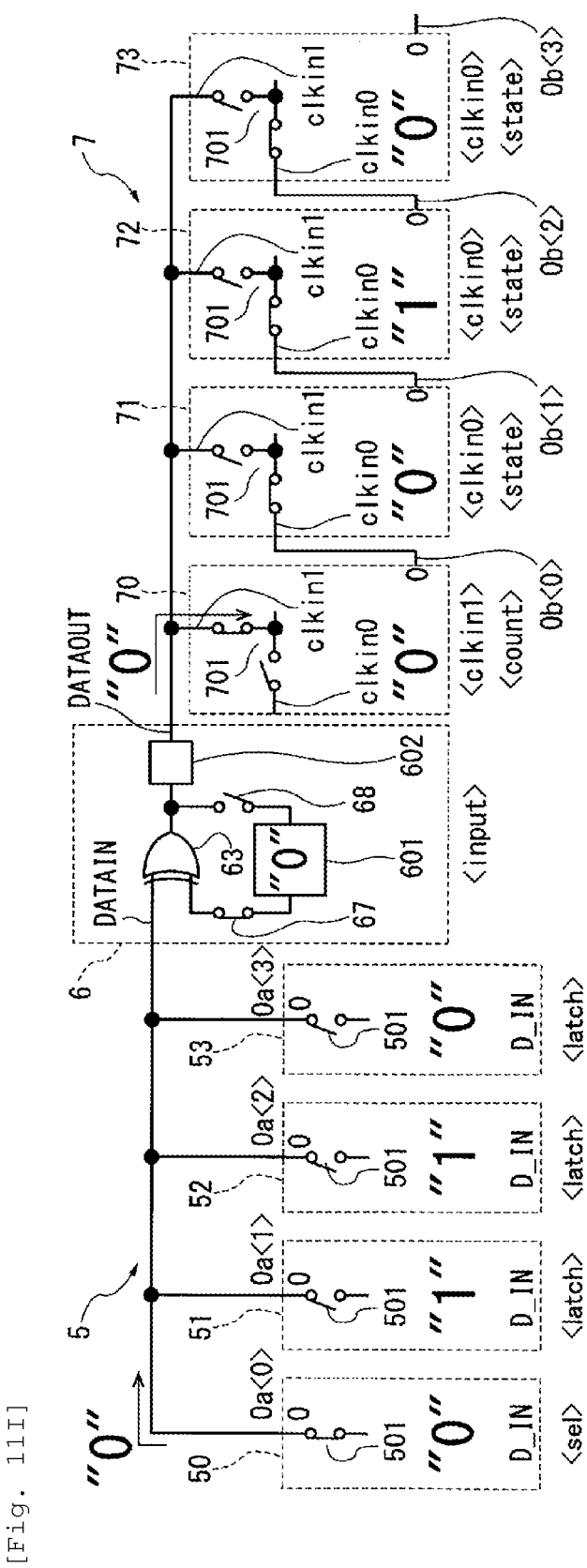
[Fig. 11I]

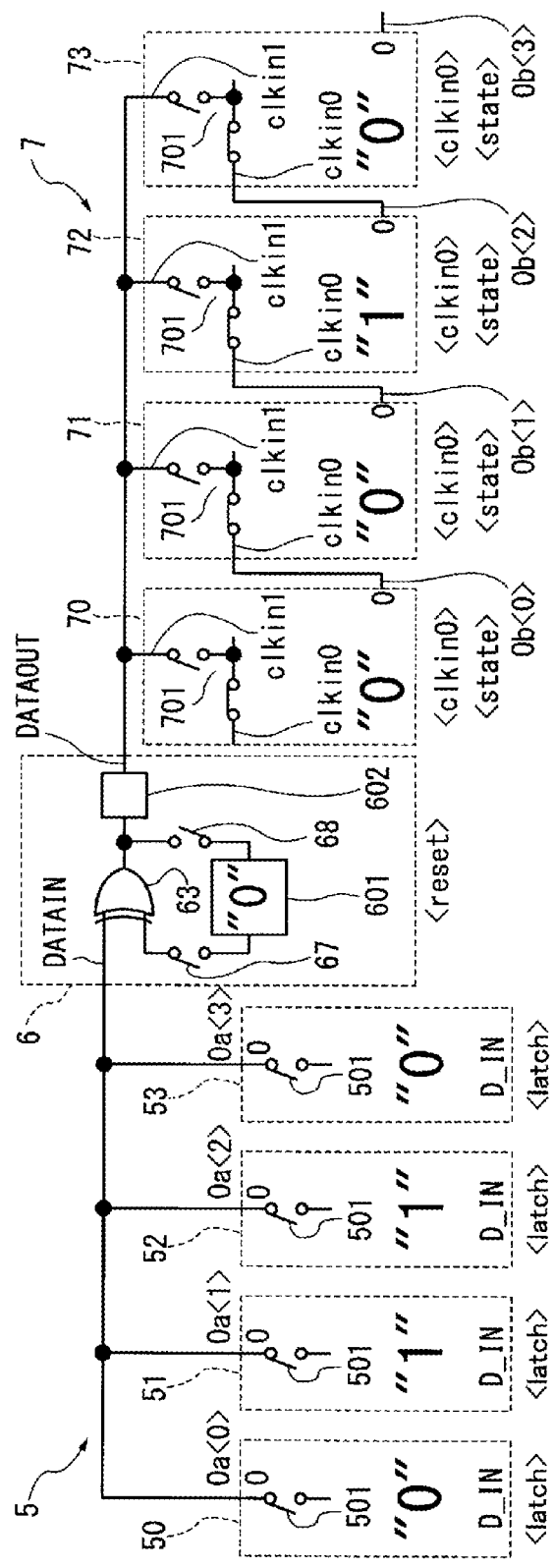
[Fig. 11J]

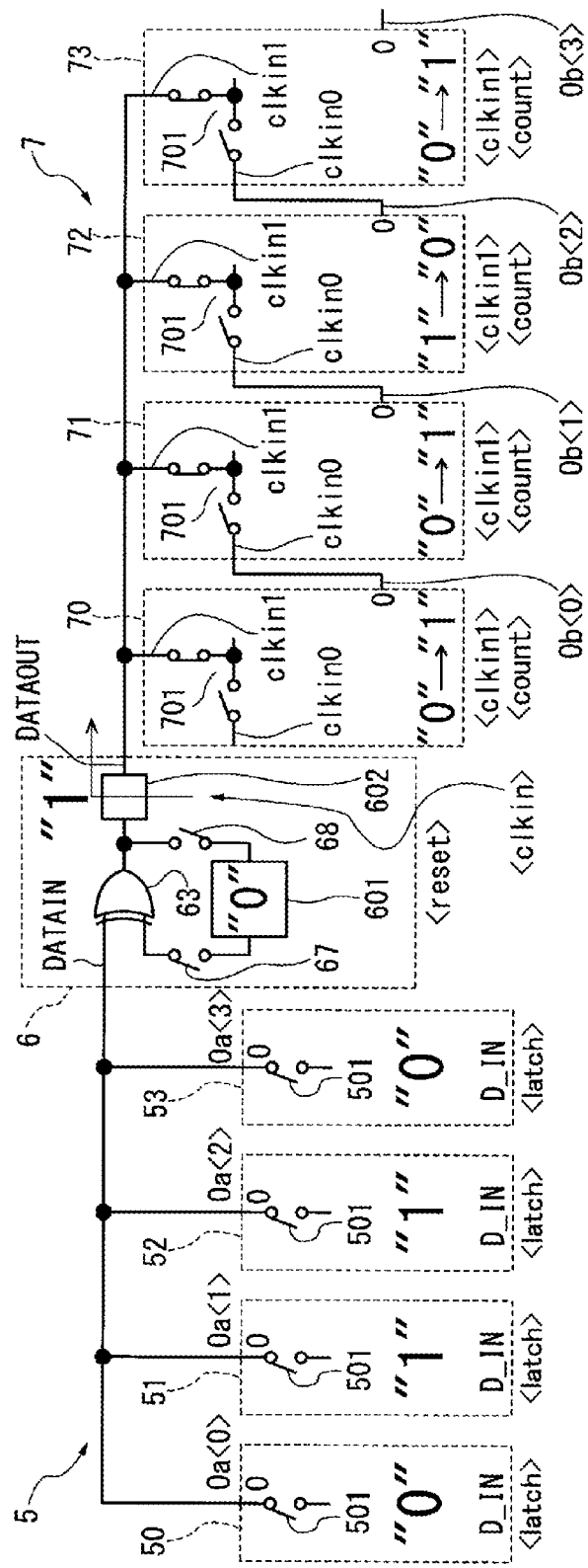
[Fig. 11K]

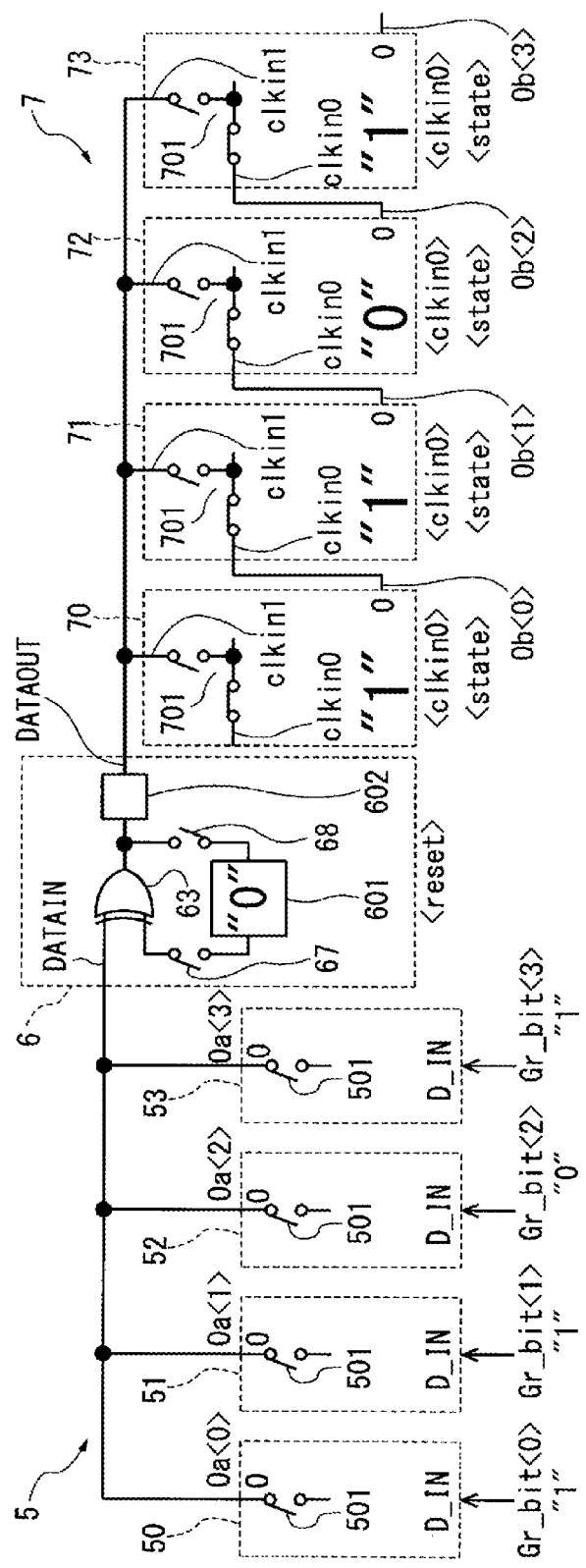
[Fig. 11L]

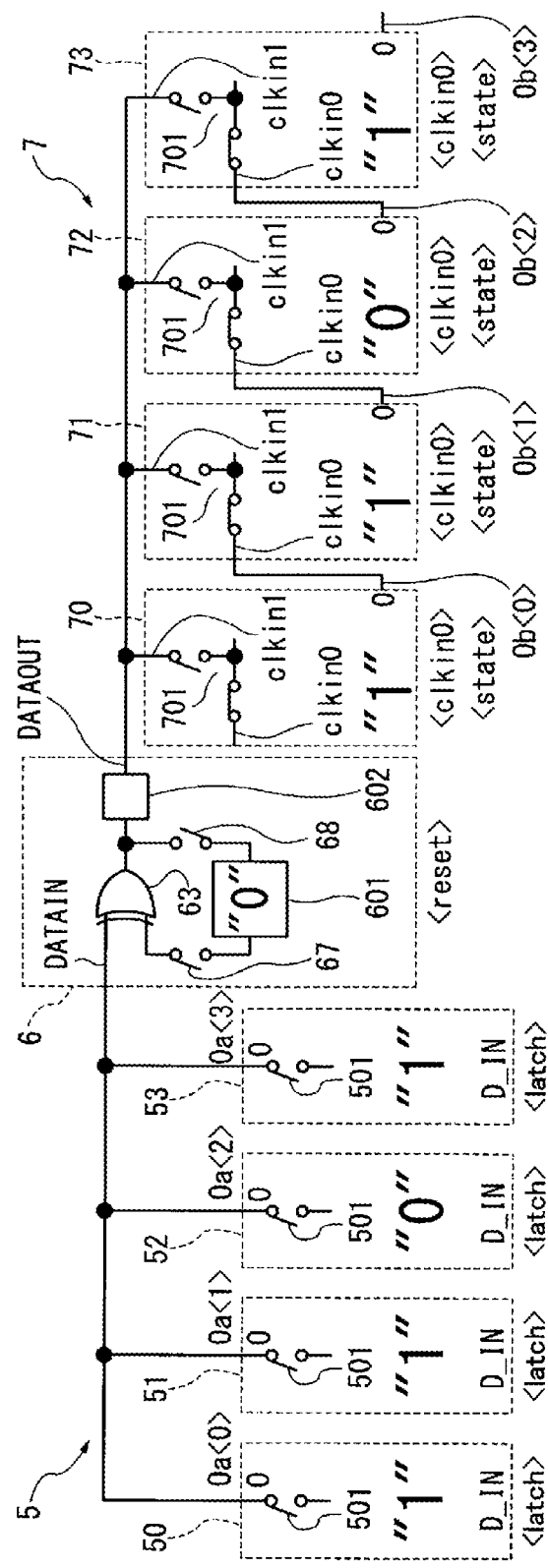
[Fig. 11M]

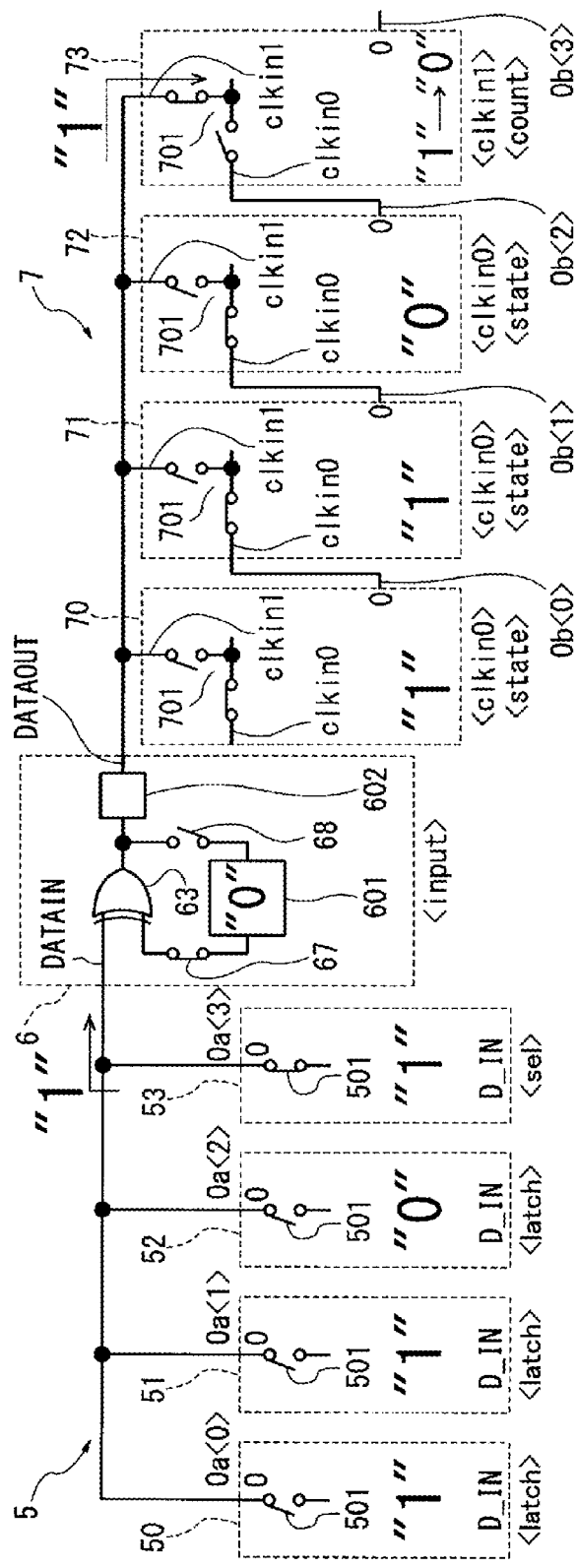
[Fig. 11N]

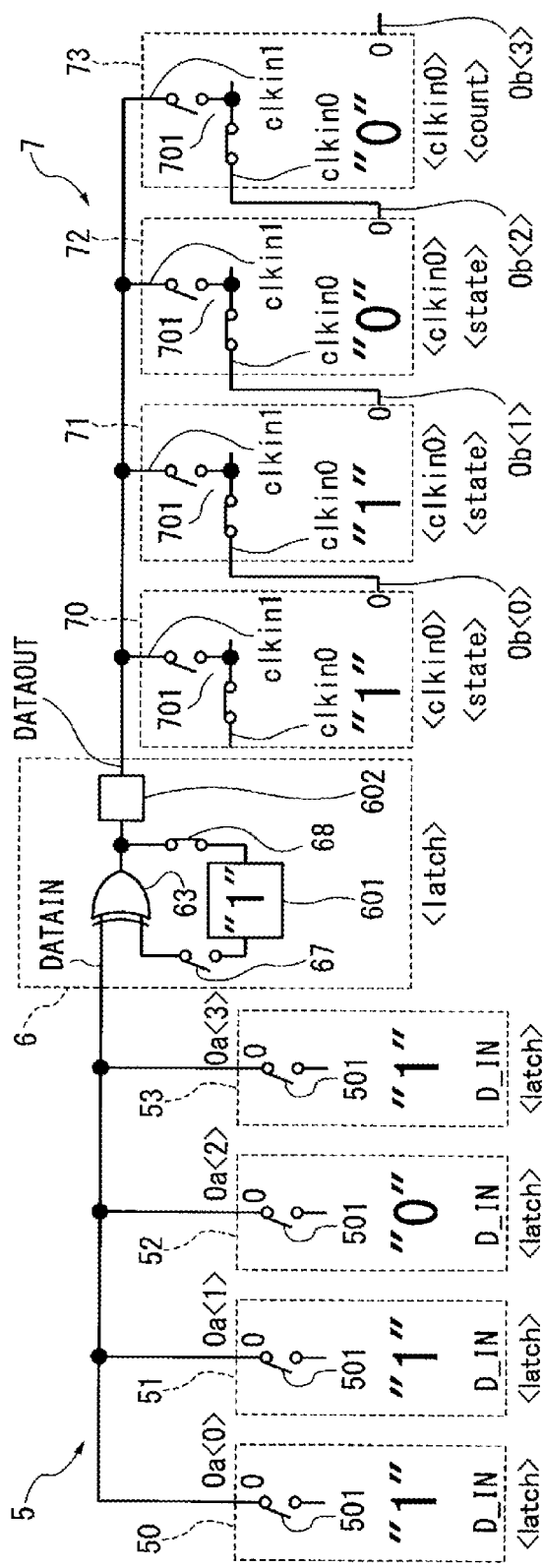

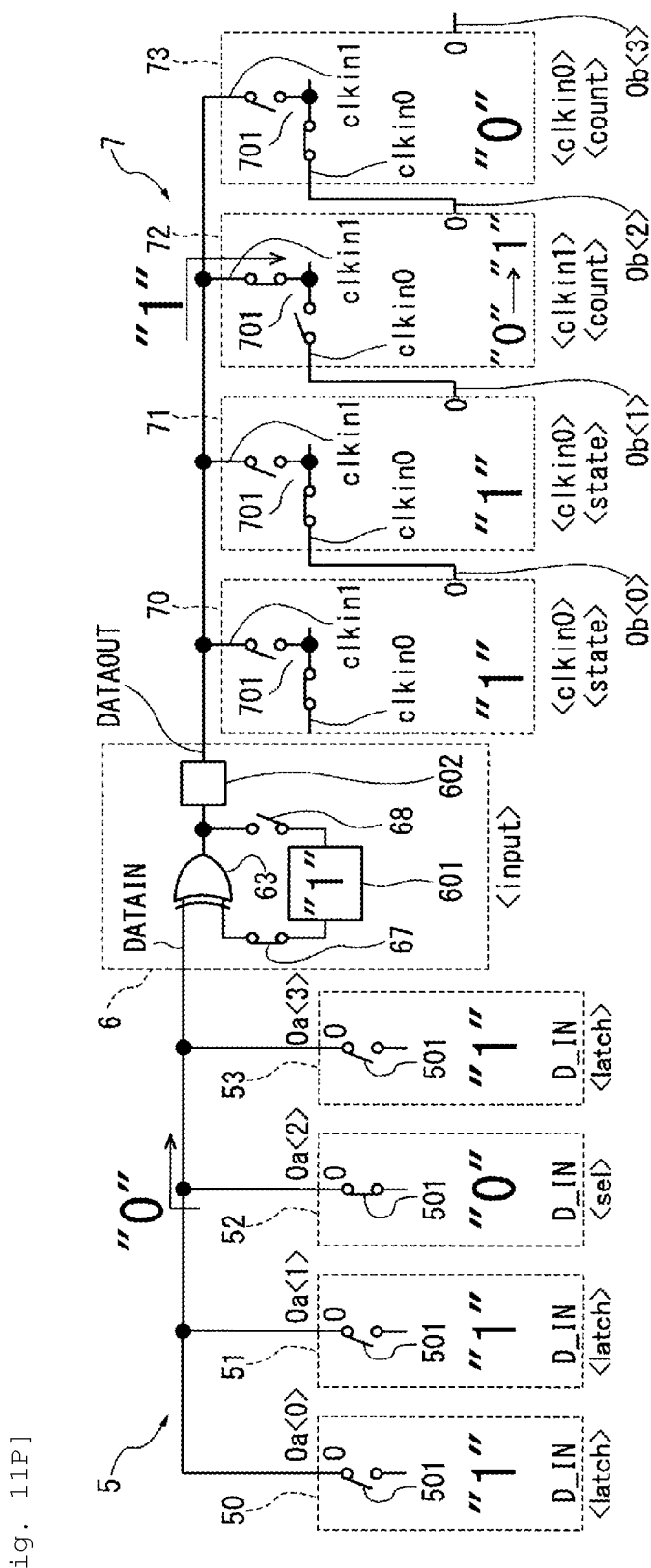
[Fig. 11P]

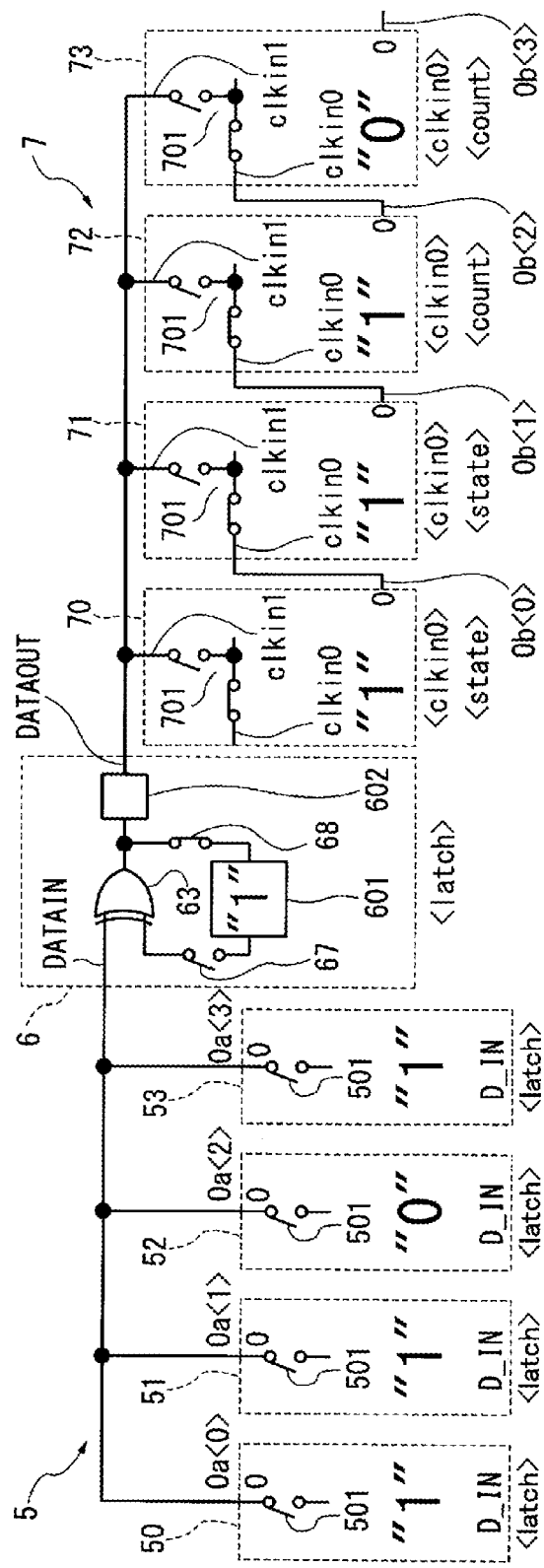
[Fig. 11Q]

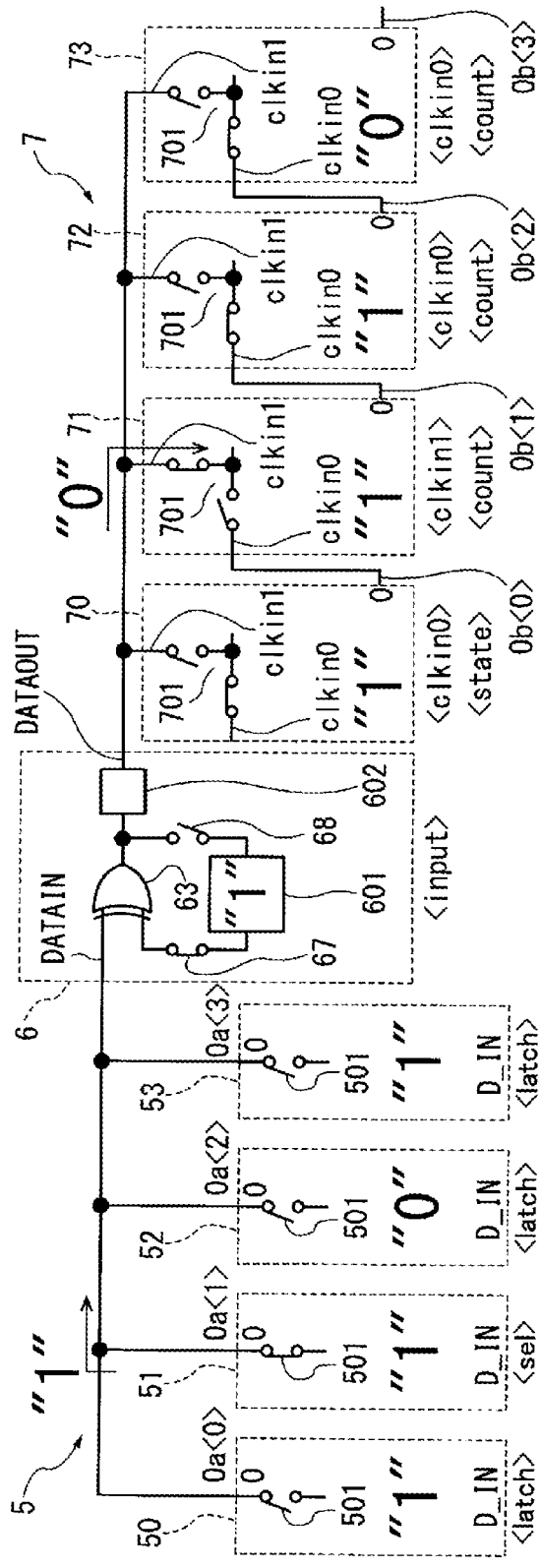
[Fig. 11R]

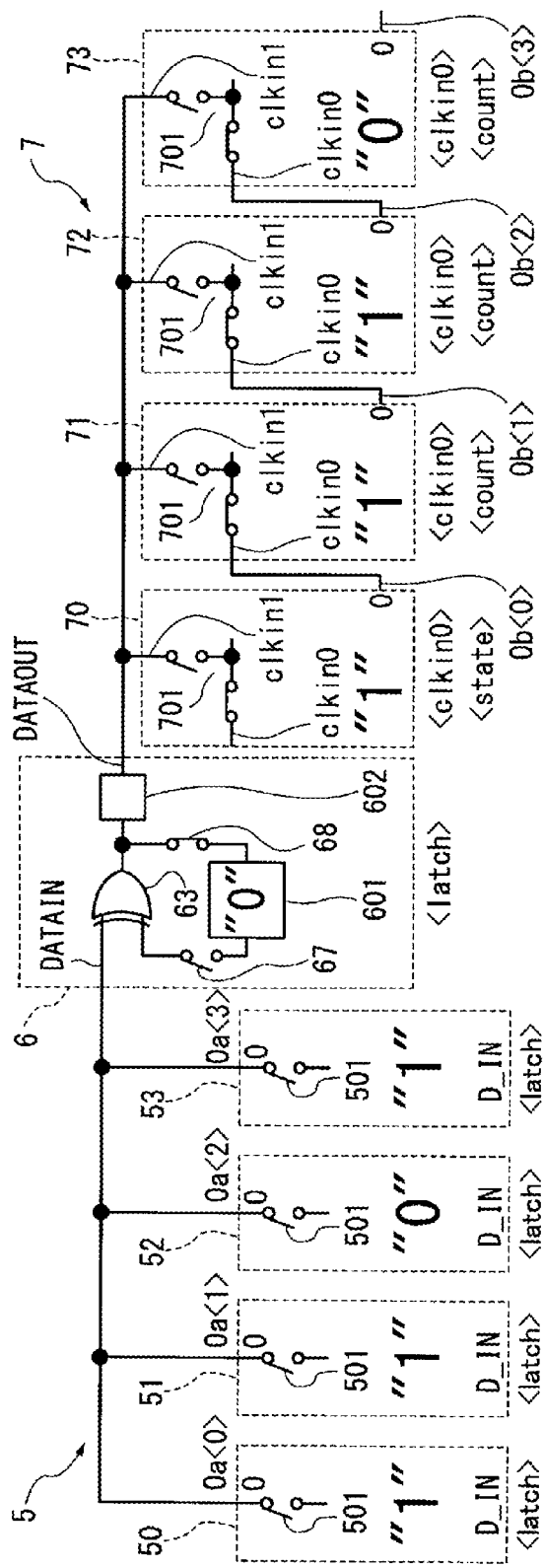
[Fig. 11S]

[Fig. 11T]
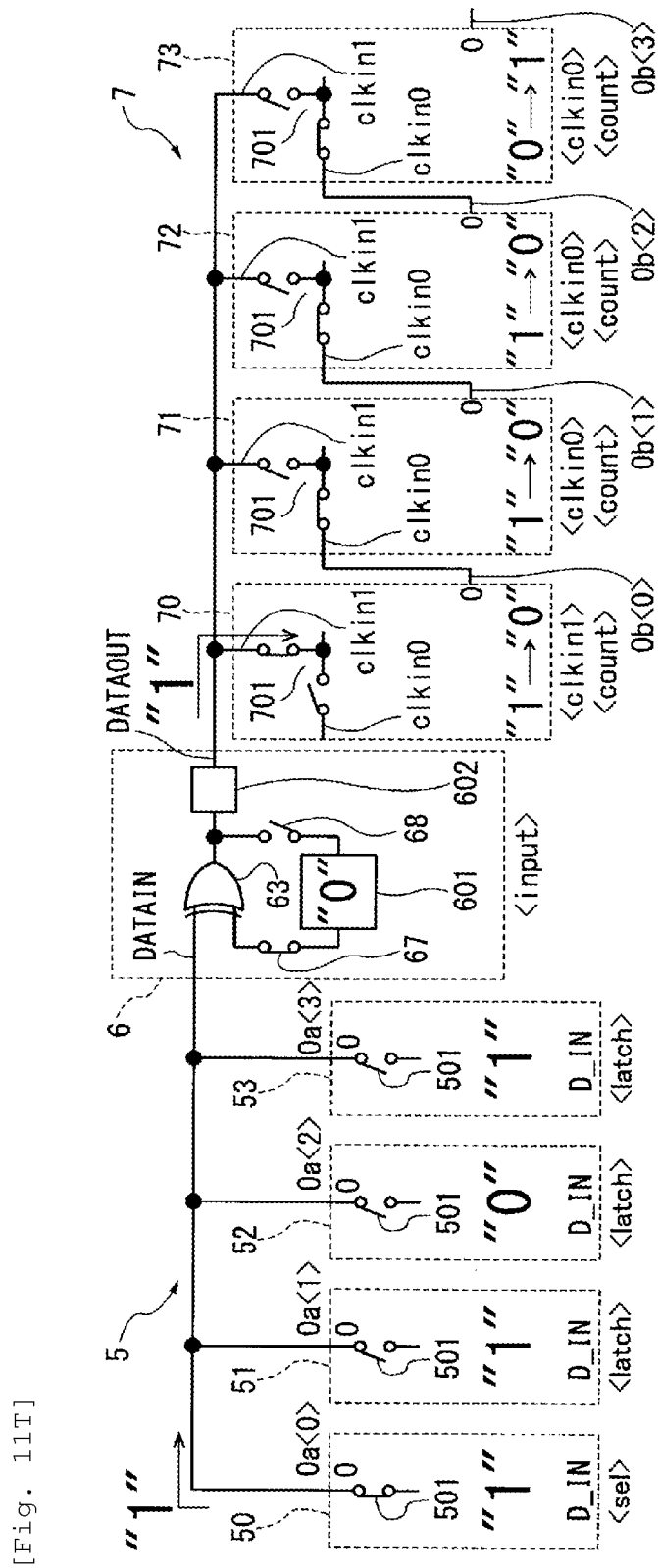

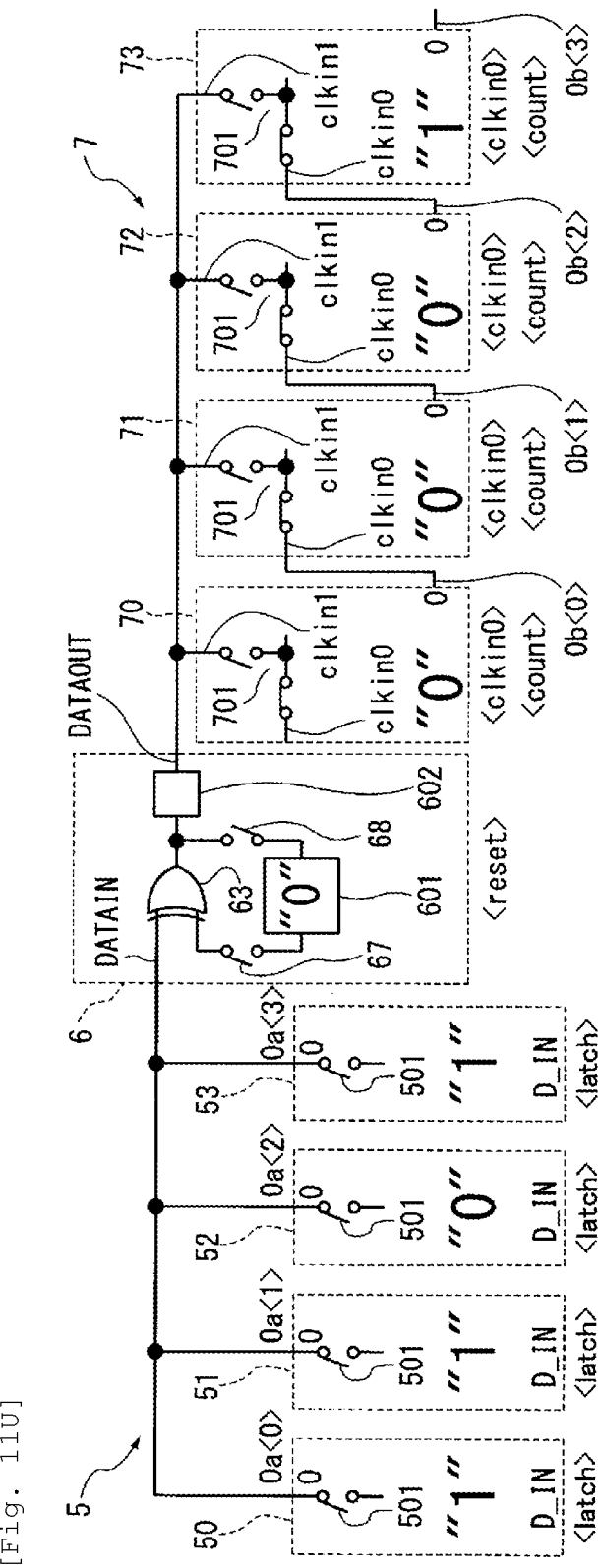
[Fig. 11U]

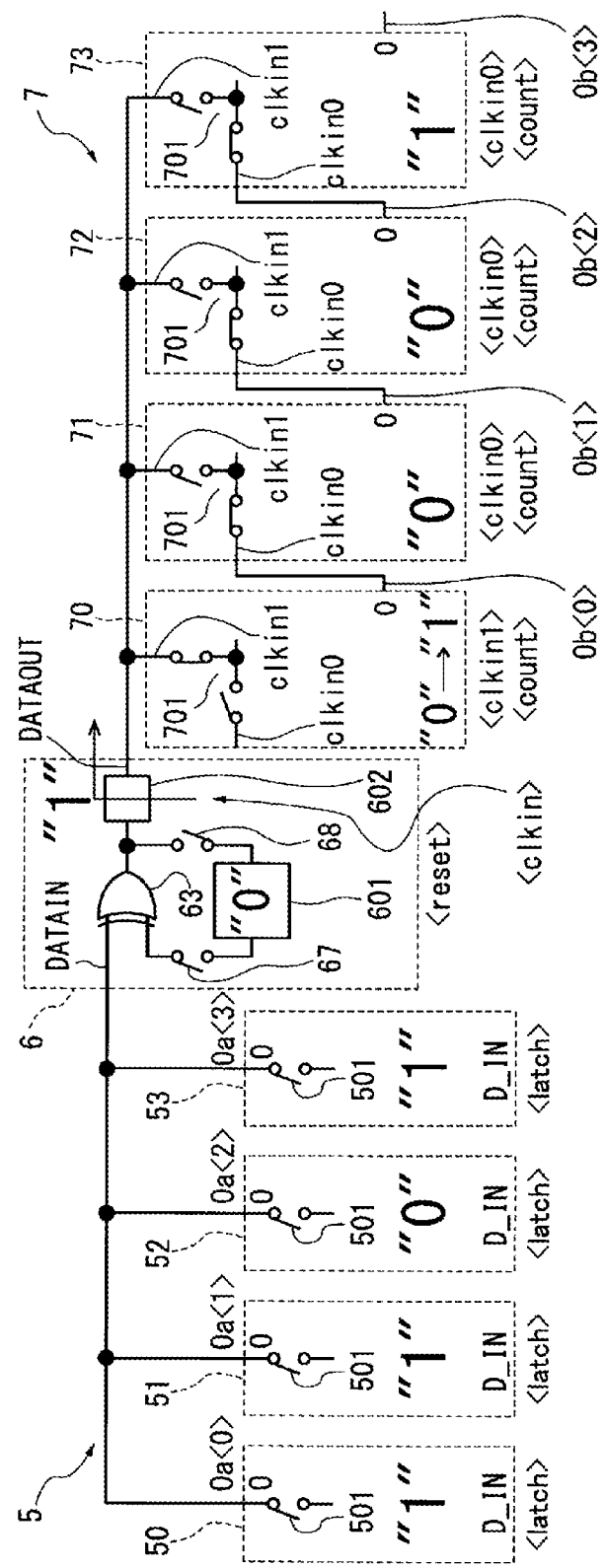
[Fig. 11V]

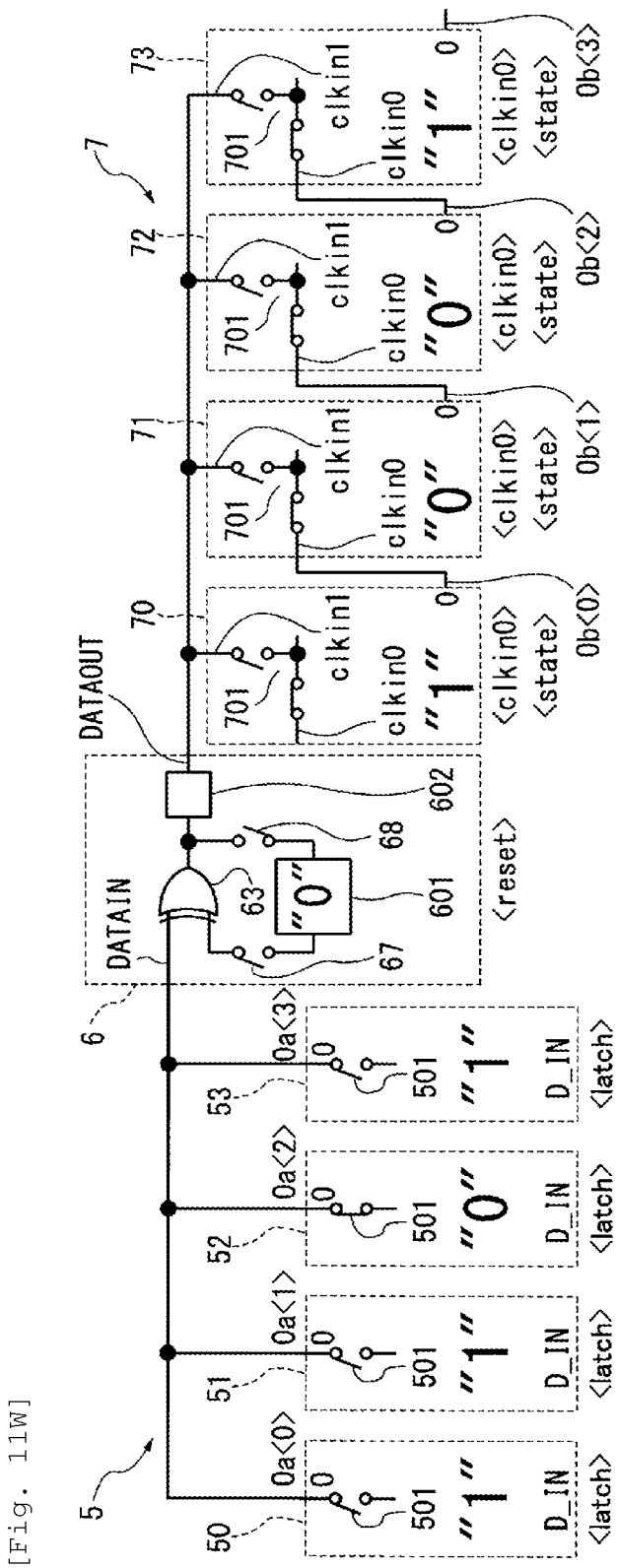
[Fig. 11W]

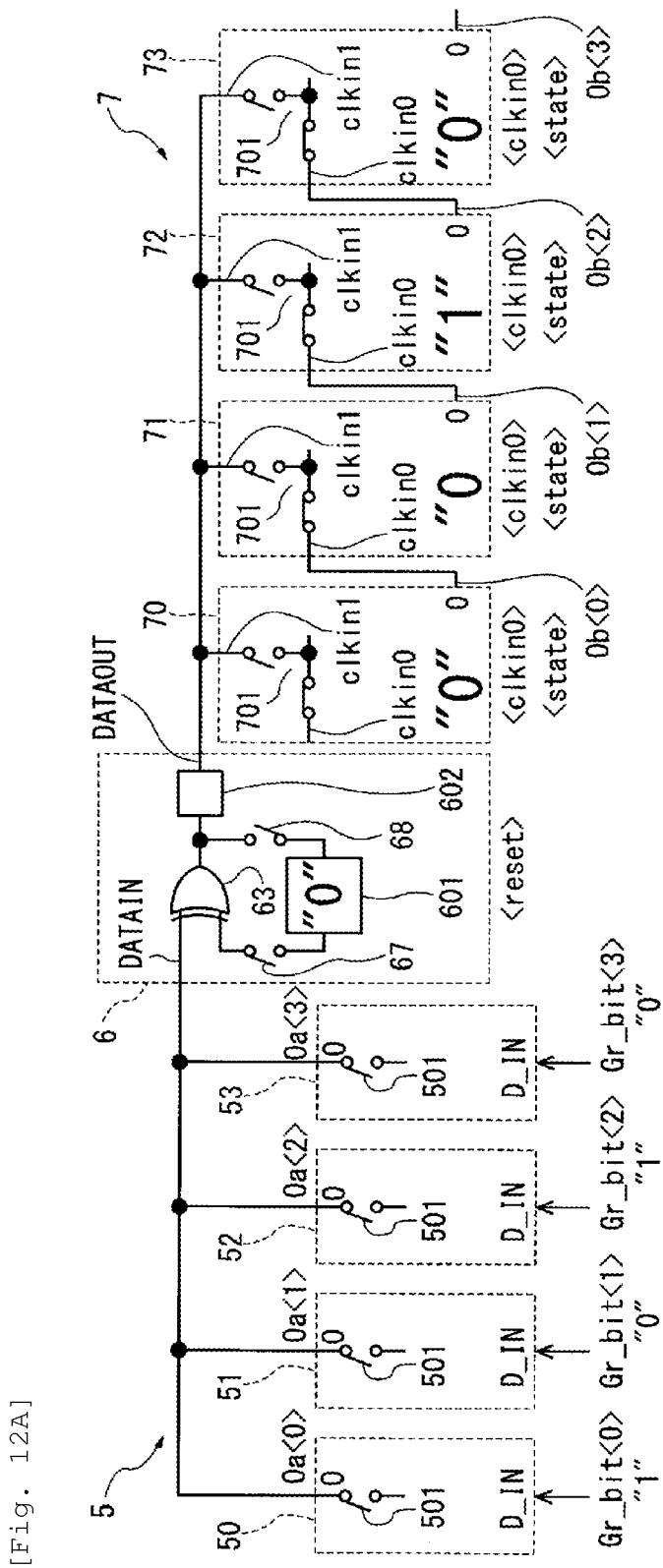
[Fig. 12A]

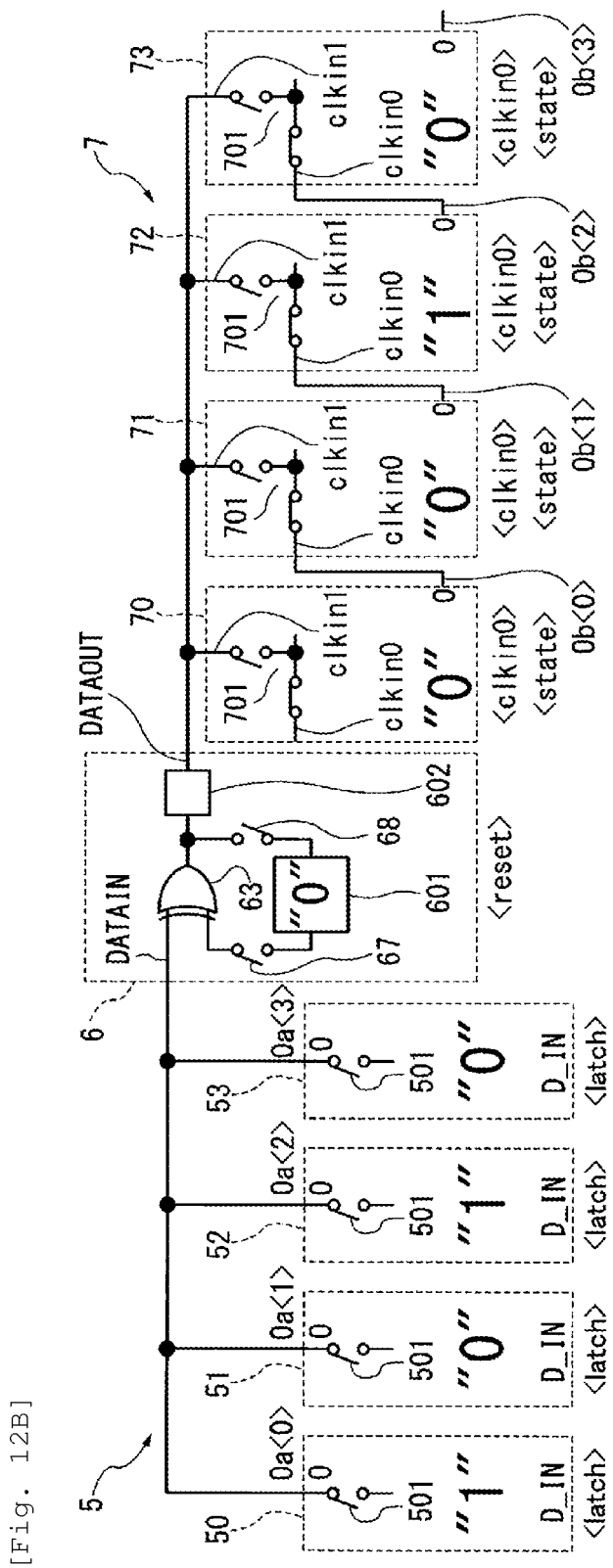
[Fig. 12B]

[Fig. 12C]
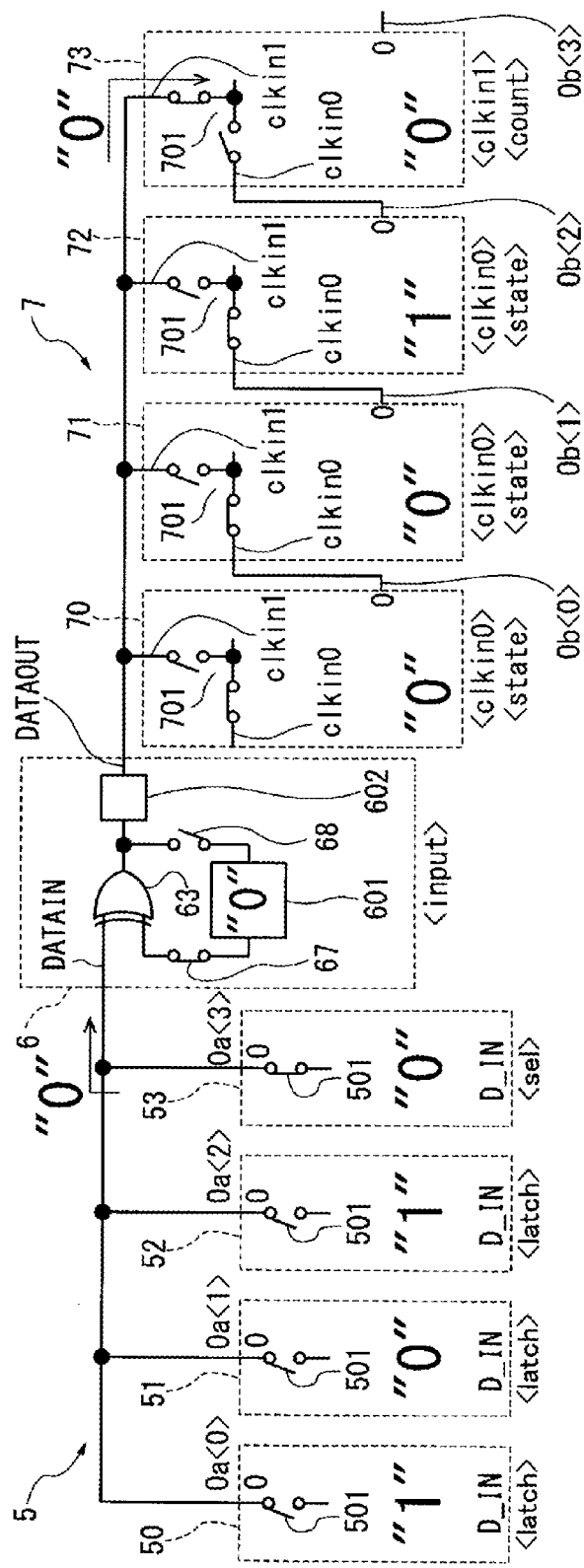

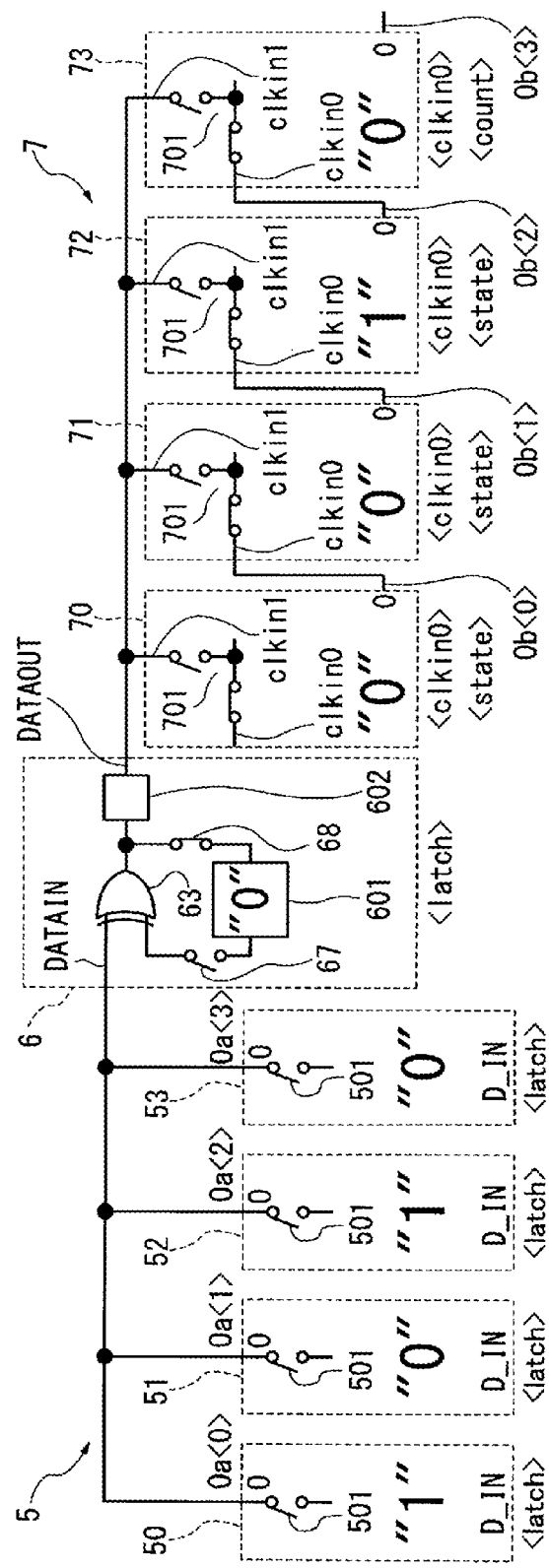
[Fig. 12D]

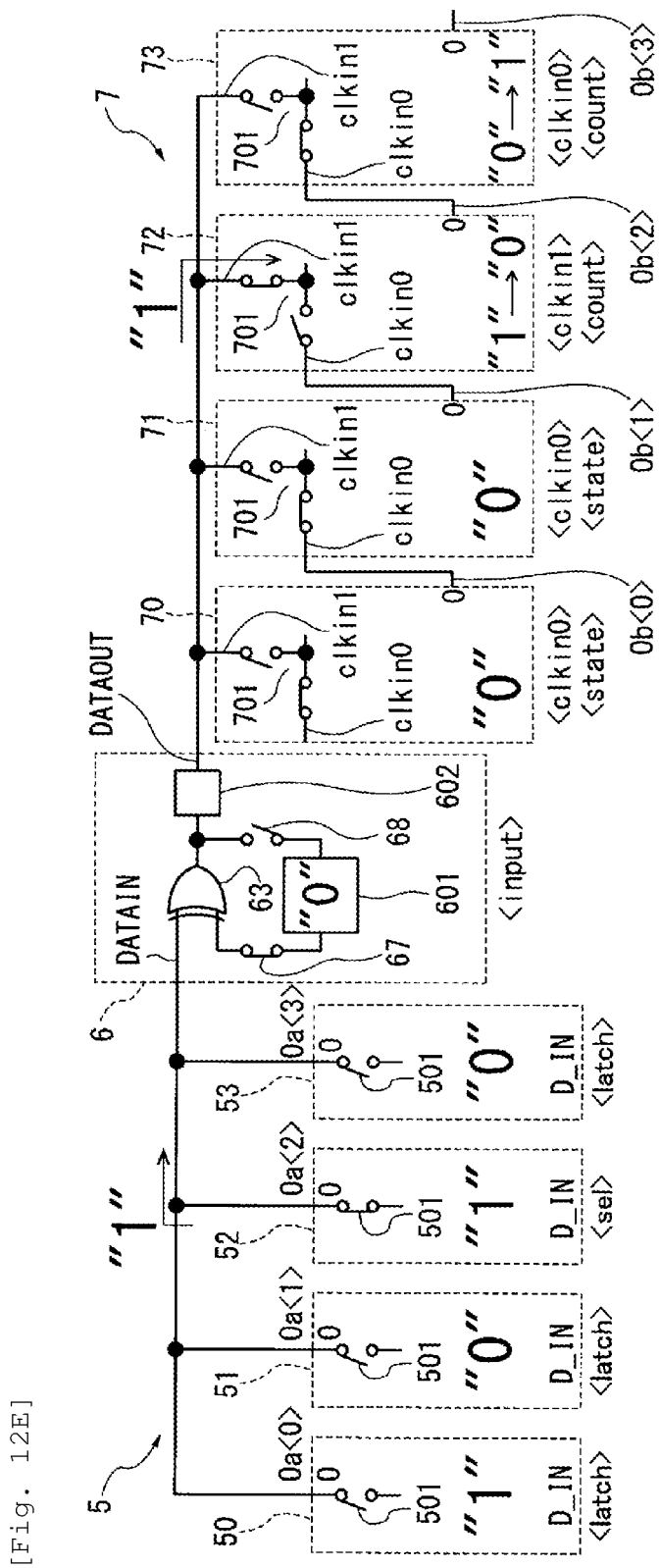
[Fig. 12E]

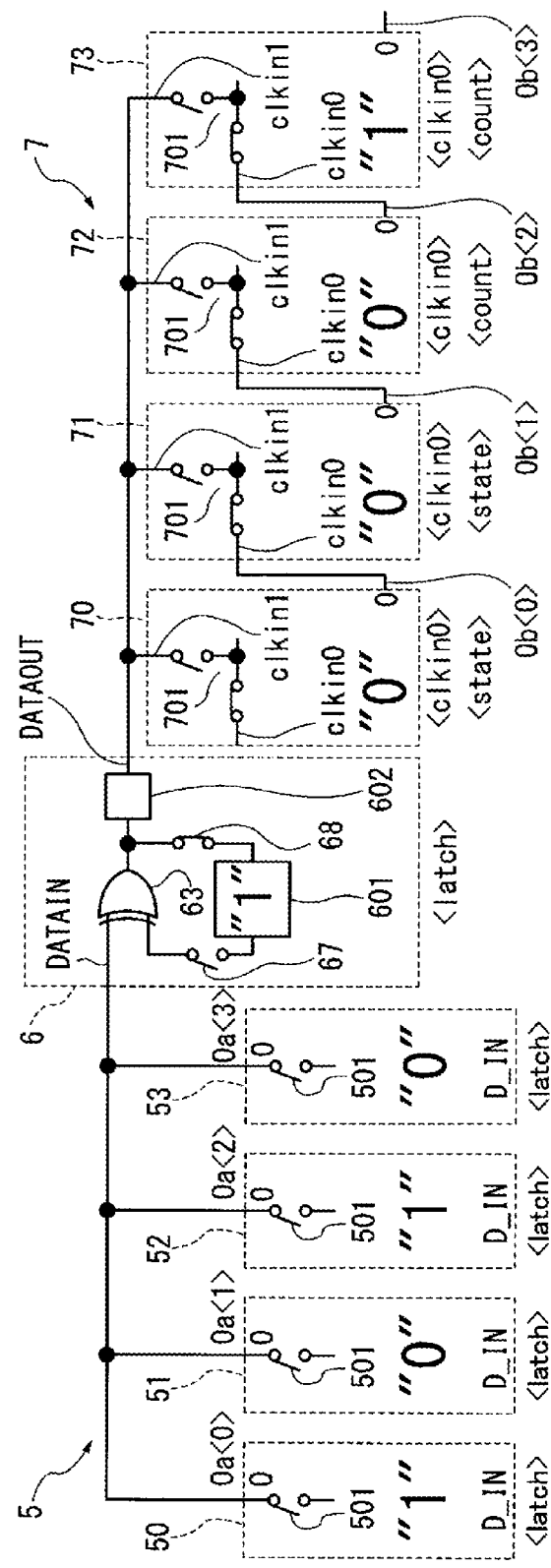
[Fig. 12F]

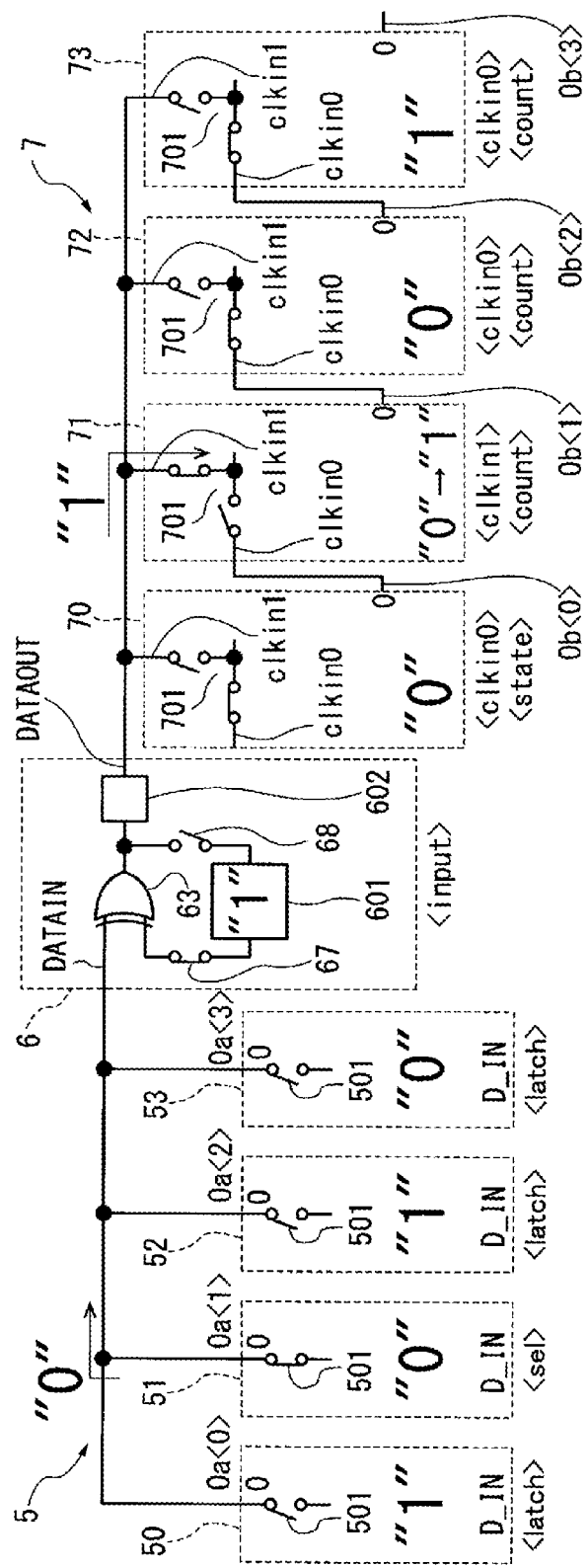
[Fig. 12G]

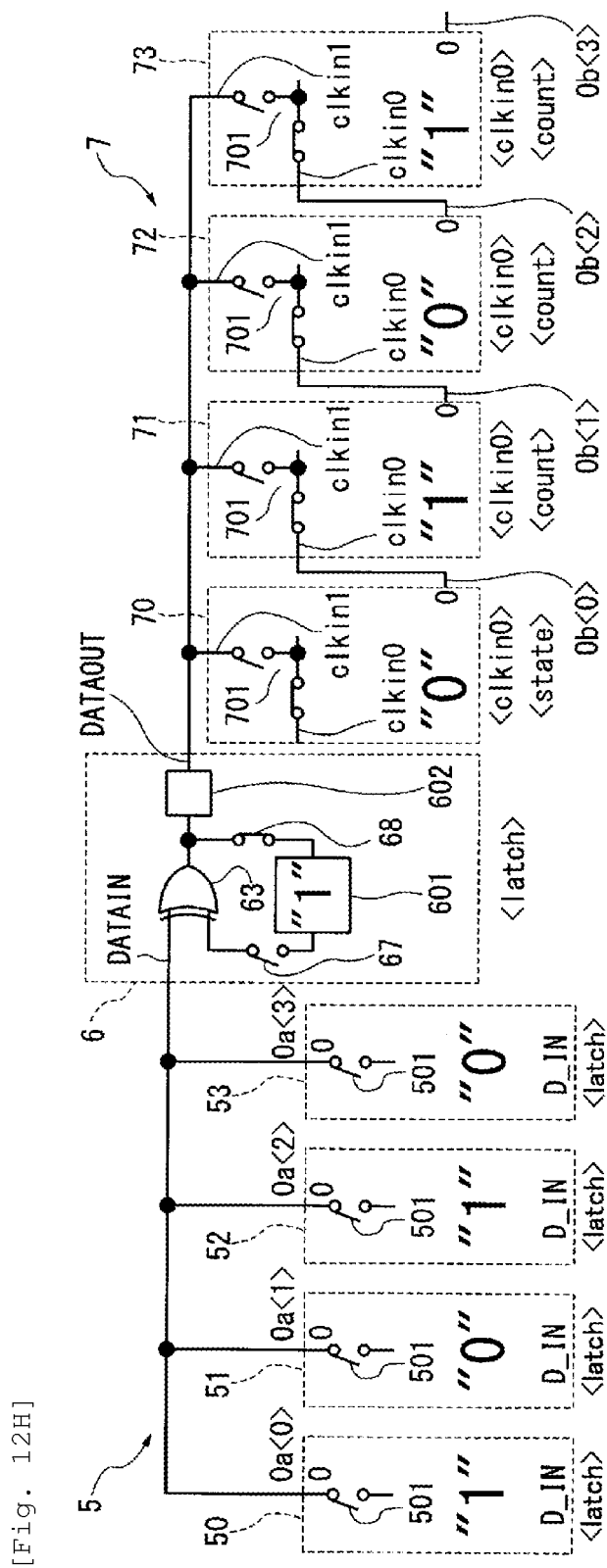
[Fig. 12H]

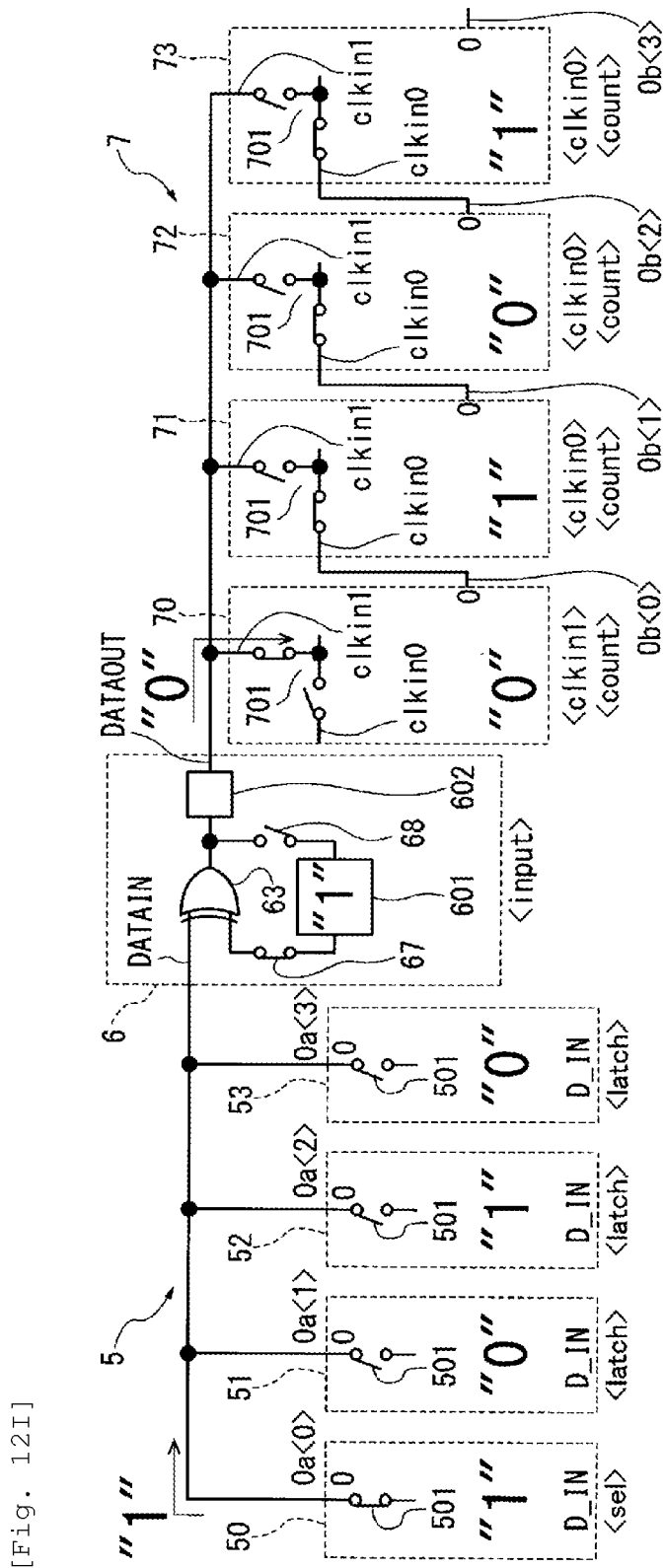
[Fig. 12I]

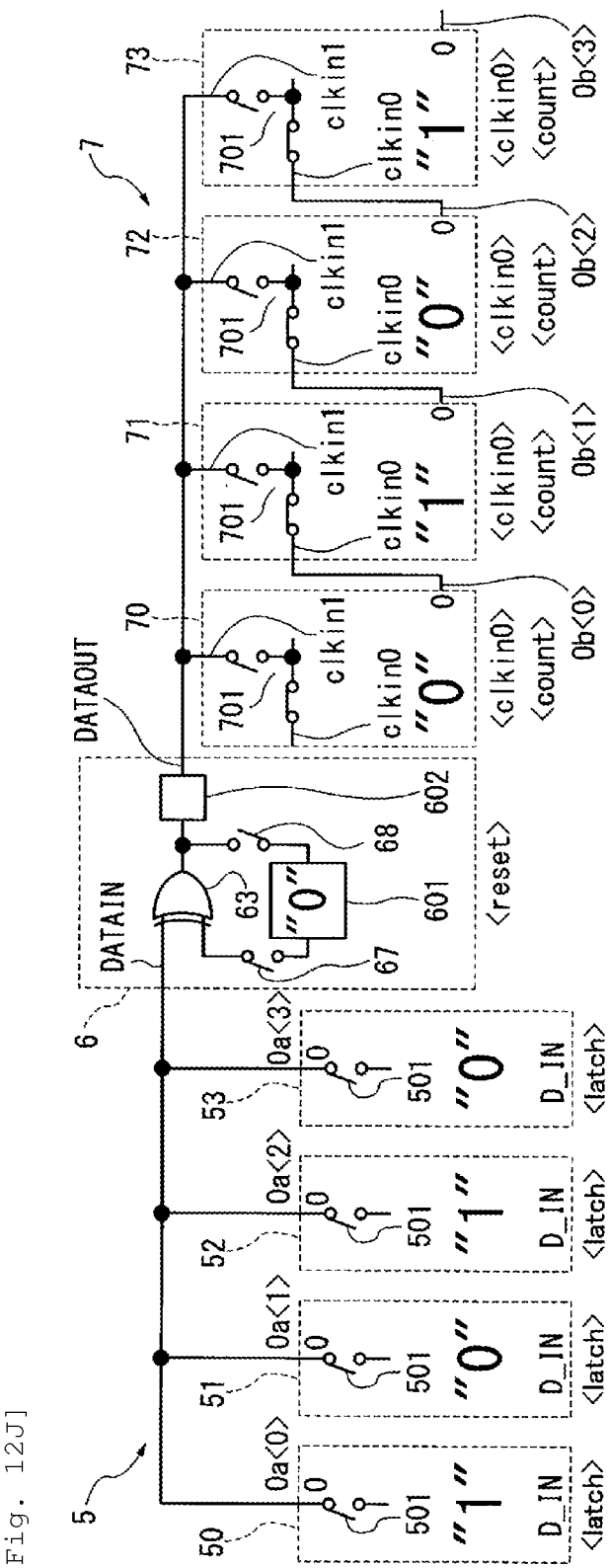
[Fig. 12J]

[Fig. 13]
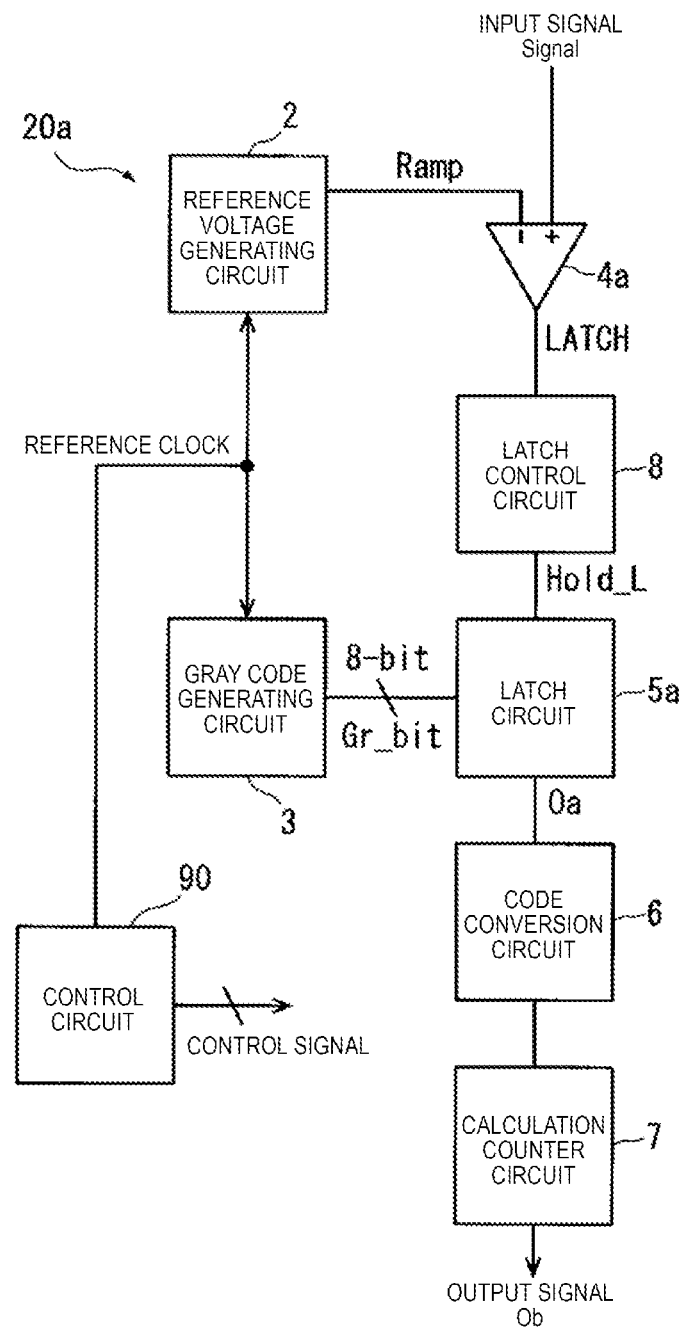

[Fig. 14]
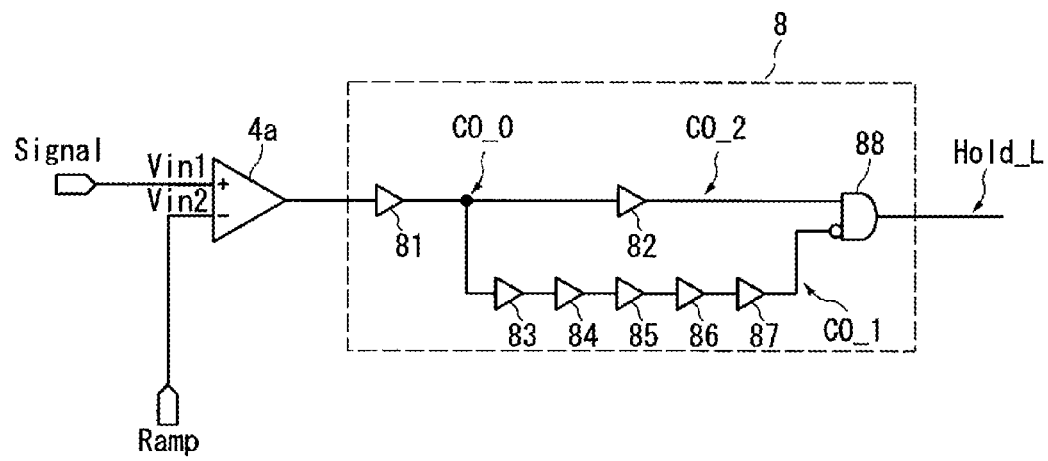

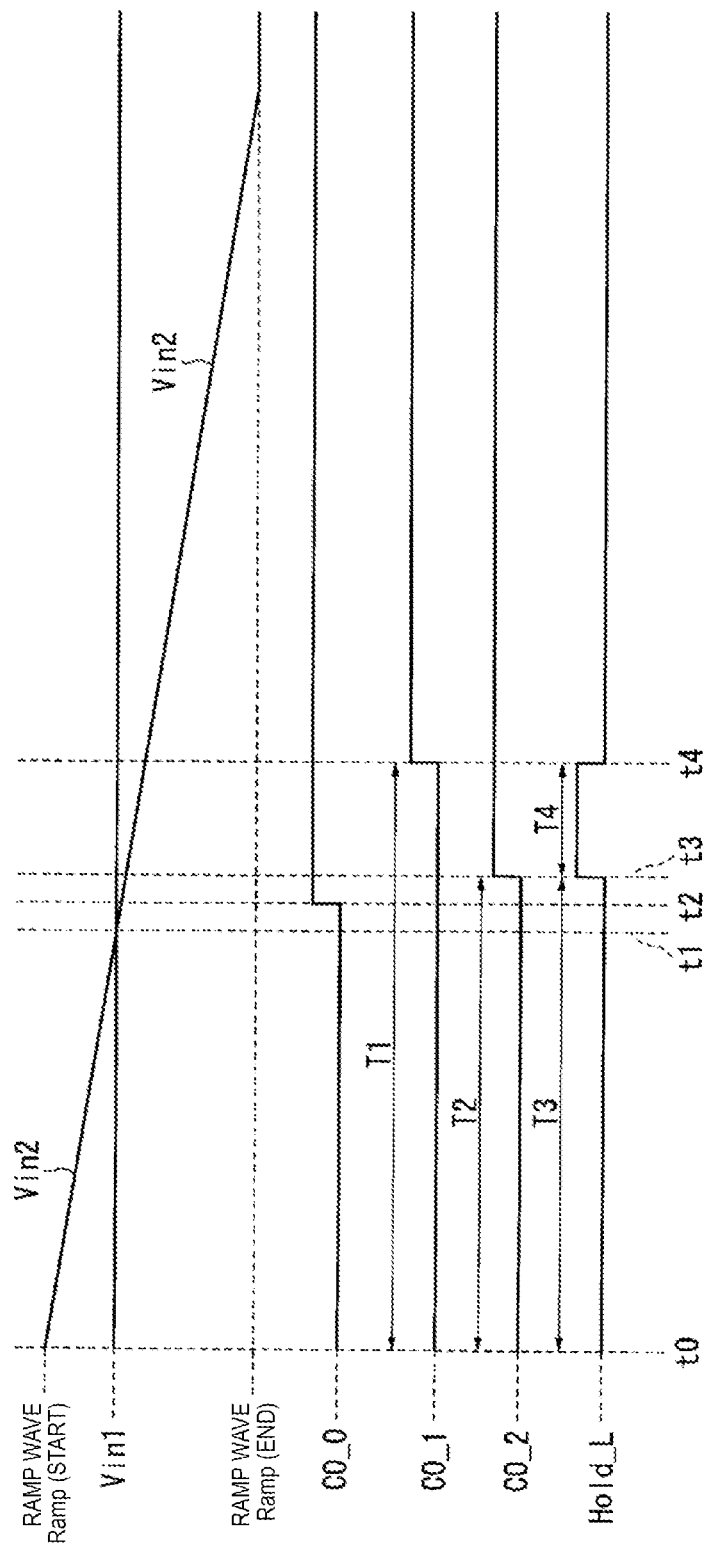

[Fig. 16]
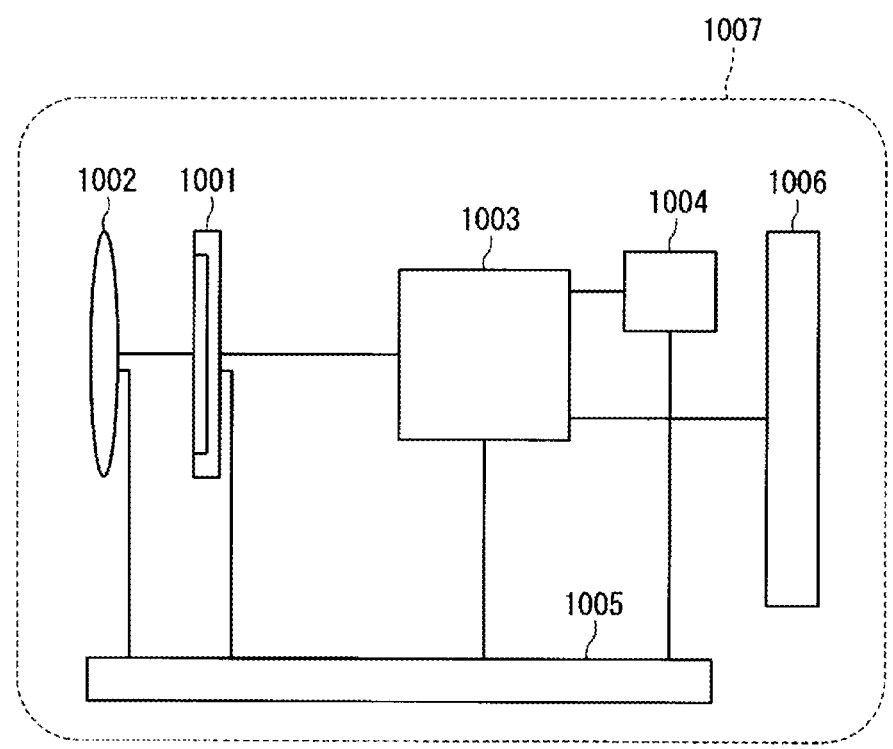

[Fig. 17]
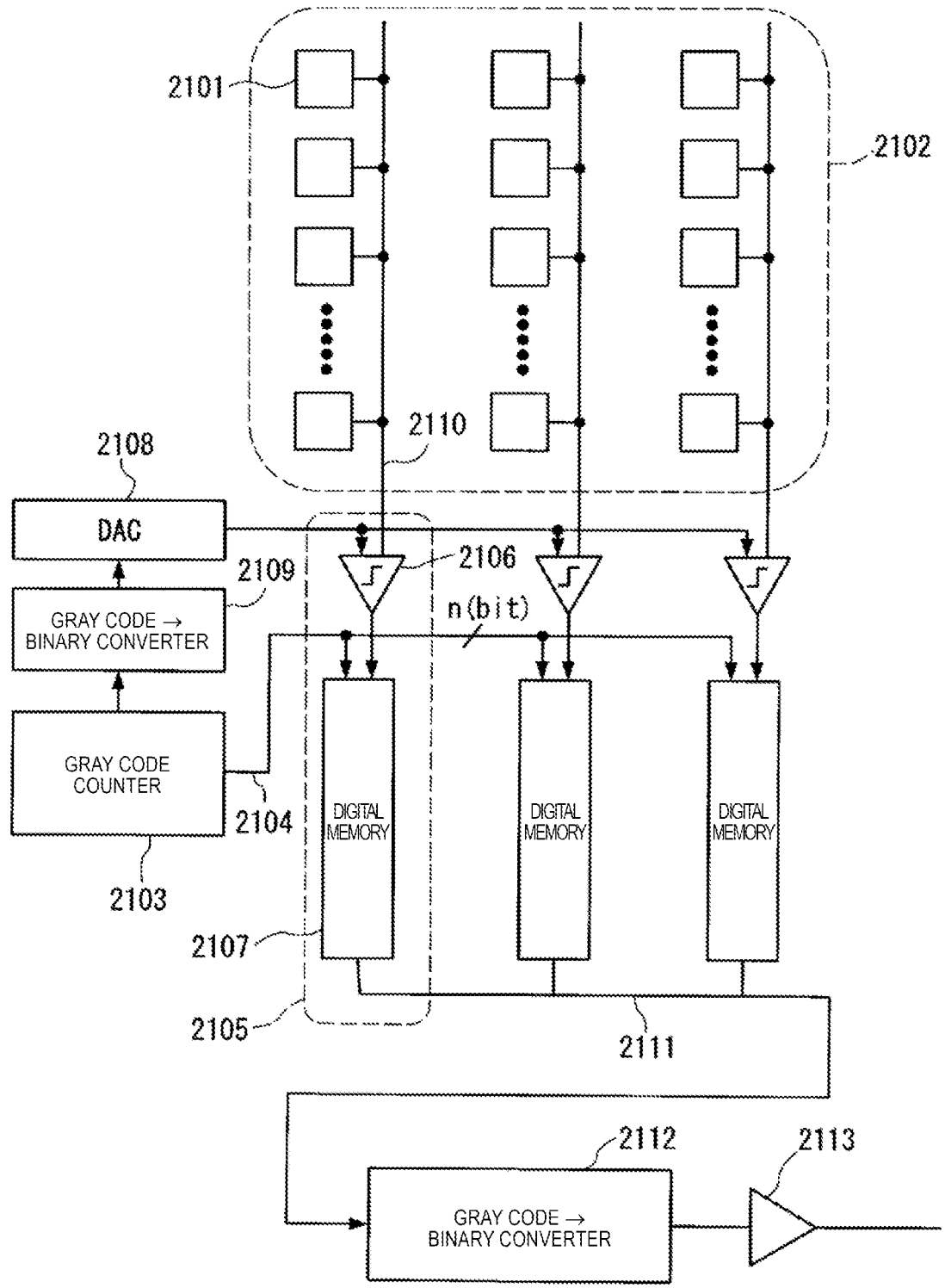

A/D CONVERTER, SOLID-STATE IMAGING DEVICE, METHOD FOR DRIVING SOLID-STATE IMAGING DEVICE, AND ELECTRONIC APPARATUS

CROSS-REFERENCE TO RELATED APPLICATION

This application is a continuation of PCT International Application No. PCT/JP2016/062429, filed on Apr. 19, 2016. The entire content of PCT International Application No. PCT/JP2016/062429 is incorporated by this references.

BACKGROUND

Technical Field

The present invention relates to an A/D converter, a solid-state imaging device, a method for driving a solid-state imaging device, and an electronic apparatus.

Background Art

A so-called column ADC (A/D conversion) type solid-state imaging device having an A/D conversion (analog/digital conversion) function in a column portion has been developed and commercialized. A single slope (SS) type A/D conversion method is known as one of the A/D conversion method realizing the A/D conversion function. The SS method performs the A/D conversion by comparing a reference voltage referred to as a ramp wave that changes in a slope shape with a signal voltage to be subjected to the A/D conversion to generate a time interval (time-based size/pulse width) according to the signal voltage, and counting and digitizing a reference clock corresponding to the time interval with a counter or the like.

A problem of the column ADC type solid-state imaging device using the single slope method is an increase in power consumption due to improvement in performance of the solid-state imaging device. In particular, a counter circuit is provided for each column, and the number of operations of the circuit increases due to an increase in the number of pixels, an increase in the number of frame rates, an increase in the number of bits, and the like. As a result, the circuit is a major cause of the increase in power consumption.

For example, a proposal as in Patent Document 1 is suggested as a technique of reducing the operation of the counter circuit. Hereinafter, an image sensor disclosed in Patent Document 1 will be described with reference to FIG. 17. The image sensor illustrated in FIG. 17 includes a pixel portion 2102, a DAC (digital/analog converter) 2108, a gray code→binary converter 2109, a gray code counter 2103, a plurality of A/D converters 2105, a gray code binary converter 2112, and an output buffer 2113. The pixel portion 2102 includes a plurality of pixels 2101 arranged in a matrix shape. Each A/D converter 2105 includes a comparator 2106 and a digital memory 2107, and converts analog signals 2110 from the pixels 2101 of each column into digital signals. Among these configurations, the plurality of A/D converters 2105 are circuits disposed in pluralities corresponding to each column of the pixels 2101 (this is referred to as a circuit disposed in a column or a column circuit). On the other hand, the gray code counter 2103, the gray code-→binary converter 2109, DAC 2108, and the gray code-→binary converter 2112 are circuits disposed in common with respect to each column of the pixels 2101 (this is referred to as a circuit disposed outside a column).

Among the circuits disposed outside a column, the gray code counter 2103 outputs a counted gray code to the gray code→binary converter 2109 and each digital memory 2107 of the column circuits at the same time. The gray code→binary converter 2109 converts the input gray code into a binary code, and outputs the binary code to the DAC 2108. The DAC 2108 outputs a ramp wave that changes according to the input binary code to each comparison circuit 106 of the column circuits. The gray code→binary converter 2112 converts a gray code 2111 read from each A/D converter 2105 of the column circuits into a binary code, and outputs the binary code. The output buffer 2113 outputs the signal input from the gray code→binary converter 2112 to a predetermined voltage level.

On the other hand, among the circuits disposed in the column, the comparison circuit 106 compares an output signal from the pixel 2101 with the ramp wave input from the DAC 2108, and inputs an output signal which is inverted at a timing when the output signal and the ramp wave coincide with each other to the digital memory 2107. The digital memory 2107 is provided with a number of memories corresponding to the number of signal lines (number of bits) of the gray code, and latches (stores) the gray code at the input timing of the signal from a comparison circuit 2106.

The image sensor illustrated in FIG. 17 operates as follows. The ramp wave from the DAC 2108 is transmitted to the comparison circuit 2106 simultaneously with the start of an A/D conversion operation, and a gray code according to a time interval from the start timing of the A/D conversion operation is transmitted to the digital memory 2107. The digital memory 2107 holds the gray code at the timing when the ramp wave and the pixel signal are compared and coincide with each other. Then, gray codes read from the plurality of A/D converters 2105 are converted into binary codes through the gray code→binary converter 2112, and the converted binary codes are output.

The image sensor illustrated in FIG. 17 has the following effects. In the case of comparing with the method for transmitting the reference clock from outside the column and counting with the counter circuit provided for each column, since the digital memory has a smaller circuit scale and a less consumption current for driving than the counter circuit, it is possible to further reduce the consumption current. More specifically, since a circuit for one bit is configured of one D latch circuit in the memory circuit whereas the circuit is configured of two D latch circuits in the counter circuit, the consumption current during the driving is small.

The reason for converting the binary code into the gray code and outputting the converted gray code to the column circuit is as follows. That is, since a plurality of bits in the binary code may be inverted with a transition of one bit, in a case of transferring a signal having a plurality of bits from outside the column, an error code different from a code corresponding to a time interval occurs due to deviation (due to the jitter component or difference in buffer capacity outputting a signal of each bit) of a inverting timing of each bit. In the case where the error code occurs, the higher the error code is, the larger the deviation from the original code becomes. On the other hand, only one bit in the gray code is inverted with the transition of one bit. Consequently, in the case of transferring the signal having the plurality of bits from outside the column, even when the deviation of the inverting timing of each bit occurs, the deviation from the original code can be confined in one bit.

CITATION LIST

Patent Literature

Patent Document 1: Japanese Patent No. 4423111

Technical Problem

However, the technique disclosed in Patent Document 1 has the following problems.

In general, since there is a variation in output characteristics of a pixel, a so-called correlated double sampling (CDS) operation that takes a difference between a signal voltage or an A/D conversion result (referred to as reset signal) in a state where light is not incident on the pixel (reset state) and a signal voltage or an A/D conversion result (referred to as pixel signal) in a state where desired light is incident on the pixel is performed for obtaining more accurate pixel signal information.

There is also a solid-state imaging device having a calculation function of adding A/D results of pixels including the same color filter under low illuminance or the like.

On the other hand, since a calculation method after obtaining the A/D conversion result with the gray code is not presented in Patent Document 1, the following problems occur when the calculation operation such as the CDS operation or the addition is performed. That is, in a case where the A/D conversion result is read outside a chip and then calculation processing such as the CDS operation or the addition is performed while maintaining the configuration of Patent Document 1, since it is necessary to read the A/D conversion result a plurality of times (for example, reset signal and pixel signal) per one pixel, a data reading time becomes long and the frame rate decreases.

For example, even in a case where a calculation processing circuit is disposed ahead of the gray code binary converter 2112 in addition to the configuration of Patent Document 1 and the calculation processing is performed in the chip, since the processing can be performed at the same time only the number of gray code→binary converters 2112 provided outside the column, the data reading time becomes long and the frame rate decreases as described above.

In any of the above methods, since the latch circuit for holding data for two times is necessary in the column, there is a problem that the circuit scale increases.

Even in a case where the CDS operation or the addition operation is performed between analog signals read from a pixel before performing the A/D conversion operation, since a large-sized sample capacitor for holding a target signal is necessary in the column, a size of the column circuit is increased and a reading time until a signal voltage is stabilized becomes long even when sampling the signal voltage. As a result, the frame rate decreases.

The present invention is made in view of the above circumstances, an object of the present invention is to provide an A/D converter, a solid-state imaging device, a method for driving a solid-state imaging device, and an electronic apparatus capable of outputting a calculation processing result based on two or more analog signals as a digital signal with a simple configuration at the time of an A/D conversion.

SUMMARY

An A/D converter according to a first aspect of the present invention includes a reference voltage generating circuit that generates a reference voltage of a ramp waveform in which a voltage value changes with time, a gray code generating circuit that outputs a gray code based on a same reference clock as the reference voltage generating circuit, a comparison circuit that compares the reference voltage with an input voltage, a latch circuit that holds a count value of the gray code based on an output signal of the comparison circuit, a code conversion circuit that serially converts the count value of the gray code held in the latch circuit into a binary code, and a calculation processing circuit that stores a count value of the binary code output from the code conversion circuit, and performs calculation processing based on the stored count value of the binary code and a next input count value of the binary code.

According to a second aspect of the present invention, in the above-mentioned first aspect, the code conversion circuit includes a logic calculation circuit that performs a logic calculation of signals input from two input terminals, and a feedback circuit connected between an output terminal of the logic calculation circuit and one input terminal of the logic calculation circuit. The latch circuit is connected to the other input terminal of the logic calculation circuit.

According to a third aspect of the present invention, in the above-mentioned second aspect, the logic calculation circuit is a circuit that calculates an exclusive disjunction.

According to a fourth aspect of the present invention, in the above-mentioned the second or the third aspect, the code conversion circuit includes a selection circuit that selects any one of outputting a calculation result of the logic calculation circuit or outputting a clock signal regardless of the calculation result of the logic calculation circuit as an output of the code conversion circuit.

According to a fifth aspect of the present invention, in the above-mentioned first aspect, the calculation processing circuit includes a signal switching circuit that switches between a first input signal and a second input signal, and an operation switching circuit that switches between a first operation state for performing a count operation based on the first or the second input signal and a second operation state for holding a signal without performing the count operation.

According to a sixth aspect of the present invention, in the above-mentioned first aspect, there is further included a pulse signal generating circuit that generates a pulse signal based on the output signal of the comparison circuit, and the latch circuit operates only for a period corresponding to the pulse signal.

A solid-state imaging device according to a seventh aspect of the present invention includes a pixel array in which a plurality of pixels for performing a photoelectric conversion are arranged in a matrix shape, and an A/D converter that is provided for each column or a plurality of columns of the pixels and that converts an analog signal output from the pixel into a digital signal. The A/D converter includes a comparison circuit that compares a reference voltage of a ramp waveform input from a reference voltage generating circuit provided outside the column with an input voltage corresponding to a pixel signal from the pixel, a latch circuit that holds a count value of a gray code input from a gray code generating circuit provided outside the column based on an output signal from the comparison circuit, a code conversion circuit that serially converts the count value of the gray code held in the latch circuit into a binary code, and a calculation processing circuit that stores a count value of the binary code output from the code conversion circuit, and performs calculation processing based on the stored count value of the binary code and a next input count value of the binary code.

According to an eighth aspect of the present invention, in the above-mentioned seventh aspect, the code conversion circuit includes a logic calculation circuit that performs a logic calculation of signals input from two input terminals, and a feedback circuit connected between an output terminal of the logic calculation circuit and one input terminal of the logic calculation circuit, and the latch circuit is connected to the other input terminal of the logic calculation circuit.

According to a ninth aspect of the present invention, in the above-mentioned eighth aspect, the code conversion circuit includes a selection circuit that selects any one of outputting a calculation result of the logic calculation circuit or outputting a clock signal regardless of the calculation result of the logic calculation circuit as an output of the code conversion circuit.

According to a tenth aspect of the present invention, in the above-mentioned seventh aspect, the calculation processing circuit includes a signal switching circuit that switches between a first input signal and a second input signal, and an operation switching circuit that switches between a first operation state for performing a count operation based on the first or the second input signal and a second operation state for holding a signal without performing the count operation.

According to an eleventh aspect of the present invention, in the above-mentioned seventh aspect, there is further included a pulse signal generating circuit that generates a pulse signal based on the output signal of the comparison circuit, and the latch circuit operates only for a period corresponding to the pulse signal.

In a method for driving a solid-state imaging device according to a twelfth aspect of the present invention, the device includes a pixel array in which a plurality of pixels for performing a photoelectric conversion are arranged in a matrix shape, and an A/D converter provided for each column or a plurality of columns of the pixels and that converts an analog signal output from the pixel into a digital signal, the method includes a comparison step of comparing a reference voltage of a ramp waveform input from outside the column with an input voltage corresponding to a pixel signal from the pixel by the A/D converter, a storage holding step of holding a count value of a gray code input from outside the column based on the comparison result by the A/D converter, a code conversion step of serially converting the held count value of the gray code into a binary code by the A/D converter, and a calculation processing step of storing a count value of the binary code by the A/D converter and performing calculation processing based on the stored count value of the binary code and a next input count value of the binary code by the A/D converter.

An electronic apparatus according to a thirteenth aspect of the present invention includes a solid-state imaging device including a pixel array in which a plurality of pixels for performing a photoelectric conversion are arranged in a matrix shape, and an A/D converter provided for each column or a plurality of columns of the pixels and that converts an analog signal output from the pixel into a digital signal. The A/D converter includes a comparison circuit that compares a reference voltage of a ramp waveform input from a reference voltage generating circuit provided outside the column with an input voltage corresponding to a pixel signal from the pixel, a latch circuit that holds a count value of a gray code input from a gray code generating circuit provided outside the column based on an output signal from the comparison circuit, a code conversion circuit that serially converts the count value of the gray code held in the latch circuit into a binary code, and a calculation processing circuit that stores a count value of the binary code output from the code conversion circuit and performs calculation processing based on the stored count value of the binary code and a next input count value of the binary code.

According to aspects of the present invention, it is possible to output a calculation processing result based on two or more analog signals as a digital signal with a simple configuration at least at the time of an A/D conversion.

BRIEF DESCRIPTION OF THE DRAWINGS

FIG. 1 is a block diagram illustrating a configuration example of an A/D converter 20 according to one embodiment of the present invention.

FIG. 2 is a block diagram illustrating a configuration example of a solid-state imaging device 100 according to one embodiment of the present invention.

FIG. 3 is a block diagram illustrating a configuration example of a gray code generating circuit 3 illustrated in FIG. 1.

FIG. 4 is a block diagram illustrating a configuration example of a latch circuit 5 illustrated in FIG. 1.

FIG. 5 is a circuit diagram illustrating a configuration example of one-bit latch circuits 50 to 57 illustrated in FIG. 4.

FIG. 6 is a circuit diagram illustrating a configuration example of a code conversion circuit 6 illustrated in FIG. 1.

FIG. 7 is a table illustrating operation states of the code conversion circuit 6 illustrated in FIG. 6.

FIG. 8 is a block diagram illustrating a configuration example of a calculation counter circuit 7 illustrated in FIG. 1.

FIG. 9 is a circuit diagram illustrating a configuration example of one-bit calculation counter circuits 70 to 77 illustrated in FIG. 8.

FIG. 10 is a table illustrating operation states of the one-bit calculation counter circuits 70 to 77 illustrated in FIG. 9.

FIG. 11A is an explanatory diagram for describing an operation example of the A/D converter 20 illustrated in FIG. 1.

FIG. 11B is an explanatory diagram for describing the operation example of the A/D converter 20 illustrated in FIG. 1.

FIG. 11C is an explanatory diagram for describing the operation example of the A/D converter 20 illustrated in FIG. 1.

FIG. 11D is an explanatory diagram for describing the operation example of the A/D converter 20 illustrated in FIG. 1.

FIG. 11E is an explanatory diagram for describing the operation example of the A/D converter 20 illustrated in FIG. 1.

FIG. 11F is an explanatory diagram for describing the operation example of the A/D converter 20 illustrated in FIG. 1.

FIG. 11G is an explanatory diagram for describing the operation example of the A/D converter 20 illustrated in FIG. 1.

FIG. 11H is an explanatory diagram for describing the operation example of the A/D converter 20 illustrated in FIG. 1.

FIG. 11I is an explanatory diagram for describing the operation example of the A/D converter 20 illustrated in FIG. 1.

FIG. 11J is an explanatory diagram for describing the operation example of the A/D converter 20 illustrated in FIG. 1.

FIG. 11K is an explanatory diagram for describing the operation example of the A/D converter 20 illustrated in FIG. 1.

FIG. 11L is an explanatory diagram for describing the operation example of the A/D converter 20 illustrated in FIG. 1.

FIG. 11M is an explanatory diagram for describing the operation example of the A/D converter 20 illustrated in FIG. 1.

FIG. 11N is an explanatory diagram for describing the operation example of the A/D converter 20 illustrated in FIG. 1.

FIG. 11O is an explanatory diagram for describing the operation example of the A/D converter 20 illustrated in FIG. 1.

FIG. 11P is an explanatory diagram for describing the operation example of the A/D converter 20 illustrated in FIG. 1.

FIG. 11Q is an explanatory diagram for describing the operation example of the A/D converter 20 illustrated in FIG. 1.

FIG. 11R is an explanatory diagram for describing the operation example of the A/D converter 20 illustrated in FIG. 1.

FIG. 11S is an explanatory diagram for describing the operation example of the A/D converter 20 illustrated in FIG. 1.

FIG. 11T is an explanatory diagram for describing the operation example of the A/D converter 20 illustrated in FIG. 1.

FIG. 11U is an explanatory diagram for describing the operation example of the A/D converter 20 illustrated in FIG. 1.

FIG. 11V is an explanatory diagram for describing the operation example of the A/D converter 20 illustrated in FIG. 1.

FIG. 11W is an explanatory diagram for describing the operation example of the A/D converter 20 illustrated in FIG. 1.

FIG. 12A is an explanatory diagram for describing another operation example of the A/D converter 20 illustrated in FIG. 1.

FIG. 12B is an explanatory diagram for describing another operation example of the A/D converter 20 illustrated in FIG. 1.

FIG. 12C is an explanatory diagram for describing another operation example of the A/D converter 20 illustrated in FIG. 1.

FIG. 12D is an explanatory diagram for describing another operation example of the A/D converter 20 illustrated in FIG. 1.

FIG. 12E is an explanatory diagram for describing another operation example of the A/D converter 20 illustrated in FIG. 1.

FIG. 12F is an explanatory diagram for describing another operation example of the A/D converter 20 illustrated in FIG. 1.

FIG. 12G is an explanatory diagram for describing another operation example of the A/D converter 20 illustrated in FIG. 1.

FIG. 12H is an explanatory diagram for describing another operation example of the A/D converter 20 illustrated in FIG. 1.

FIG. 12I is an explanatory diagram for describing another operation example of the A/D converter 20 illustrated in FIG. 1.

FIG. 12J is an explanatory diagram for describing another operation example of the A/D converter 20 illustrated in FIG. 1.

FIG. 13 is a block diagram illustrating a configuration example of an A/D converter 20*a* according to another embodiment of the present invention.

FIG. 14 is a circuit diagram illustrating a configuration example of a latch control circuit 8 illustrated in FIG. 13.

FIG. 15 is a timing diagram for describing an operation example of the latch control circuit 8 illustrated in FIG. 14.

FIG. 16 is a block diagram illustrating a configuration example of an electronic apparatus 1007 according to another embodiment of the present invention.

FIG. 17 is a block diagram for describing a configuration of an image sensor disclosed in Patent Document 1.

DESCRIPTION OF EMBODIMENTS

Hereinafter, embodiments according to the present invention will be described with reference to drawings. FIG. 1 is a block diagram illustrating a configuration example of an A/D converter 20 according to one embodiment of the present invention. FIG. 2 is a block diagram illustrating a configuration example of a solid-state imaging device 100 including the A/D converter 20 illustrated in FIG. 1. In each drawing, the same reference numeral is used for the same or corresponding configuration, and description thereof will be omitted as appropriate.

The A/D converter 20 illustrated in FIG. 1 includes a reference voltage generating circuit 2, a gray code generating circuit 3, a comparison circuit 4, a latch circuit 5, a code conversion circuit 6, a calculation counter circuit 7, and a control circuit 90. The A/D converter 20 receives two or more analog signals as an input signal Signal in a time division manner, and outputs a predetermined calculation processing result based on the received two or more analog signals as a digital signal Ob. The predetermined calculation processing result is a result of any calculation processing using a digital conversion value of the two or more analog signals. For example, the predetermined calculation processing is subtraction processing, addition processing, addition/subtraction processing, or calculation processing to which predetermined multiplication/division processing such as two times or ½ is added, using the digital conversion value of the two or more analog signals. There is no limitation on the input signal Signal, and the input signal Signal is not limited to a pixel signal described below and can be an output signal of another sensor or a voltage signal of a plurality of nodes in a circuit. Hereinafter, the A/D converter 20 and an application example thereof will be described by exemplifying a case where the pixel signal is input as an example.

The solid-state imaging device 100 illustrated in FIG. 2 includes a pixel array 10, a vertical scanning circuit 200, a horizontal scanning circuit 300, a driving control circuit 90*a*, the A/D converter 20, and the A/D converters 20-2 to 20-*n*. In the solid-state imaging device 100 illustrated in FIG. 2, the A/D converter 20 corresponds to the A/D converter 20 illustrated in FIG. 1. In the solid-state imaging device 100 illustrated in FIG. 2, the control circuit 90 illustrated in FIG. 1 is included in the driving control circuit 90*a* illustrated in FIG. 2. The A/D converters 20-2 to 20-*n* are configured to have the same function as the A/D converter 20 illustrated in FIGS. 1 and 2. The A/D converters 20-2 to 20-*n* share one set of the reference voltage generating circuit 2, the gray code generating circuit 3, and the control circuit 90 of the A/D converter 20. Consequently, the reference voltage generating circuit 2, the gray code generating circuit 3, and the control circuit 90 are not included in blocks of dashed lines indicating the A/D converters 20-2 to 20-n.

In FIG. 2, the pixel array 10 includes a plurality of pixels 1 arranged in a matrix shape for performing a photoelectric conversion. The vertical scanning circuit 200 scans the plurality of pixels 1 of the pixel array 10 for each row, and supplies a predetermined control signal with respect to each pixel 1. The horizontal scanning circuit 300 scans the plurality of pixels 1 of the pixel array 10 for each column, and supplies a predetermined control signal with respect to each pixel 1. The pixel array 10 outputs the pixel signal from each pixel 1 based on the predetermined control signals supplied from the vertical scanning circuit 200 and the horizontal scanning circuit 300, and inputs the pixel signal to the A/D converter 20 or the A/D converters 20-2 to 20-n. The driving control circuit 90a drives and controls the vertical scanning circuit 200 and the horizontal scanning circuit 300, and supplies a predetermined control signal with respect to the A/D converter 20 and the A/D converters 20-2 to 20-n as the control circuit 90.

In the example illustrated in FIG. 2, the A/D converter 20 and the A/D converters 20-2 to 20-n are provided for each column of the plurality of pixels 1 arranged in a matrix shape, and the A/D converter 20 and the A/D converters 20-2 to 20-n respectively convert an analog signal output from each pixel 1 of each column into a digital signal. The A/D converter 20 and the A/D converters 20-2 to 20-n may be provided for each of a plurality of columns of the pixel 1 in the pixel array 10, and a pixel signal output from each pixel 1 of the plurality of columns may be input. That is, the A/D converter 20 and the A/D converters 20-2 to 20-n may obtain, for example, a sum value or a difference value of pixel signals of the plurality of columns of each pixel 1.

Returning to FIG. 1, in the A/D converter 20, the reference voltage generating circuit 2 generates and outputs a ramp wave which is compared with the signal read from the pixel 1. That is, the reference voltage generating circuit 2 generates and outputs a reference voltage Ramp of a ramp waveform in which a voltage value changes with time.

The gray code generating circuit 3 starts counting simultaneously with the output of the ramp wave, and generates and outputs a gray code Gr_bit corresponding to the number of clocks of a reference clock. For example, the gray code generating circuit 3 generates an 8-bit gray code Gr_bit based on the same reference clock as the reference voltage generating circuit 2, and outputs the generated code in parallel.

The comparison circuit 4 compares the reference voltage Ramp of the ramp wave with a voltage of the signal (input signal Signal) read from the pixel 1. That is, the comparison circuit 4 compares the reference voltage Ramp output from the reference voltage generating circuit 2 with the input voltage of the input signal Signal, and outputs a signal LATCH indicating a comparison result. In the example illustrated in FIG. 1, the reference voltage Ramp is input to a non-inverting input terminal of the comparison circuit 4, and the voltage of the input signal Signal is applied to an inverting input terminal, but it may be reversed.

The latch circuit 5 receives the gray code Gr_bit output from the gray code generating circuit 3, and holds signal information of a gray code Gr_bit at a time when receiving an output signal LATCH from the comparison circuit 4. That is, the latch circuit 5 holds a count value of the gray code Gr_bit by the gray code generating circuit 3 based on the output signal LATCH of the comparison circuit 4.

The code conversion circuit 6 sequentially receives each bit of the gray code Gr_bit held in the latch circuit 5, and converts the signal information into a binary code. That is, the code conversion circuit 6 serially receives each bit of the count value of the gray code Gr_bit held in the latch circuit 5 as a serial signal Oa, converts the serial signal into the binary code, and serially outputs the binary code from a DATAOUT terminal.

The calculation counter circuit 7 stores the binary code output from the code conversion circuit 6, performs calculation processing of, for example, addition or subtraction of two binary codes, and outputs an output signal Ob indicating a calculation result. That is, the calculation counter circuit 7 (calculation processing circuit) stores the count value of the binary code output from the code conversion circuit 6, performs the calculation processing based on the stored count value of the binary code and a next input count value of a binary code, and outputs a result of the calculation processing.

The control circuit 90 generates the reference clock and supplies the generated clock to the reference voltage generating circuit 2 and the gray code generating circuit 3, and generates another predetermined control signal and supplies the generated signal to each portion illustrated in FIG. 1.

On the other hand, in the solid-state imaging device 100 illustrated in FIG. 2, the reference voltage generating circuit 2 and the gray code generating circuit 3 are disposed outside the column, and the comparison circuit 4, the latch circuit 5, the code conversion circuit 6, and the calculation counter circuit 7 are disposed in the column (each column). The same reference voltage Ramp output from the reference voltage generating circuit 2 and the same gray code Gr_bit output from gray code generating circuit 3 are input to the A/D conversion circuit 20 and the A/D conversion circuit 20-2 to 20-n.

FIG. 3 illustrates a configuration example of a gray code generating circuit 3 illustrated in FIG. 1. The gray code generating circuit 3 includes a binary counter circuit 31 and a plurality of EXOR circuits (exclusive disjunction circuit) 32 to 39. The binary counter circuit 31 receives the reference clock, counts the number of clocks, and outputs a binary code Bi_bit. The plurality of EXOR circuits 32 to 39 receive bit signals of consecutive digits such as bits <0> and <1> or bits <1> and <2> of the binary code Bi_bit output from the binary counter circuit 31. For example, the least significant Bi_bit <0> and one high-order Bi_bit <1> thereof are input to the EXOR circuit 32 that outputs the least significant Gr_bit <0>. The one high-order Bi_bit <1> of the least significant bit and one high-order Bi_bit <2> thereof are input to the EXOR circuit 33 that outputs one high-order Gr_bit <1> of the least significant bit. The Bi_bit <0> is the least significant bit of the binary code Bi_bit, a Bi_bit <7> is the most significant bit of the binary code Bi_bit, the Gr_bit <0> is the least significant bit of the gray code Gr_bit, and a Gr_bit <7> is the most significant bit of the gray code Gr_bit. Bits <2> to <6> are one high-order bit of the least significant bit to one low-order bit of the most significant bit. In the EXOR circuit 39 to which the most significant bit (Here, bit <7>) of the binary code Bi_bit is input, an input of one side is connected to GND. With the configuration, the gray code generating circuit 3 sets the most significant bit Bi_bit <7> of the binary code as it is, as the most significant bit Gr_bit <7> of the gray code, and sets the exclusive disjunction between Bi_bits <6> to <0> of the binary code and one high-order bits <7> to <1> thereof as Gr_bits <6> to <0> of the gray code. The signal information output by the EXOR circuits 32 to 39 is input to the latch circuit 5 in parallel as the gray code Gr_bit (Gr_bits <0> to <7>). Depending on a driving capability of an output terminal of the binary counter circuit 31, the EXOR circuit 39 may be omitted and the Bi_bit <7> may be output as it is, as the Gr_bit <7>.

FIG. 4 illustrates a configuration example of the latch circuit 5 illustrated in FIG. 1. The latch circuit 5 includes one-bit latch circuits 50 to 57 having the same configuration corresponding to the number of bits (8 bits in the example). The one-bit latch circuits 50 to 57 respectively latch and hold one of the gray code signal Gr_bits <0> to <7> input to a D_IN terminal at the timing of receiving the output signal LATCH input to an L_ON terminal from the comparison circuit 4. Each output terminal O of the one-bit latch circuits 50 to 57 is connected to a common signal line (LDATAOUT), and the circuits serially output the held signals as the signals Oa <7> to <0> from a LATDATAOUT terminal when receiving each SEL signal (SELs <7> to <0>) input to sel terminals.

The one-bit latch circuits 50 to 57 can initialize a level of the latched signal by inputting a signal having a predetermined level to an rst terminal.

Each SEL signal (SELs <0> to <7>) and the signal input to the rst terminal are the signals generated and output by the control circuit 90 at a predetermined timing.

FIG. 5 illustrates a configuration example of the one-bit latch circuits 50 to 57 illustrated in FIG. 4. The one-bit latch circuits 50 to 57 include a so-called D latch circuit 500 that creates a feedback loop and holds a signal, and a switch 501 that can selectively output an output of the circuit. The D latch circuit 500 includes switches 502 and 503, inverter circuits 504 and 505, and a NOR circuit (negative logical disjunction circuit) 506. The switch 502 is controlled to be turned on or off by the signal input to the L_ON terminal. The switch 503 is controlled to be turned on or off by an output signal of the inverter circuit 504 of which an input terminal is connected to the L_ON terminal. Therefore, the switches 502 and 503 are in the ON or OFF state opposite to each other. One end of an opening/closing circuit of the switch 502 is connected to a D_IN terminal, and the other end thereof is connected to one end of an opening/closing circuit of the switch 503 and an input terminal of an inverter circuit 505. An output terminal of the inverter circuit 505 is connected to one input terminal of a NOR circuit 506, and the other input terminal of the NOR circuit 506 is connected to the rst terminal. An output terminal of the NOR circuit 506 is connected to the other end of the opening/closing circuit of the switch 503 and one end of an opening/closing circuit of the switch 501. The other end of the opening/closing circuit of the switch 501 is connected to an O terminal. The switch 501 is controlled to be turned on or off by the signal input to the sel terminal.

With the configuration described above, the one-bit latch circuits 50 to 57 illustrated in FIG. 5 fetch the signal input to the D_IN terminal into the D latch circuit 500 in a case where the signal LATCH input to the L_ON terminal is "1" ("Hi" signal), and hold the fetched signal in the D latch circuit 500 in a case where the signal LATCH is "0" ("Lo" signal). An operation state where "1" is input to the L_ON terminal and then "0" is input is referred to as an operation state <latch>. The one-bit latch circuits 50 to 57 input "1" to the rst terminal to reset the signal held by the D latch circuit 500 to "0". The one-bit latch circuits 50 to 57 turn on the switch 501 in a case where "1" is input to the sel terminal, and output the signal held by the D latch circuit 500 from the O terminal. An operation state where "1" is input to the sel terminal is referred to as an operation state <sel>. The SEL signals (SELs <0> to <7>) input to the sel terminal are signals having a predetermined time width, and a "1" signal is a pulse signal having a predetermined time width in a case where "1" is output from the O terminal.

Next, a configuration example of the code conversion circuit 6 illustrated in FIG. 1 will be described with reference to FIG. 6. The code conversion circuit 6 illustrated in FIG. 6 includes an EXOR circuit 63, a feedback loop circuit 601, a logic circuit 602, and the switches 67 and 68. The EXOR circuit 63 sequentially inputs the gray code serially output as the signals Oa <7> to <0> from the LATDATAOUT terminal by the latch circuit 5 to one input terminal connected to a DATAIN terminal. The feedback loop circuit 601 includes a NOR circuit 61, an inverter circuit 62, and a switch 66, and is connected between an output terminal and the other end of the input terminal of the EXOR circuit 63 through a switch 68 and a switch 67. The logic circuit 602 includes two NAND circuits 64 and 65 (negative logical conjunction circuit), is connected to the output terminal of the EXOR circuit 63, a FBCLK terminal, an ENCLK terminal, and the like, and controls an output of the output signal from the DATAOUT terminal. The NAND circuit 64 sets one input terminal as a negative logic input.

The switch 67 is controlled to be turned on or off by a signal input to an INPUTCLK terminal. One end of an opening/closing circuit of the switch 67 is connected to the other end of the input terminal of the EXOR circuit 63, and the other end thereof is connected to an output terminal of the NOR circuit 61 and one end of an opening/closing circuit of the switch 66. The switch 68 is controlled to be turned on or off by a signal input to the FBCLK terminal. One end of an opening/closing circuit of the switch 68 is connected to the output terminal of the EXOR circuit 63 and one input terminal of the NAND circuit 64, and the other end thereof is connected to an input terminal of the inverter circuit 62 and the other end of the opening/closing circuit of the switch 66.

One input terminal of the NOR circuit 61 is connected to an output terminal of the inverter circuit 62, and the other input terminal thereof is connected to the RST terminal. The other negative logic input terminal of the NAND circuit 64 is connected to the FBCLK terminal. An output terminal of the NAND circuit 64 is connected to one input terminal of an NAND circuit 65. The other input terminal of the NAND circuit 65 is connected to the ENCLK terminal. An output terminal of the NAND circuit 65 is connected to the DATAOUT terminal.

Each signal input to the HOLDCLK terminal, the RST terminal, the INPUTCLK terminal, the FBCLK terminal, and the ENCLK terminal is the signal generated and output by the control circuit 90 at the predetermined timing.

The code conversion circuit 6 has the following functions.
(1) A function of outputting the logic result of the gray code input to the DATAIN terminal and the signal input from the feedback loop circuit 601 from the output terminal DATAOUT.
(2) A function of holding the output result in the feedback loop circuit 601.
(3) A function of outputting the clock signal regardless of the output of the EXOR circuit 63.

Here, an operation of the code conversion circuit 6 illustrated in FIG. 6 will be described with reference to FIG. 7. FIG. 7 is a table illustrating a relationship between states of signals input to the RST terminal, the INPUTCLK terminal, the HOLDCLK terminal, the FBCLK terminal, and the ENCLK terminal in the code conversion circuit 6, and operation states taken by the code conversion circuit 6. In FIG. 7, "1" indicates "Hi" for the input signal, and the ON state for the switch (*1). The "0" indicates "Lo" for the input signal, and the OFF state for the switch (*2).

A state <reset> is an operation state in which a value held by the feedback loop circuit 601 is initialized to "0" and "0" is output from the DATAOUT terminal. In the state <reset>, the RST terminal is set to "1", the INPUTCLK terminal is set to "0", the HOLDCLK terminal is set to "0", the FBCLK terminal is set to "0", and the ENCLK terminal is set to "1". In the case, the switch 66 is OFF, the switch 67 is OFF, the switch 68 is OFF, and the DATAOUT terminal outputs the same level as the output of the EXOR circuit 63.

A state <latch> is an operation state in which the output signal of the EXOR circuit 63 is fetched into the feedback loop circuit 601. In the state <latch>, the RST terminal is set to "0", the INPUTCLK terminal is set to "0", the HOLDCLK terminal is set to "0", the FBCLK terminal is set to "1", and the ENCLK terminal is set to "1". In the case, the switch 66 is OFF, the switch 67 is OFF, the switch 68 is ON, and the DATAOUT terminal outputs "0".

A state <hold> is an intermediate operation state that transitions from the state <latch> to a state <input>, or that transitions from the state <reset> to the state <input> (*3). In the state <hold>, the feedback loop circuit 601 holds the output level of the EXOR circuit 63 fetched in the state <latch> or "0" initialized in the state <reset>. In the state <hold>, the RST terminal is set to "0", the INPUTCLK terminal is set to "0", the HOLDCLK terminal is set to "1", the FBCLK terminal is set to "0", and the ENCLK terminal is set to "1". In the case, the switch 66 is ON, the switch 67 is OFF, the switch 68 is OFF, and the DATAOUT terminal outputs the same level as the output of the EXOR circuit 63.

The state <input> is an operation state in which the signal held by the feedback loop circuit 601 is input to the EXOR circuit 63. In the state <input>, the RST terminal is set to "0", the INPUTCLK terminal is set to "1", the HOLDCLK terminal is set to "1", the FBCLK terminal is set to "0", and the ENCLK terminal is set to "1". In the case, the switch 66 is ON, the switch 67 is ON, the switch 68 is OFF, and the DATAOUT terminal outputs the same level as the output of the EXOR circuit 63.

A state <clkin> is an operation state in which the "1" signal having the predetermined time width is output from the DATAOUT terminal. In the state <input>, one pulse of "1" is output from the DATAOUT terminal by transitioning the signal input to the ENCLK terminal from "1"→"0"→"1". In the state <clkin>, the FBCLK terminal is set to "1", the ENCLK terminal is set to "1"→"0"→"1". The RST terminal, the INPUTCLK terminal, and the HOLDCLK terminal have arbitrary signal levels. In the case, the switches 66, 67, and 68 are ON or OFF, and "1" having the predetermined time width is output from the DATAOUT terminal.

The code conversion circuit 6 receives each bit of Gr_bits <7> to <0> (=output signals Oa <7> to <0> of latch circuit 5) of the gray code Gr_bit which is latched and output by the latch circuit 5 from the DATAIN terminal, converts the received each bit into the binary code, and serially outputs the converted binary code from the DATAOUT terminal by repeating each operation state of the state <reset>, the state <input>, the state <latch>, and the state <hold> illustrated in FIG. 7 in a predetermined order. In this case, the code conversion circuit 6 performs the exclusive OR on "0" and the gray code Gr_bit <7> to convert it into bit <7> of the binary code, and performs the exclusive OR on the gray code Gr_bits <6> to <0> and bits <7> to <1> of one high-order binary code obtained by the conversion to convert it into bits <6> to <0> of the binary code.

In the state <clkin> illustrated in FIG. 7, the code conversion circuit 6 outputs one pulse of "1" signal regardless of the output level of the EXOR circuit 63. The signal is used in processing of adding "1" to the count value in the calculation counter circuit 7. Details will be described below.

Next, a configuration example of the calculation counter circuit 7 illustrated in FIG. 1 will be described with reference to FIG. 8. The calculation counter circuit 7 illustrated in FIG. 8 includes one-bit calculation counter circuits 70 to 77 corresponding to the number of bits (8 bits). The one-bit calculation counter circuits 70 to 77 have the same configuration. Each of the one-bit calculation counter circuits 70 to 77 includes input terminals of a clkin0 terminal, a clkin1 terminal, a selclk terminal, a state terminal, and the rst terminal, and an O terminal which is an output terminal.

The O terminal of the one-bit calculation counter circuit 70 is connected to the clkin0 terminal of the one-bit calculation counter circuit 71. The O terminal of the one-bit calculation counter circuit 71 is connected to the clkin0 terminal of the one-bit calculation counter circuit 72. Similarly, each O terminal of one-bit calculation counter circuits 73 to 76 is connected to each clkin0 terminal of the one-bit calculation counter circuits 74 to 77. Each signal of Obs <0> to <7> output from each O terminal of the one-bit calculation counter circuits 70 to 77 is each bit of the output signal Ob of the calculation counter circuit 7 illustrated in FIG. 1. Each clkin1 terminal of the one-bit calculation counter circuits 70 to 77 is commonly connected to the dclkin terminal. The dclkin terminal is connected to the DATAOUT terminal which is the output terminal of the code conversion circuit 6 illustrated in FIG. 6. Each rst terminal of the one-bit calculation counter circuits 70 to 77 is commonly connected to the rst terminal of the calculation counter circuit 7. The rst terminal receives the predetermined control signal generated and output by the control circuit 90 illustrated in FIG. 1. Signals selclk <0> to <7> generated and output by the control circuit 90 illustrated in FIG. 1 are respectively input to each selclk terminal of the one-bit calculation counter circuits 70 to 77. Signals state <0> to <7> generated and output by the control circuit 90 illustrated in FIG. 1 are respectively input to each state terminal of the one-bit calculation counter circuits 70 to 77.

The one-bit calculation counter circuits 70 to 77 illustrated in FIG. 8 have the following functions. That is, the one-bit calculation counter circuits 70 to 77 have (1) a function of switching a clock for performing a count operation by a selclk signal (signals selclk <0> to <7>) to any of a signal (first input signal) input to the clkin0 terminal and a signal (second input signal) input to the clkin1 terminal and (2) a function of switching between a count mode <count> for performing the count operation and a state mode <state> for holding the signal without performing the count operation by a state signal (signals state <0> to <7>) based on the signal (first input signal) input to the clkin0 terminal and the signal (second input signal) input to the clkin1 terminal in a case where the clock is input.

Next, a configuration example of the one-bit calculation counter circuits 70 to 77 illustrated in FIG. 8 will be described with reference to FIG. 9. The one-bit calculation counter circuits 70 to 77 illustrated in FIG. 9 includes a selector 701, inverter circuits 702 and 703, switches 704 to 707, an inverter circuit 708, a NOR circuit 709, an inverter circuit 710, a NOR circuit 711, and a selector 712. The selector 701 selects and outputs the signal input to the clkin0 terminal in a case where "0" is input to the selclk terminal, and selects and outputs the signal input to the clkin1 terminal in a case where "1" is input to the selclk terminal. The inverter circuit 702 receives an output signal of the selector 701, generates an xck signal by inverting the output signal, and supplies the xck signal as an ON or OFF operation control signal to the switches 705 and 706. The inverter circuit 703 receives an output signal xck of the selector 702, generates a ck signal by inverting the output signal, and supplies the ck signal as the ON or OFF operation control signal to the switches 704 and 707. The ck signal is a signal having the same level as a signal input to the clkin0 terminal or the clkin1 terminal selected by the selector 701, and the xck signal is a signal having a level obtained by inverting a signal input to the clkin0 terminal or the clkin1 terminal selected by the selector 701. Therefore, depending on a driving capability of the signal input to the clkin0 and the clkin1, the inverter circuit 703 may be omitted and an output terminal of the selector 701 may be set as it is, as the ck.

One end of an opening/closing circuit of the switch 704 is connected to an output terminal of the selector 712, and the other end thereof is connected to an input terminal of the inverter circuit 708 and one end of an opening/closing circuit of the switch 705. The other end of the opening/closing circuit of the switch 705 is connected to an output terminal of the NOR circuit 709 and one end of an opening/closing circuit of the switch 706. The other end of the opening/closing circuit of the switch 706 is connected to an input terminal of the inverter circuit 710 and one end of an opening/closing circuit of the switch 707. An output terminal of the inverter circuit 708 is connected to one input terminal of a NOR circuit 709. The other input terminal of the NOR circuit 709 is connected to the rst terminal and one input terminal of the NOR circuit 711. The other end of the opening/closing circuit of the switch 707 is connected to an output terminal of the NOR circuit 711, the O terminal, and one input terminal of the selector 712. An output terminal of the inverter circuit 710 is connected to the other input terminal of the NOR circuit 711 and the other input terminal of the selector 712. The selector 712 selects and outputs an output signal of the inverter circuit 710 in a case where "0" is input to the state terminal, and selects and outputs an output signal of the NOR circuit 711 in a case where "1" is input to the state terminal.

In the configuration described above, the one-bit calculation counter circuits 70 to 77 illustrated in FIG. 9 turn on the switches 704 and 707, and turn off the switches 705 and 706 in a case where the ck signal is "1" (case where xck signal is "0"). In the case, the NOR circuit 709 causes a level of an output signal to coincide with a level of an output signal of the selector 712. On the other hand, the inverter circuit 710 and the NOR circuit 711 hold values before the ck signal is changed to "1". Next, when the ck signal is changed from "1" to "0" (when xck signal is changed from "0" to "1"), the switches 704 and 707 are turned off, and the switches 705 and 706 are turned on. In the case, the NOR circuit 709 holds a value before the ck signal is changed to "0". On the other hand, the NOR circuit 711 causes a level of the output signal to coincide with the level of the output signal of the NOR circuit 709. Here, the level of the output signal of the NOR circuit 711 is in the same phase with the level of the output signal of the NOR circuit 709, and a level of the output signal of the inverter circuit 710 is in the opposite phase with the level of the output signal of the NOR circuit 709. Therefore, in a case where the state terminal is "1" and the selector 712 selects the output of the NOR circuit 711, a level of a signal input to the inverter circuit 708 is the same with the level of the signal of the NOR circuit 709. Therefore, in the case, when the ck signal is changed from "1" to "0", the level of the output signal of the NOR circuit 711 is not changed. On the other hand, in a case where the state terminal is "0" and the selector 712 selects the output of the inverter circuit 710, the level of the signal input to the inverter circuit 708 is a level obtained by inverting the level of the signal of the NOR circuit 709. Therefore, in the case, when the ck signal is changed from "1" to "0", the level of the output signal of the NOR circuit 711 is inverted.

In a case where "1" is input to the rst terminal, the output of the NOR circuit 709 and the output of the NOR circuit 711 are initialized to "0".

Next, an operation of the one-bit calculation counter circuits 70 to 77 illustrated in FIG. 9 will be described with reference to FIG. 10. FIG. 10 is a table that summarizes a corresponding relationship between a combination condition (referred to as input condition) between input states of signals in the selclk terminal, clkin0 terminal, clkin1 terminal, and the state terminal and output states of the O terminal before the input of the clock signal from the clkin0 terminal or the clkin1 terminal, and output states of the O terminal obtained as an operation result after the input of the clock signal from the clkin0 terminal or the clkin1 terminal. The clock signal (input clk) input from the clkin0 terminal or the clkin1 terminal is a signal that changes "1"→"0".

The input condition illustrated in FIG. 10 is classified into two cases where the input clk is input from the clkin0 terminal and the input clk is input from the clkin1 terminal for the input clk. A case where an "input clk" field is "clkin0" indicates that the input clk is input from the clkin0 terminal. A case where the input clk field is "clkin1" indicates that the input clk is input from the clkin1 terminal.

A "selclk" field indicates a level of the selclk signal (signals selclk <0> to <7>) input to the selclk terminal. In a case where "selclk" is "0", the clikin0 terminal is selected by the selector 701. In a case where "selclk" is "1", the clikin1 terminal is selected by the selector 701.

A "state" field indicates a level of the state signal (signals state <0> to <7>) input to the state terminal. In a case where "state" is "0", the selector 712 selects the output terminal of the inverter circuit 710. The case where the selector 712 selects the output terminal of the inverter circuit 710 corresponds to the count mode <count> for performing the count operation in the case where the input clk (clock) described above is input. In a case where "selclk" is "1", the selector 712 selects the output terminal of the NOR circuit 711. The case where the selector 712 selects the output terminal of the NOR circuit 711 corresponds to the state mode <state> for holding the signal without performing the count operation described above.

An "O (before input)" field indicates the level of the O terminal before the input of the clock signal (input clk). An "O (after input)" field of the result indicates the level of the O terminal after the input of the clock signal (input clk).

For example, when the selclk signal input to the selclk terminal is "0", the state signal input to the state terminal is "0", and the O terminal before the input of the clock signal (input clk) is "0", in the case where the clock signal (input clk) is input to the clkin0 terminal, the O terminal is changed to "1". For example, when the selclk signal input to the selclk terminal is "0", the state signal input to the state terminal is "0", and the O terminal before the input of the clock signal (input clk) is "1", in the case where the clock signal (input clk) is input to the clkin0 terminal, the O terminal is changed to "0".

On the other hand, in the case where the state signal input to the state terminal is "1" or the selclk signal input to the selclk terminal is "1", when the clock signal (input clk) is input to the clkin0 terminal, the level of the O terminal is not changed before and after the input.

For example, when the selclk signal input to the selclk terminal is "1", the state signal input to the state terminal is "0", and the O terminal before the input of the clock signal (input clk) is "0", in the case where the clock signal (input clk) is input to the clkin1 terminal, the O terminal is changed to "1". For example, when the selclk signal input to the selclk terminal is "1", the state signal input to the state terminal is "0", and the O terminal before the input of the clock signal (input clk) is "1", in the case where the clock signal (input clk) is input to the clkin1 terminal, the O terminal is changed to "0".

On the other hand, in the case where the state signal input to the state terminal is "1" or the selclk signal input to the selclk terminal is "0", when the clock signal (input clk) is input to the clkin1 terminal, the level of the O terminal is not changed before and after the input.

In FIG. 10, in the case where the clock signal (input clk) is input, an input condition when the level of the O terminal is changed before and after the input is indicated with "bit change" as "yes" in a remarks field. In the case where the clock signal (input clk) is input, an input condition when the level of the O terminal is not changed before and after the input is indicated with "bit change" as "no" in the remarks field.

A "carry-up" item illustrated in the remarks field indicates presence/absence of the following operations. That is, in the one-bit calculation counter circuits 70 to 77 connected as illustrated in FIG. 8, the "carry-up" item indicates a setting state in a case where a bit change occurs in the high-order one-bit calculation counter circuit 77 due to a bit change occurred in the low-order one-bit calculation counter circuit 76 of two consecutive one-bit calculation counter circuits (for example, one-bit calculation counter circuit 76 and the one-bit calculation counter circuit 77). As illustrated in FIG. 8, when the selclk signal is "0" (<clkin0>), the state signal is "0" (<count>), and the clock signal (input clk) is input to the clkin0 terminal, "carry-up" occurs when the O terminal is changed from "1" (before input) to "0" (after input). When the selclk signal is "1" (<clkin1>), the state signal is "0" (<count>), and the clock signal (input clk) is input to the clkin1 terminal, "carry-up" also occurs when the O terminal is changed from "1" (before input) to "0" (after input). For example, when the selclk signal is "0" (<clkin0>) and the state signal is "0" (<count>) in the one-bit calculation counter circuit 77, the selclk signal is "1" (<clkin1>) and the state signal is "0" (<count>) in the one-bit calculation counter circuit 76, and the clock signal (input clk) is input to the clkin1 terminal, "carry-up" occurs when the O terminal is changed from "1" (before input) to "0" (after input). Alternatively, for example, when the selclk signal is "0" (<clkin0>) and the state signal is "0" (<count>) in the one-bit calculation counter circuit 77, the selclk signal is "0" (<clkin0>) and the state signal is "0" (<count>) in the one-bit calculation counter circuit 76, and the clock signal (input clk) is input to the clkin0 terminal, "carry-up" occurs when the O terminal is changed from "1" (before input) to "0" (after input).

Next, the conversion operation from the gray code to the binary code of the A/D converter 20 and the calculation operation (CDS operation) of the reset signal and the pixel signal of the embodiment will be described with reference to FIGS. 11A to 11W. FIGS. 11A to 11W indicate changes (indicated by "0" or "1") in the signals which are input, output, and held by each portion, changes (indicated by circuit diagram symbol) in the operations of the selectors or switches, and changes (indicated by character enclosed by < >) in the operation states or the modes of each circuit. In the following description, data is assumed to be four bits, and when "0110"="4" (decimal number) of the gray code as the reset signal and "1011"="13" (decimal number) of the gray code as the pixel signal are latched, processes of obtaining "9" (decimal number) as a differential result will be described. Here, the description of the operations of the reference voltage generating circuit 2 and the comparison circuit 4 will be omitted. The configurations of the latch circuit 5 and the calculation counter circuit 7 are simplified to four-bit circuit configurations and the operations will be described.

In FIGS. 11A to 11W, the latch circuit 5 is configured to have one-bit latch circuits 50 to 53. The calculation counter circuit 7 is configured to have one-bit calculation counter circuits 70 to 73. In FIGS. 11A to 11W, the selector 701 included in the one-bit calculation counter circuits 70 to 73 is indicated by a circuit diagram symbol indicating two switches. In FIGS. 11A to 11W, the same reference numerals are assigned to configurations corresponding to the configurations illustrated in FIGS. 4 to 6 and FIGS. 8 and 9.

In the operation example, first, the A/D converter 20 starts the A/D conversion of the reset signal, the comparison circuit 4 inverts an output signal at a timing when the gray code Gr_bit output by the gray code generating circuit 3 is "0110"="4" (decimal number), and "0", "1", "1", and "0" of the gray code Gr_bits <0> to <3> are latched in the one-bit latch circuits 50 to 53 of the latch circuit 5 illustrated in FIG. 11A. At the time, as illustrated in FIG. 11B, the operation states of the one-bit latch circuits 50 to 53 are <latch>, and the operation state of the code conversion circuit 6 is <reset>. An input clk of the one-bit calculation counter circuits 70 to 73 is <clkin0>, and an operation mode is <state>. Hereinafter, such operation mode is described as a <clkin0> <state> mode by combining a selection state of the input clk and the operation mode of the one-bit calculation counter circuits 70 to 73. At the time, the reset signal "0" is held in the feedback loop circuit 601 of the code conversion circuit 6.

Next, when the code conversion operation is started, the operation state of the one-bit latch circuit 53 is first set to <sel> as illustrated in FIG. 11C. The operation state of the code conversion circuit 6 is set to <input>. As a result, "0" held by the one-bit latch circuit 53 is input to the EXOR circuit 63 of the code conversion circuit 6. As a result of inputting "0" of the feedback loop circuit 601 to the EXOR circuit 63, "0" is output from the code conversion circuit 6. At the time, the one-bit calculation counter circuit 73 is set to a <clkin1> <count> mode, and "0" is held in the one-bit calculation counter circuit 73.

Next, as illustrated in FIG. 11D, the operation state of the one-bit latch circuit 53 is set to <latch>. The one-bit calculation counter circuit 73 is set to the <clkin0> <state> mode. The operation state of the code conversion circuit 6 is set to <latch>, and "0" is input to and held in the feedback loop circuit 601.

Next, when a second code conversion operation is started, the operation state of the one-bit latch circuit 52 is set to <sel> as illustrated in FIG. 11E. The operation state of the code conversion circuit 6 is set to <input>. As a result, "1"

held by the one-bit latch circuit 52 is input to the EXOR circuit 63 of the code conversion circuit 6. As a result of inputting "0" of the feedback loop circuit 601 to the EXOR circuit 63, "1" is output from the code conversion circuit 6. At the time, the one-bit calculation counter circuit 72 is set to the <clkin1> <count> mode, and "1" is held in the one-bit calculation counter circuit 72.

Next, as illustrated in FIG. 11F, the operation state of the one-bit latch circuit 52 is set to <latch>. The one-bit calculation counter circuit 72 is set to the <clkin0> <state> mode. The operation state of the code conversion circuit 6 is set to <latch>, and "1" is input to and held in the feedback loop circuit 601.

Next, when a third code conversion operation is started, the operation state of the one-bit latch circuit 51 is set to <sel> as illustrated in FIG. 11G. The operation state of the code conversion circuit 6 is set to <input>. As a result, "1" held by the one-bit latch circuit 51 is input to the EXOR circuit 63 of the code conversion circuit 6. As a result of inputting "1" of the feedback loop circuit 601 of the EXOR circuit 63, "0" is output from the code conversion circuit 6. At the time, the one-bit calculation counter circuit 71 is set to <clkin1> <count> mode, and "0" is held in the one-bit calculation counter circuit 71.

Next, as illustrated in FIG. 11H, the operation state of the one-bit latch circuit 51 is set to <latch>. The one-bit calculation counter circuit 71 is set to <clkin0><state> mode. The operation state of the code conversion circuit 6 is set to <latch>, and "0" is input to and held in the feedback loop circuit 601.

Next, when a fourth code conversion operation is started, the operation state of the one-bit latch circuit 50 is set to <sel> as illustrated in FIG. 11I. The operation state of the code conversion circuit 6 is set to <input>. As a result, "0" held by the one-bit latch circuit 50 is input to the EXOR circuit 63 of the code conversion circuit 6. As a result of inputting "0" of the feedback loop circuit 601 to the EXOR circuit 63, "0" is output from the code conversion circuit 6. At the time, the one-bit calculation counter circuit 70 is set to <clkin1> <count> mode, and "0" is held in the one-bit calculation counter circuit 70.

Next, as illustrated in FIG. 11J, the operation state of the one-bit latch circuit 50 is set to <latch>. The one-bit calculation counter circuit 70 is set to the <clkin0> <state> mode. The operation state of the code conversion circuit 6 is set to <reset>, and "0" is held in the feedback loop circuit 601.

According to the four code conversion operations described above, the "0", "1", "0", and "0" are sequentially held in the one-bit calculation counter circuits 73, 72, 71, and 70. As a result, "0100" corresponding to "4" (decimal number) of the binary code is held in the calculation counter circuit 7.

Next, as illustrated in FIG. 11K, all the one-bit calculation counter circuits 70 to 73 are set to the <clkin1> <count> mode. The operation state of the code conversion circuit 6 is set to <clkin>, and the code conversion circuit 6 outputs "1". At the time, all bits of the calculation counter circuit 7 are inverted from "0100" to "1011". That is, the one-bit calculation counter circuit 73 holds "1", the one-bit calculation counter circuit 72 holds "0", the one-bit calculation counter circuit 71 holds "1", and the one-bit calculation counter circuit 70 holds "1". The processing is a processing of obtaining two's complement of the binary code Obs <3> to <0> held in the calculation counter circuit 7. The two's complement can be obtained by inverting each bit and adding "1" thereto. However, the processing of adding "1" to be performed in addition to the inversion processing (FIG. 11V) is executed later.

Next, the A/D converter 20 starts the A/D conversion of the pixel signal, the comparison circuit 4 inverts an output signal at a timing when the gray code Gr_bit output by the gray code generating circuit 3 is "1011"="13" (decimal number), and "1", "1", "0", and "1" of the gray code Gr_bits <0> to <3> are latched in the one-bit latch circuits 50 to 53 of the latch circuit 5 as illustrated in FIG. 11L. At the time, as illustrated in FIG. 11M, the operation states of the one-bit latch circuits 50 to 53 are <latch>, and the operation state of the code conversion circuit 6 is <reset>. The one-bit calculation counter circuits 70 to 73 are in the <clkin0> <state> mode. At the time, the reset signal "0" is held in the feedback loop circuit 601 of the code conversion circuit 6.

Next, when a code conversion operation of the pixel signal is started, the operation state of the one-bit latch circuit 53 is first set to <sel> as illustrated in FIG. 11N. The operation state of the code conversion circuit 6 is set to <input>. As a result, "1" held by the one-bit latch circuit 53 is input to the EXOR circuit 63 of the code conversion circuit 6. As a result of inputting "0" of the feedback loop circuit 601 to the EXOR circuit 63, "1" is output from the code conversion circuit 6. At the time, the one-bit calculation counter circuit 73 is set to the <clkin1> <count> mode. When "1" is input from the clkin1 terminal, since the level of the O terminal before the input is "1", the one-bit calculation counter circuit 73 inverts the level of the O terminal after the input to "0" and holds "0".

Next, as illustrated in FIG. 11O, the operation state of the one-bit latch circuit 53 is set to <latch>. The one-bit calculation counter circuit 73 is set to a <clkin0> <count> mode. Here, the one-bit calculation counter circuit 73 is set to a state that can receive the carry-up from the one-bit calculation counter circuit 72 (that is, a state of inverting the level of the signal held by the one-bit calculation counter circuit 73 in a case where an output signal Ob <2> of the one-bit calculation counter circuit 72 is changed from "1" to "0"). The operation state of the code conversion circuit 6 is set to <latch>, and "1" is input to and held in the feedback loop circuit 601.

Next, when a second code conversion operation is started, the operation state of the one-bit latch circuit 52 is set to <sel> as illustrated in FIG. 11P. The operation state of the code conversion circuit 6 is set to <input>. As a result, "0" held by the one-bit latch circuit 52 is input to the EXOR circuit 63 of the code conversion circuit 6. As a result of inputting "1" of the feedback loop circuit 601 to the EXOR circuit 63, "1" is output from the code conversion circuit 6. At the time, the one-bit calculation counter circuit 72 is set to the <clkin1> <count> mode, and the one-bit calculation counter circuit 72 inverts the level of the O terminal after the input to "1" and holds "1" since the level of the O terminal before the input is "0". In the case, since the output signal Ob <2> of the one-bit calculation counter circuit 72 changes from "0" to "1", the carry-up does not occur.

Next, as illustrated in FIG. 11Q, the operation state of the one-bit latch circuit 52 is set to <latch>. The one-bit calculation counter circuit 72 is set to the <clkin0> <state> mode. Here, the one-bit calculation counter circuit 72 is set to a state that can receive the carry-up from the one-bit calculation counter circuit 71 (that is, a state of inverting the level of the signal held by the one-bit calculation counter circuit 72 in a case where an output signal Ob <1> of the one-bit calculation counter circuit 71 is changed from "1" to "0").

The operation state of the code conversion circuit 6 is set to <latch>, and "1" is input to and held in the feedback loop circuit 601.

Next, when a third code conversion operation is started, as illustrated in FIG. 11R, the operation state of the one-bit latch circuit 51 is first set to <sel>. The operation state of the code conversion circuit 6 is set to <input>. As a result, "1" held by the one-bit latch circuit 51 is input to the EXOR circuit 63 of the code conversion circuit 6. As a result of inputting "1" of the feedback loop circuit 601 to the EXOR circuit 63, "0" is output from the code conversion circuit 6. At the time, the one-bit calculation counter circuit 71 is set to the <clkin1> <count> mode, and the one-bit calculation counter circuit 71 holds the held signal "1" as it is since the signal of the clkin1 terminal is not changed from "0". In the case, since the output signal Ob <1> of the one-bit calculation counter circuit 71 is not changed from "1", the carry-up does not occur.

Next, as illustrated in FIG. 11S, the operation state of the one-bit latch circuit 51 is set to <latch>. The one-bit calculation counter circuit 71 is set to the <clkin0> <state> mode. Here, the one-bit calculation counter circuit 71 is set to a state that can receive the carry-up from the one-bit calculation counter circuit 70 (that is, a state of inverting the level of the signal held by the one-bit calculation counter circuit 71 in a case where an output signal Ob <0> of the one-bit calculation counter circuit 70 is changed from "1" to "0"). The operation state of the code conversion circuit 6 is set to <latch>, "0" is input to and held in the feedback loop circuit 601.

Next, when a fourth code conversion operation is started, the operation state of the one-bit latch circuit 50 is set to <sel> as illustrated in FIG. 11T. The operation state of the code conversion circuit 6 is set to <input>. As a result, "1" held by the one-bit latch circuit 50 is input to the EXOR circuit 63 of the code conversion circuit 6. As a result of inputting "0" of the feedback loop circuit 601 to the EXOR circuit 63, "1" is output from the code conversion circuit 6. At the time, the one-bit calculation counter circuit 70 is set to the <clkin1> <count> mode, and the one-bit calculation counter circuit 70 inverts the level of the O terminal after the input to "0" and holds "0" since the level of the O terminal before the input is "1". In the case, since the output signal Ob <0> of the one-bit calculation counter circuit 70 changes from "1" to "0", the carry-up occurs. That is, in response to the change in the signal Ob <0> from "1" to "0", since the level of the O terminal before the input is "1", the one-bit calculation counter circuit 71 inverts the level of the O terminal after the input to "0" and holds "0". That is, the output signal Ob <1> of the one-bit calculation counter circuit 71 is changed from "1" to "0". Here, in response to the change in the output signal Ob <1> of the one-bit calculation counter circuit 71 from "1" to "0", since the level of the O terminal before the input is "1", the one-bit calculation counter circuit 72 inverts the level of the O terminal after the input to "0" and holds "0". That is, the output signal Ob <2> of the one-bit calculation counter circuit 72 is changed from "1" to "0". Here, in response to the change in the output signal Ob <2> of the one-bit calculation counter circuit 72 from "1" to "0", since the level of the O terminal before the input is "0", the one-bit calculation counter circuit 73 inverts the level of the O terminal after the input to "1" and holds "1".

Next, as illustrated in FIG. 11U, the operation state of the one-bit latch circuit 50 is set to <latch>. The one-bit calculation counter circuit 70 is set to the <clkin0> <state> mode.

The operation state of the code conversion circuit 6 is set to <reset>, and "0" is held in the feedback loop circuit 601.

Next, as illustrated in FIG. 11V, the operation state of the code conversion circuit 6 is set to <clkin>, and the code conversion circuit 6 outputs "1". The one-bit calculation counter circuit 70 is set to the <clkin1> <count> mode. In the case, since the level of the O terminal before the input is "0", the one-bit calculation counter circuit 70 inverts the level of the O terminal after the input to "1" and holds "1". As a result, the binary code Obs <3> to <0> is "1001"="9" (decimal number). As illustrated in FIG. 11W, the one-bit calculation counter circuit 70 is set to the <clkin0> <state> mode.

As described above, according to the operations described with reference to FIGS. 11A to 11W, the A/D conversion circuit 20 can obtain the digital signal of "1001"="9" (decimal number) as the differential result by receiving the analog reset signal having a "0110"="4" (decimal number) level of the gray code and the analog pixel signal having a "1011"="13" (decimal number) level of the gray code.

A process illustrated in FIG. 11V is not necessarily required since the offset "1" is simply added after the calculation in the process.

Next, the conversion operation from the gray code to the binary code of the A/D converter 20 and the calculation operation (addition operation) between the pixel signal and the pixel signal of the embodiment will be described using the four-bit configurations illustrated in FIG. 11A and the like with reference to FIGS. 12A to 12J. That is, data is assumed to be four bits in the following description. When "0110"="4" (decimal number) of the gray code as a first pixel signal and "0101"="6" (decimal number) of the gray code as a second pixel signal are latched, processes of obtaining "10" (decimal number) as an addition result will be described. Here, the description of the operations of the reference voltage generating circuit 2 and the comparison circuit 4 will be omitted. Similarly to FIGS. 11A to 11W, FIGS. 12A to 12J indicate changes (indicated by "0" or "1") in the signals which are input, output, and held by each portion, changes (indicated by circuit diagram symbol) in the operations of the selectors or switches, and changes (indicated by character enclosed by < >) in the operation states or the modes of each circuit.

In the operation example, the processes from converting the gray code obtained by A/D converting the first analog pixel signal having a level of "0110"="4" (decimal number) of the gray code into a binary code to holding the converted binary code in the one-bit calculation counter circuits 70 to 73 are the same as the case of the CDS operation illustrated in FIGS. 11A to 11J. However, in the operation example, the conversion processing target is not the reset signal, but the first pixel signal. In the operation example, similarly to each process described with reference to FIGS. 11A to 11J, the "0", "1", "0", and "0" are also held in the one-bit calculation counter circuits 73, 72, 71, and 70. That is, the "0100" corresponding to "4" (decimal number) of the binary code is held in the calculation counter circuit 7.

Next, the A/D converter 20 starts the A/D conversion of the second pixel signal, the comparison circuit 4 inverts an output signal at a timing when the gray code Gr_bit output by the gray code generating circuit 3 is "0101"="6" (decimal number), and "1", "0", "1", and "0" of the gray code Gr_bits <0> to <3> are latched in the one-bit latch circuits 50 to 53 of the latch circuit 5 as illustrated in FIG. 12A. At the time, as illustrated in FIG. 12B, the operation states of the one-bit latch circuits 50 to 53 are <latch>, and the operation state of the code conversion circuit 6 is <reset>. The one-bit calculation counter circuits 70 to 73 are in the <clkin0> <state>mode. At the time, the reset signal "0" is held in the feedback loop circuit 601 of the code conversion circuit 6.

Next, when the code conversion operation of the second pixel signal is started, the operation state of the one-bit latch circuit 53 is first set to <sel> as illustrated in FIG. 12C. The operation state of the code conversion circuit 6 is set to <input>. As a result, "0" held by the one-bit latch circuit 53 is input to the EXOR circuit 63 of the code conversion circuit 6. As a result of inputting "0" of the feedback loop circuit 601 to the EXOR circuit 63, "0" is output from the code conversion circuit 6. At the time, the one-bit calculation counter circuit 73 is set to the <clkin1> <count> mode. Since the signal of the clkin1 terminal is not changed from "0", the one-bit calculation counter circuit 73 holds the held signal "0" as it is.

Next, as illustrated in FIG. 12D, the operation state of the one-bit latch circuit 53 is set to <latch>. The one-bit calculation counter circuit 73 is set to the <clkin0> <count> mode. Here, the one-bit calculation counter circuit 73 is set to a state that can receive the carry-up from the one-bit calculation counter circuit 72 (that is, a state of inverting the level of the signal held by the one-bit calculation counter circuit 73 in a case where the output signal Ob <2> of the one-bit calculation counter circuit 72 is changed from "1" to "0"). The operation state of the code conversion circuit 6 is set to <latch>, and "0" is input to and held in the feedback loop circuit 601.

Next, when a second code conversion operation is started, the operation state of the one-bit latch circuit 52 is first set to <sel> as illustrated in FIG. 12E. The operation state of the code conversion circuit 6 is set to <input>. As a result, "1" held by the one-bit latch circuit 52 is input to the EXOR circuit 63 of the code conversion circuit 6. As a result of inputting "0" of the feedback loop circuit 601 to the EXOR circuit 63, "1" is output from the code conversion circuit 6. At the time, the one-bit calculation counter circuit 72 is set to the <clkin1> <count> mode, and the one-bit calculation counter circuit 72 inverts the level of the O terminal after the input to "0" and holds "0" since the level of the O terminal before the input is "1". In the case, the output signal Ob <2> of the one-bit calculation counter circuit 72 changes from "1" to "0", the carry-up occurs. Therefore, since the level of the O terminal before the input is "0", the one-bit calculation counter circuit 73 inverts the level of the O terminal after the input to "1" and holds "1".

Next, as illustrated in FIG. 12F, the operation state of the one-bit latch circuit 52 is set to <latch>. The one-bit calculation counter circuit 72 is set to the <clkin0> <state> mode. Here, the one-bit calculation counter circuit 72 is set to a state that can receive the carry-up from the one-bit calculation counter circuit 71 (that is, a state of inverting the level of the signal held by the one-bit calculation counter circuit 72 in a case where the output signal Ob <1> of the one-bit calculation counter circuit 71 is changed from "1" to "0"). The operation state of the code conversion circuit 6 is set to <latch>, and "1" is input to and held in the feedback loop circuit 601.

Next, when a third code conversion operation is started, the operation state of the one-bit latch circuit 51 is first set to <sel> as illustrated in FIG. 12G. The operation state of the code conversion circuit 6 is set to <input>. As a result, "0" held by the one-bit latch circuit 51 is input to the EXOR circuit 63 of the code conversion circuit 6. As a result of inputting "1" of the feedback loop circuit 601 to the EXOR circuit 63, "1" is output from the code conversion circuit 6. At the time, the one-bit calculation counter circuit 71 is set to the <clkin1> <count> mode, and the one-bit calculation counter circuit 71 inverts the level of the O terminal after the input to "1" and holds "1" since the level of the O terminal before the input is "0". In the case, since the output signal Ob <1> of the one-bit calculation counter circuit 71 changes from "0" to "1", the carry-up does not occur.

Next, as illustrated in FIG. 12H, the operation state of the one-bit latch circuit 51 is set to <latch>. The one-bit calculation counter circuit 71 is set to the <clkin0> <state> mode. Here, the one-bit calculation counter circuit 71 is set to a state that can receive the carry-up from the one-bit calculation counter circuit 70 (that is, a state of inverting the level of the signal held by the one-bit calculation counter circuit 71 in a case where the output signal Ob <0> of the one-bit calculation counter circuit 70 is changed from "1" to "0"). The operation state of the code conversion circuit 6 is set to <latch>, and "1" is input to and held in the feedback loop circuit 601.

Next, when a fourth code conversion operation is started, the operation state of the one-bit latch circuit 50 is first set to <sel> as illustrated in FIG. 12I. The operation state of the code conversion circuit 6 is set to <input>. As a result, "1" held by the one-bit latch circuit 50 is input to the EXOR circuit 63 of the code conversion circuit 6. As a result of inputting "1" of the feedback loop circuit 601 to the EXOR circuit 63, "0" is output from the code conversion circuit 6. At the time, the one-bit calculation counter circuit 70 is set to the <clkin1> <count> mode, and the one-bit calculation counter circuit 70 holds the held signal "0" as it is since the signal of the clkin1 terminal is not changed from "0".

Next, as illustrated in FIG. 12J, the operation state of the one-bit latch circuit 50 is set to <latch>. The one-bit calculation counter circuit 70 is set to the <clkin0> <state> mode. The operation state of the code conversion circuit 6 is set to <reset>, and "0" is held in the feedback loop circuit 601. As a result, the binary code Obs <3> to <0> are "1010"="10" (decimal number). As illustrated in FIG. 11W, the one-bit calculation counter circuit 70 is set to the <clkin0> <state> mode.

As described above, according to the operations described with reference to FIGS. 11A to 11J and FIGS. 12A to 12J, the A/D conversion circuit 20 can obtain the digital signal of "1010"="10" (decimal number) as the addition result by receiving the first analog pixel signal having the "0110"="4" (decimal number) level of the gray code and the second analog pixel signal having a "0101"="6" (decimal number) level of the gray code.

In the operation example, the CDS operation and the conversion operation from the gray code to the binary code described above are completely the same. In the addition operation, only the operation of inverting all bits by forcibly inputting the clock in FIG. 11K is not performed when the CDS (subtraction) operation is performed.

As described above, in the embodiment, the A/D converter 20 includes the code conversion circuit 6 that serially converts the count value of the gray code held in the latch circuit 5 into the binary code, and the calculation counter circuit 7 (calculation processing circuit) that stores the count value of the binary code output from the code conversion circuit 6 and performs the calculation processing based on the stored count value of the binary code and the next input count value of the binary code. Therefore, according to the embodiment, it is possible to output the calculation processing result based on the two or more analog signals as the digital signal with the simple configuration at the time of the A/D conversion.

According to the embodiment, it is possible to perform the calculation operation such as the CDS operation or the addition between the A/D conversion results in the column in the A/D converter 20 using the gray code. Consequently, since it is sufficient to read only a necessary result, it is possible to reduce a time required for a reading operation per column of columns and to solve the problem of the decrease in the frame rate which is a problem indicated with reference to Patent Document 1.

According to the embodiment, the following functions can be realized in addition to solving the above-mentioned problems.

(1) Realization of addition and subtraction functions: As described above, it is possible to select the addition operation and the subtraction operation, and to perform the operations any number of times for each A/D conversion. For example, it is possible to add CDS results of two pixels. It is also possible to easily obtain a calculation result with a pixel of another column when the end of the code conversion circuit 6 is connected to a calculation counter of another column.

(2) Digital gain function: In the above-mentioned description, the code converted by corresponding to the same bits such as between bits <0> is transmitted from the latch circuit 5 to the calculation counter circuit 7. However, for example, when a conversion code of bit <0> of the latch circuit 5 is shifted to bit <1> of the calculation counter circuit 7 and the shifted code is transmitted, it is equivalent to applying a gain of two times.

Similarly, it is possible to easily apply gains of ¼, 12 B, 4, or the like.

Next, another embodiment according to the embodiment will be described with reference to FIGS. 13 to 15. FIG. 13 is a block diagram illustrating a configuration example of an A/D converter 20a according to another embodiment of the present invention. The A/D converter 20a illustrated in FIG. 13 is different as compared with the A/D converter 20 illustrated in FIG. 1 in that internal configurations of the comparison circuit 4a and the latch circuit 5a corresponding to the comparison circuit 4 and the latch circuit 5 illustrated in FIG. 1 are different in part, and in that a latch control circuit 8 is newly provided between the comparison circuit 4a and the latch circuit 5a. The latch control circuit 8 receives a signal LATCH output from the comparison circuit 4a, and generates and outputs a signal Hold_L which becomes a predetermined level only during a predetermined period in a case where a level of the signal LATCH is changed. A sign of an input terminal of the comparison circuit 4a is different from that of the comparison circuit 4. The latch circuit 5a is the same as the latch circuit 5 in that the gray code Gr_bit is latched when a level of the signal Hold_L is changed and the latched gray code is serially output based on the predetermined control signal. However, the latch circuit 5a is different from the latch circuit 5 in that the latch circuit 5a can perform a normal operation only during a period when a level of the signal Hold_L is continued after a change in the level thereof, and includes a circuit for stopping the operation of each portion so as to be in an operation state for reducing the power consumption in a case where the level is further changed. The circuit for stopping the operation of each portion is, for example, a circuit that cuts off a power supply supplied to each circuit.

FIG. 14 illustrates a configuration example of the latch control circuit 8 illustrated in FIG. 13. The latch control circuit 8 illustrated in FIG. 14 includes seven buffer circuits 81 to 87 and an AND circuit 88 (logical conjunction circuit) of which one input is the negative logic input. An input terminal of the buffer circuit 81 is connected to an output terminal of the comparison circuit 4a, and an output terminal thereof is connected to an input terminal of the buffer circuit 82 and an input terminal of the buffer circuit 83. An output terminal of the buffer circuit 82 is connected to one input terminal of the AND circuit 88. An output terminal of the buffer circuit 83 is connected to an input terminal of the buffer circuit 84. The buffer circuit 84 to the buffer circuit 87 are connected in series, and an output terminal of the buffer circuit 87 is connected to the negative logic input terminal of the AND circuit 88.

FIG. 15 is a timing chart illustrating changes in levels of input voltages Vin1 and Vin2 of the comparison circuit 4a, an output CO_0 of the buffer circuit 81 in the latch control circuit 8, an output CO_1 of the buffer circuit 87, an output CO_2 of the buffer circuit 82, and the output signal Hold_L illustrated in FIG. 14. In a case where the voltage Vin2 starts to change at time t0, the voltage Vin1 exceeds the voltage Vin2 at time t1, and an output signal of the comparison circuit 4a is inverted, the output CO_0 is inverted at time t2 after a certain period of time. Further, the output CO_2 is inverted and the output signal Hold_L is inverted at time t3 after a certain period of time. Further, the output CO_1 is inverted and the output signal Hold_L is inverted again at time t4 after a certain period of time. When a period T1 from time t0 to time t4 is a first interval and a period T2 from time t0 to time t3 is a second interval, a period T4 of a difference between the first interval period T1 and the second interval period T2 is an operation period of the latch circuit 5a. A period T3 from time t0 to time t3 is a stop period of the latch circuit 5a.

In the embodiment, the latch control circuit 8 receives the output signal LATCH of the comparison circuit 4a, and generates a pulse signal Hold_L having a width of the certain period T4. The latch circuit 5a operates each portion in the latch circuit 5a only for a period when the pulse signal Hold_L is input. With such operation, it is possible to control the operation in which the latch circuit 5a latches the gray code in a very short time, and to significantly reduce the consumption current due to the latch operation. For example, in a case where an A/D conversion period is 100 μs, when the pulse width is set to 1 μs, the consumption current required for the latch operation can be reduced to about 1/100.

Next, another embodiment according to the present invention will be described with reference to FIG. 16. FIG. 16 illustrates a configuration of an imaging device 1007 according to another embodiment of the present invention. The imaging device 1007 may be an electronic apparatus having an imaging function. For example, the imaging device 1007 is any one of a digital camera, a digital video camera, a surveillance camera, an endoscope, and a microscope. As illustrated in FIG. 16, the imaging device 1007 includes a solid-state imaging device 1001, a lens unit portion 1002, an image signal processing device 1003, a recording device 1004, a camera control device 1005, and a display device 1006.

The solid-state imaging device 1001 is the solid-state imaging device 100 of the embodiment illustrated in FIG. 2. The lens unit portion 1002 has a zoom lens and a focus lens. The lens unit portion 1002 forms a subject image based on the light from the subject on a light receiving surface of the solid-state imaging device 1001. The light captured through the lens unit portion 1002 is focused on the light receiving surface of the solid-state imaging device 1001. The solid-state imaging device 1001 converts the subject image focused on the light receiving surface into an imaging signal, and outputs the imaging signal.

The image signal processing device 1003 performs predetermined processing with respect to the imaging signal output from the solid-state imaging device 1001. The processing performed by the image signal processing device 1003 is a conversion to image data, various corrections of the image data, compression of the image data, and the like.

The recording device 1004 has a semiconductor memory for recording or reading of the image data or the like. The recording device 1004 is detachable from the imaging device 1007. The display device 1006 displays an image based on image data processed by the image signal processing device 1003 or image data read from the recording device 1004.

The camera control device 1005 controls the entire imaging device 1007. An operation of the camera control device 1005 is defined by a program stored in read only memory (ROM) built in the imaging device 1007. The camera control device 1005 reads the program, and performs various controls according to the contents defined by the program.

As described above, the preferable embodiments of the present invention are described, but the present invention is not limited to the embodiments and modification examples of the embodiments. An addition, an omission, a substitution, and another change of the configuration are possible without departing from the gist of the present invention. The present invention is not limited by the above-mentioned description, but only by the scope of appended claims.

INDUSTRIAL APPLICABILITY

According to the A/D converter, the solid-state imaging device, the method for driving a solid-state imaging device, and the electronic apparatus of each aspect described above, it is possible to output the calculation processing result based on two or more analog signals as the digital signal with the simple configuration at least at the time of the A/D conversion.

REFERENCE SIGNS LIST

1: pixel
2: reference voltage generating circuit
3: gray code generating circuit
4: comparison circuit
5: latch circuit
6: code conversion circuit
7: calculation counter circuit (calculation processing circuit)
8: latch control circuit (pulse signal generating circuit)
10: pixel array
20, 20a, 20-2 to 20-n: A/D converter
63: EXOR circuit (logic calculation circuit)
90: control circuit
90a: driving control circuit
100, 1001: solid-state imaging device
200: vertical scanning circuit
300: horizontal scanning circuit
601: feedback loop circuit (feedback circuit)
602: logic circuit (selection circuit)
701: selector (signal switching circuit)
702: selector (operation switching circuit)
1007: imaging device (electronic apparatus)

What is claimed is:

1. An A/D converter comprising:
   a ramp voltage circuit that generates a ramp voltage based on a reference clock, the ramp voltage having a ramp waveform which monotonically changes with time, the reference clock having a periodical waveform;
   a gray code circuit that outputs a reference gray code based on the reference clock, the reference gray code being a gray code converted from the ramp voltage;
   a comparison circuit that outputs a comparison signal according to comparing the reference voltage with an input analog voltage;
   a latch circuit that holds a counted gray code that is the reference gray code held based on the comparison signal;
   a code conversion circuit that serially converts the counted gray code into an original binary code; and
   a calculation circuit that stores a calculated binary code, the calculated binary code is calculated from first binary code and the second binary code, the first binary code being the original binary code corresponding to one of the input analog voltage, and the second binary code being the original binary code corresponding to another of the input analog voltage.

2. The A/D converter according to claim 1,
   wherein the code conversion circuit comprises:
   a logic circuit that performs a logic calculation of signals input from a first input terminal and a second input terminal, the first input terminal being connected to the latch circuit; and
   a feedback circuit connected between an output terminal of the logic circuit and the second input terminal.

3. The A/D converter according to claim 2,
   wherein the logic circuit is a circuit that calculates an exclusive disjunction.

4. The A/D converter according to claim 3,
   wherein the code conversion circuit further comprises a selection circuit that selects any one of outputting a calculation result of the logic circuit or outputting a clock signal as an output of the code conversion circuit.

5. The A/D converter according to claim 1,
   wherein the calculation circuit includes:
   a signal switching circuit that switches between a first input signal and a second input signal, and
   an operation switching circuit that switches between a first operation state for performing a count operation based on the first input signal or the second input signal and a second operation state for holding a signal without performing the count operation.

6. The A/D converter according to claim 1, further comprising:
   a pulse signal generating circuit that generates a pulse signal based on the comparison signal,
   wherein the latch circuit operates only for a period corresponding to the pulse signal.

7. A solid-state imaging device comprising:
   a pixel array in which a plurality of pixels arranged in a matrix shape, each of the plurality of pixels performs a photoelectric conversion and outputs a pixel signal; and
   an A/D converter that is provided for each column or a plurality of columns of the plurality of pixels, and that converts the pixel signal into a calculated binary code,
   wherein the A/D converter comprises:
   a ramp voltage circuit that generates a ramp voltage based on a reference clock, the ramp voltage having a ramp waveform which monotonically changes with time, the reference clock having a periodical waveform;
   a gray code circuit that outputs a reference gray code based on the reference clock, the reference gray code being a gray code converted from the ramp voltage;

a comparison circuit that outputs a comparison signal according to comparing the reference voltage with the pixel signal;

a latch circuit that holds a counted gray code that is the reference gray code held based on the comparison signal;

a code conversion circuit that serially converts the counted gray code into an original binary code; and a calculation circuit that stores the calculated binary code, the calculated binary code is calculated from first binary code and the second binary code, the first binary code being the original binary code corresponding to one of the input analog voltage, and the second binary code being the original binary code corresponding to another of the input analog voltage.

8. The solid-state imaging device according to claim 7, wherein the code conversion circuit comprises a logic calculation circuit that performs a logic calculation of signals input from two input terminals, and a feedback circuit connected between an output terminal of the logic calculation circuit and one input terminal of the logic calculation circuit, and wherein the latch circuit is connected to the other input terminal of the logic calculation circuit.

9. The solid-state imaging device according to claim 8, wherein the code conversion circuit comprises a selection circuit that selects any one of outputting a calculation result of the logic calculation circuit or outputting a clock signal regardless of the calculation result of the logic calculation circuit as an output of the code conversion circuit.

10. The solid-state imaging device according to claim 7, wherein the calculation processing circuit comprises a signal switching circuit that switches between a first input signal and a second input signal, and an operation switching circuit that switches between a first operation state for performing a count operation based on the first input signal or the second input signal and a second operation state for holding a signal without performing the count operation.

11. The solid-state imaging device according to claim 7, further comprising:

a pulse signal generating circuit that generates a pulse signal based on the output signal of the comparison circuit, wherein the latch circuit operates only for a period corresponding to the pulse signal.

12. A method for driving a solid-state imaging device, the device comprising:

a pixel array in which a plurality of pixels arranged in a matrix shape, each of the plurality of pixels performs a photoelectric conversion and outputs a pixel signal; and an A/D converter that is provided for each column or a plurality of columns of the plurality of pixels, and that converts the pixel signal into a calculated binary code, the method comprising the steps of:

generating a ramp voltage based on a reference clock, the ramp voltage having a ramp waveform which monotonically changes with time, the reference clock having a periodical waveform;

outputting a reference gray code based on the reference clock, the reference gray code being a gray code converted from the ramp voltage;

outputting a comparison signal according to comparing the reference voltage with the pixel signal;

holding a counted gray code that is the reference gray code held based on the comparison signal;

serially converting the counted gray code into an original binary code; and storing the calculated binary code, the calculated binary code is calculated from first binary code and the second binary code, the first binary code being the original binary code corresponding to one of the input analog voltage, and the second binary code being the original binary code corresponding to another of the input analog voltage.

13. An electronic apparatus comprising:

solid-state imaging device comprising:

a pixel array in which a plurality of pixels for performing a photoelectric conversion are arranged in a matrix shape; and an A/D converter provided for each column or a plurality of columns of the pixels and that converts an analog signal output from the pixel into a digital signal, the A/D converter comprising:

a comparison circuit that compares a reference voltage of a ramp waveform input from a reference voltage generating circuit provided outside the column with an input voltage corresponding to a pixel signal from the pixel;

a latch circuit that holds a count value of a gray code input from a gray code generating circuit provided outside the column based on an output signal from the comparison circuit;

a code conversion circuit that serially converts the count value of the gray code held in the latch circuit into a binary code; and a calculation processing circuit that stores a count value of the binary code output from the code conversion circuit and performs calculation processing based on the stored count value of the binary code and a next input count value of the binary code.

* * * * *